(12) United States Patent
Tian et al.

(10) Patent No.: US 9,825,074 B2
(45) Date of Patent: Nov. 21, 2017

(54) LAYOUT AND OPERATION OF PIXELS FOR IMAGE SENSORS

(71) Applicant: InVisage Technologies, Inc., Menlo Park, CA (US)

(72) Inventors: Hui Tian, Cupertino, CA (US); Igor Constantin Ivanov, Danville, CA (US); Edward Hartley Sargent, Toronto (CA)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 0 days.

(21) Appl. No.: 14/734,760

(22) Filed: Jun. 9, 2015

(65) Prior Publication Data

US 2015/0357360 A1    Dec. 10, 2015

Related U.S. Application Data

(60) Provisional application No. 62/010,260, filed on Jun. 10, 2014.

(51) Int. Cl.
  *H01L 27/14*    (2006.01)
  *H01L 27/146*   (2006.01)

(52) U.S. Cl.
  CPC .. *H01L 27/14605* (2013.01); *H01L 27/14621* (2013.01); *H01L 27/14641* (2013.01); *H01L 27/14647* (2013.01); *H01L 27/14652* (2013.01)

(58) Field of Classification Search
  CPC ......... H01L 27/14605; H01L 27/14621; H01L 27/14647; H01L 27/14641
  See application file for complete search history.

(56) References Cited

U.S. PATENT DOCUMENTS

| 9,293,487 | B2 | 3/2016 | Tian et al. |
| 9,666,634 | B2 | 5/2017 | Tian et al. |
| 2005/0056901 | A1 | 3/2005 | Kuriyama |
| 2005/0072906 | A1 | 4/2005 | Dobashi |
| 2005/0236553 | A1 | 10/2005 | Noto et al. |
| 2005/0263676 | A1 | 12/2005 | Jeon |

(Continued)

FOREIGN PATENT DOCUMENTS

WO    WO-2015191594 A1    12/2015

OTHER PUBLICATIONS

"International Application Serial No. PCT/US2015/034922, International Search Report dated Aug. 31, 2015", 2 pgs.

(Continued)

*Primary Examiner* — Tony Ko
(74) *Attorney, Agent, or Firm* — D. Kligler I.P. Services Ltd.

(57) ABSTRACT

Various embodiments include methods and apparatuses for forming and using pixels for image sensors. In one embodiment, an image sensor having at least two pixel electrodes per color region, and having at least two modes is disclosed. The example image sensor includes a first, unbinned, mode; and a second, binned, mode. In the first, unbinned mode, the at least two pixel electrodes per color region are to be reset to substantially similar levels. In the second, binned mode, a first pixel electrode of the at the least two pixel electrodes is to be reset to a high voltage that results in efficient collection of photocharge, and a second pixel electrode of the at the least two pixel electrodes is to be reset to a low voltage that results in less efficient collection of photocharge. Other methods and apparatuses are disclosed.

24 Claims, 39 Drawing Sheets

(56) References Cited

U.S. PATENT DOCUMENTS

| | | |
|---|---|---|
| 2008/0265295 A1 | 10/2008 | Brady |
| 2009/0021612 A1 | 1/2009 | Hamilton, Jr. et al. |
| 2009/0065824 A1 | 3/2009 | Hwang |
| 2010/0253833 A1 | 10/2010 | Deever et al. |
| 2010/0265370 A1 | 10/2010 | Kumar et al. |
| 2011/0075008 A1 | 3/2011 | Border et al. |
| 2011/0101205 A1 | 5/2011 | Tian et al. |
| 2013/0113967 A1 | 5/2013 | Wang |
| 2016/0190201 A1 | 6/2016 | Tian et al. |

OTHER PUBLICATIONS

"International Application Serial No. PCT/US2015/034922, Written Opinion dated Aug. 31, 2015", 8 pgs.
"International Application Serial No. PCT/US2015/034922, International Preliminary Report on Patentability dated Dec. 22, 2016", 10 pgs.

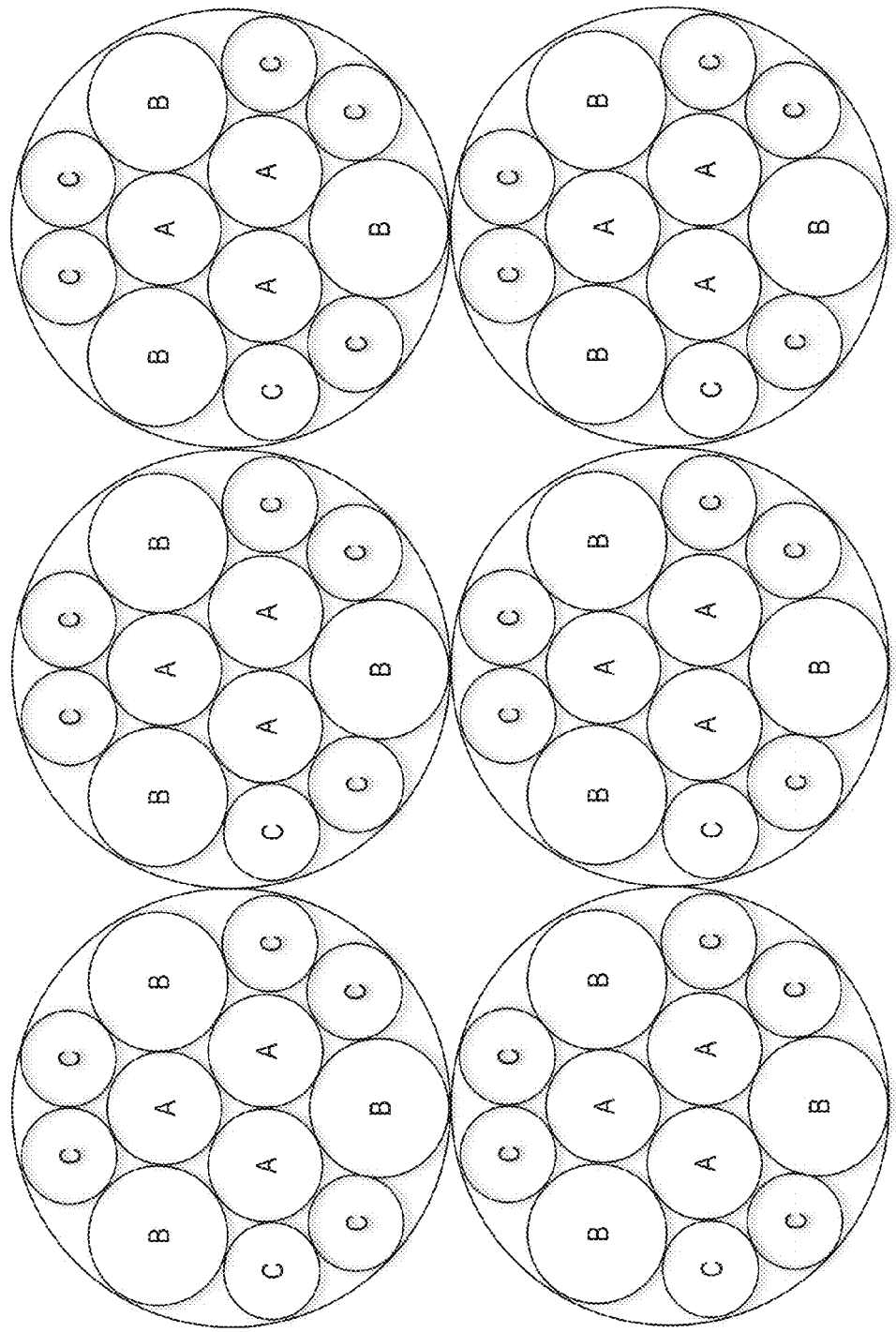

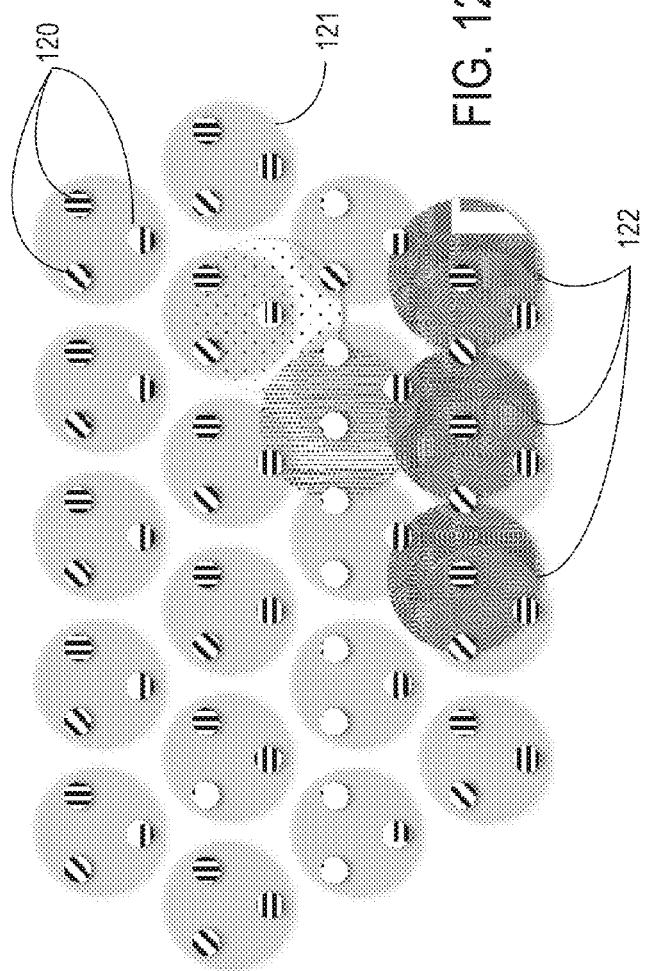
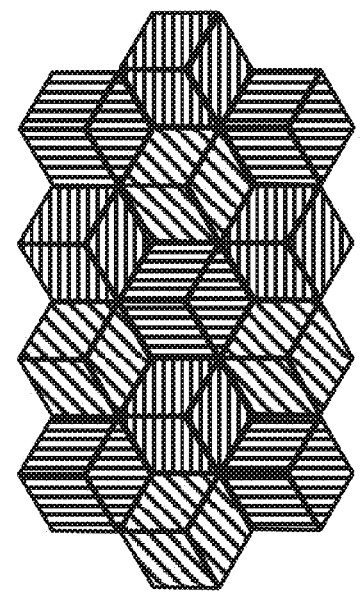
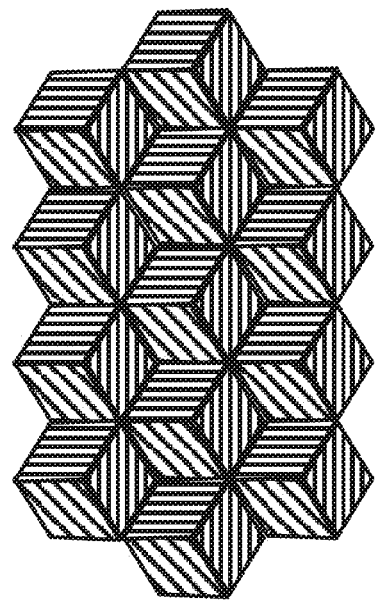
FIG. 12A
FIG. 12B

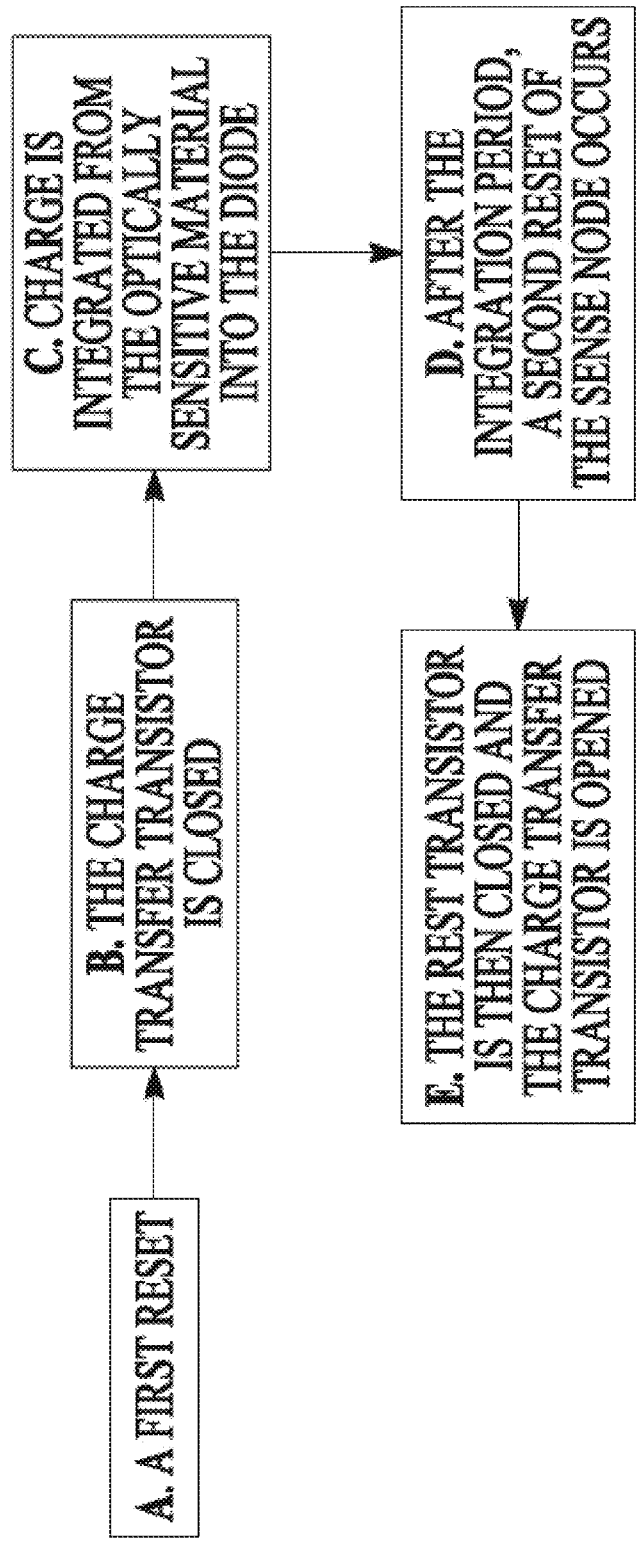

LAYOUT AND OPERATION OF PIXELS FOR IMAGE SENSORS

CROSS-REFERENCE TO RELATED APPLICATIONS

This application claims priority benefit of U.S. Provisional Patent Application No. 62/010,260, entitled, "LAYOUT AND OPERATION OF PIXELS FOR IMAGE SENSORS," filed Jun. 10, 2014, which is hereby incorporated by reference in its entirety. Each patent, patent application, and/or publication mentioned in this specification is hereby incorporated by reference in its entirety to the same extent as if each individual patent, patent application, and/or publication was specifically and individually indicated to be incorporated by reference.

TECHNICAL FIELD

The present invention generally relates to optical and electronic devices, systems and methods that include optically sensitive material, such as nanocrystals or other optically sensitive material, and methods of making and using the devices and systems.

BACKGROUND

Image sensors are desired to provide high-resolution, high signal-to-noise, and accurate color representations of visual scenes. Frequently, image sensors offer color discrimination using a pattern of color filters, such as the often-employed Bayer Pattern (GR/BG), a 2×2 array.

As pixel sizes are reduced to accommodate more pixels per integrated circuit area, thereby increasing resolution while containing cost, it becomes increasingly challenging to accommodate all electronic devices, such as transistors, that are needed to provide reset, charge accumulation and storage, transfer, shuttering, etc., within the pixel area. Therefore, it is desirable to provide layouts of pixels that can enable additional transistors to be accommodated, or to allow a given number of transistors to be accommodated within a reduced area.

Additionally, microlenses are often employed in image sensors, with one goal being to focus light through the relevant color filter array region, a strategy that reduces color crosstalk associated with optical color filter array (CFA) crosstalk. Fabrication methods of microlenses atop a square-symmetry array often produce regions at the microlens corners that are not effective in light focusing, contributing to a loss in fill factor (hence sensitivity) and also a loss of color discrimination (hence larger matrix elements in the color correction matrix, hence lower signal-to-noise ratio (SNR) in the final de-mosaiced color image).

One approach to ensure maximally effective microlenses is to provide a layout of pixels that comes closer to providing circular symmetry in the layout of the pixels. This may be achieved by increasing the number of nearest-neighbors, such as in a hexagonal array instead of a square array.

BRIEF DESCRIPTION OF THE DRAWINGS

The systems and methods described herein may be understood by reference to the following figures:

FIGS. 9 and 10 show superpixels that comprise subpixels of varying areas of square and hexagonal layouts, respectively;

FIGS. 12A and 12B show hexagonal layouts (trichrome) layouts of stacked pixels;

FIG. 25 is a flowchart of an operation of the pixel circuitry;

FIG. 27 shows an embodiment of a single-plane computing device that may be used in computing, communication, gaming, interfacing, and so on;

FIG. 28 shows an embodiment of a double-plane computing device that may be used in computing, communication, gaming, interfacing, and so on;

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

Figure 1:
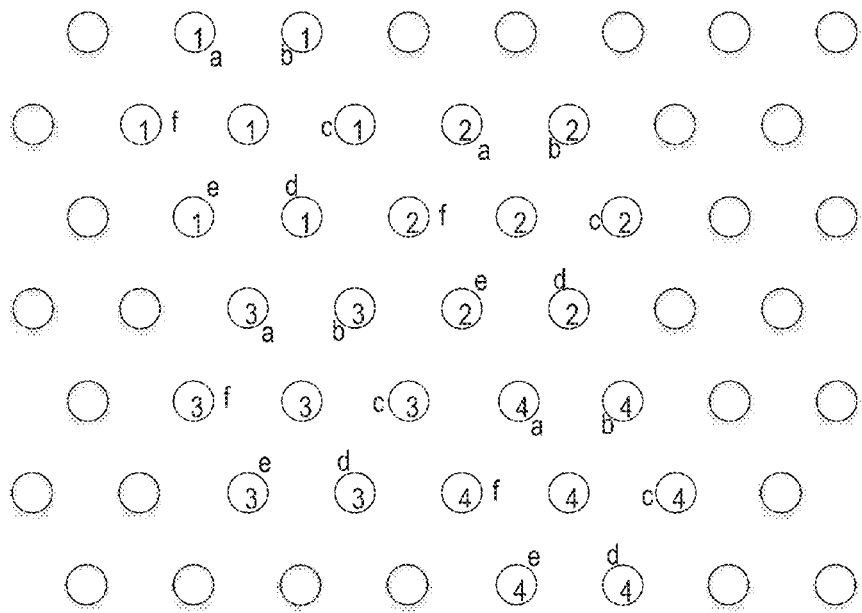
FIGS. 1 and 2 show examples of a hexagonal-packing layout.

With reference to FIG. 1, in this embodiment, each of pixel electrodes 1, 1a, 1b, 1c, 2, 2a, 2b, etc. are laid out in a hexagonal array. In this example, the pixel electrodes 1, 1a, . . . , 1f are responsible for sensing a certain color, such as for example green. The pixel electrodes 2, 2a, . . . , 2f are responsible for sensing a certain color, such as for example red. Pixel electrodes 3, 3a, . . . , 3f are responsible for sensing a certain color, such as for example blue. Pixel electrodes 4, 4a, . . . , 4f are responsible for sensing a certain color, such as, for example, green.

Color discrimination in the aforesaid regions may be implemented using, for example, color filters (a color filter array, CFA) overlying the regions.

Color discrimination in the aforesaid regions may be implemented, in an alternative embodiment, by an optically sensitive material having a specific color sensing capability overlying the regions. For example, the optically sensitive material may sense primarily a specific wavelength, such as green, approximately 500 nm to 580 nm wavelength, and may be considerably less sensitive to other colors, such as blue at approximately 450 nm to 500 nm, and red, at approximately 580 nm to 650 nm.

In the embodiment of FIG. 1, the single-color pixel region 1, 1a, . . . , 1f may be said to be spatially oversampled, inasmuch as all seven pixel electrodes making up this region are responsible for sensing substantially the same color.

In a first mode, referred to as unbinned, a signal may be collected independently from each of the seven electrodes 1, 1a, . . . , 1f. These provide information on the spatial distribution of light impinging upon this "super-region" spanned by electrodes 1, 1a, . . . , 1f.

In a second mode, referred to as a binned mode, a signal may be collected from the ensemble, or summation of subsets of, or the entire set, of electrodes 1, 1a, . . . , 1f. The binned mode may offer the benefit of, singly or in combination, faster frame rates, and greater signal-to-noise ratio, as the signal is the sum of all sub-pixels signal and the noise is the constant readout noise. In this mode, less spatial information is conveyed, since the spatial oversampling within the region spanned by 1, 1a, . . . , 1f is not provided.

In a mode referred to as unbinned, the reset level of the seven pixel electrodes in the region corresponding to 1, 1a, . . . , 1f may be selected to be a substantially spatially uniform (e.g., same for 1, 1a, . . . , 1f) value. In this manner, electrode 1 collects photocharge from the region of optically sensitive material that lies closest to electrode 1; analogously, electrode 1a collects photocharge from the region of optically sensitive material that lies closest to electrode 1a; and so on.

In a mode referred to as binned, the reset level of the six pixel electrodes in the region corresponding to 1, 1a, . . . , 1f, may be selected to differ for certain subsets of the list of electrodes. In an example embodiment, a first reset level may be selected for electrode 1; and a second reset level may be selected for electrodes 1, 1a, . . . , 1f. The first reset level and the second reset level may be selected such that photocharge from the regions overlying 1, 1a, . . . , 1f, are substantially all collected into electrode 1; and electrodes 1a, . . . , 1f do not collect appreciable photocharge. In this example embodiment, the photocharge is binned into electrode 1; and electrodes 1a, . . . , 1f are non-collecting and may not be read.

In a mode referred to as unbinned subsampled, the reset level of a subset of the five pixel electrodes in the region corresponding to 1, 1a, . . . , 1d may be selected to be a substantially spatially uniform (e.g., same for 1a, . . . , 1d) value while the remaining electrodes (e.g., 1) may have a different reset level. In this manner, the first subset of electrodes collects photocharge from the region of optically sensitive material that lies closest to the electrodes while the second subset of electrodes remains substantially inactive.

Hexagonal Layout, Four Independently Used Pixel Electrodes

Figure 4:
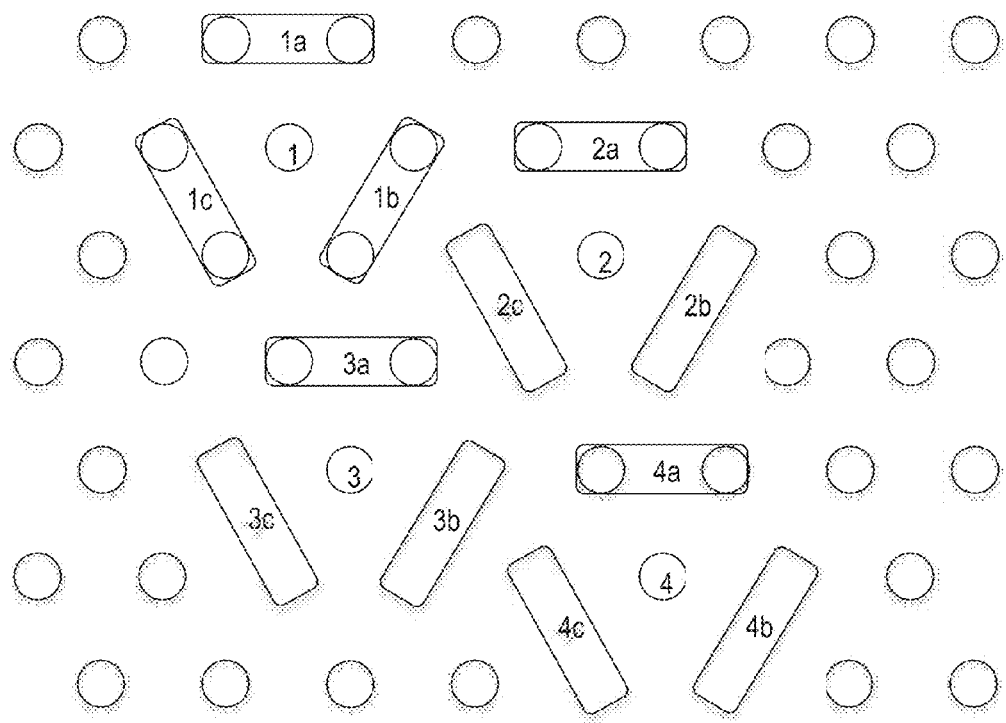
FIG. 4 shows pixel electrodes laid out in a pattern exhibiting an underlying hexagonal symmetry.

Referring now to FIG. 4, in this embodiment, pixel electrodes 1, 1a, 1b, 1c, 2, 2a, 2b, 2c, 3, 3a, 3b, 3c, 4, 4a, 4b, and 4c, are laid out in a pattern exhibiting an underlying hexagonal symmetry.

Pixel electrodes 1, 1a, . . . , 1c are responsible for sensing a certain color, such as for example green. Pixel electrodes 2, 2a, . . . , 2c are responsible for sensing a certain color, such as for example red. Pixel electrodes 3, 3a, . . . , 3c are responsible for sensing a certain color, such as for example blue. Pixel electrodes 4, 4a, . . . , 4c are responsible for sensing a certain color, such as for example green.

Color discrimination in the aforesaid regions may be implemented using, for example, color filters (a color filter array, CFA) overlying the regions.

Color discrimination in the aforesaid regions may be implemented, in an alternative embodiment, by an optically sensitive material having a specific color sensing capability overlying the regions. For example, the optically sensitive material may sense primarily a specific wavelength, such as green, at approximately 500 nm to 580 nm wavelength, and may be considerably less sensitive to other colors, such as blue, at approximately 450 nm to 500 nm, and red, at approximately 580 nm to 650 nm.

In the embodiment of FIG. 4, the single-color pixel region 1, 1a, ..., 1c may be said to be spatially oversampled, inasmuch as all four pixel electrodes making up this region are responsible for sensing substantially the same color.

In a mode referred to as unbinned, a signal may be collected independently from each of the four electrodes 1, 1a, ..., 1c. These provide information on the spatial distribution of light impinging upon this "super-region" spanned by electrodes 1, 1a, ..., 1c.

In a second mode referred to as binned, a signal may be collected from the ensemble, or summation of subsets of, or the entire set, of electrodes 1, 1a, ..., 1c. The binned mode has the benefit that a larger signal is collected, enabling greater signal-to-noise ratio in the reported signal. In this mode, less spatial information is conveyed, since the spatial oversampling within the region spanned by 1, 1a, ..., 1c is not provided.

In a mode referred to as unbinned, the reset level of the four pixel electrodes in the region corresponding to 1, 1a, ..., 1c may be selected to be a substantially spatially uniform (same for 1, 1a, ..., 1c) value. In this manner, electrode 1 collects photocharge from the region of optically sensitive material that lies closest to electrode 1; analogously, electrode 1a collects photocharge from the region of optically sensitive material that lies closest to electrode 1a; and so on.

In a mode referred to as binned, the reset level of the four pixel electrodes in the region corresponding to 1, 1a, ..., 1c, may be selected to differ for certain subsets of the list of electrodes. In an example embodiment, a first reset level may be selected for electrode 1; and a second reset level may be selected for electrodes 1, 1a, ..., 1c. The first and second reset levels may be selected such that photocharge from the regions overlying 1, 1a, ..., 1c, are substantially all collected into electrode 1; and electrodes 1a, ..., 1c do not collect appreciable photocharge. In this example embodiment, the photocharge is binned into electrode 1; and electrodes 1a, ..., 1c are non-collecting and may not be read.

In a mode referred to as unbinned subsampled, the reset level of a subset of the five pixel electrodes in the region corresponding to 1, 1a, ..., 1d may be selected to be a substantially spatially uniform (e.g., same for 1a, ..., 1d) value while the remaining electrodes (e.g., 1) may have a different reset level. In this manner, the first subset of electrodes collects photocharge from the region of optically sensitive material that lies closest to the electrodes while the second subset of electrodes remains inactive.

Square Layout, Five Independently Used Pixel Electrodes

Figure 5:
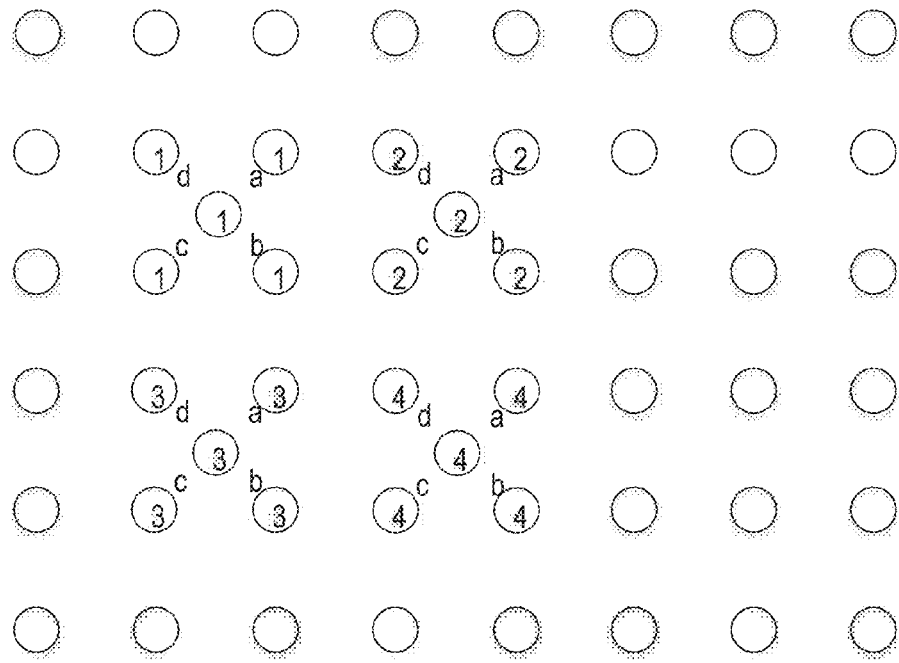
FIG. 5 shows pixel electrodes laid out in a pattern exhibiting underlying square symmetry.

Referring now to FIG. 5, in this embodiment, pixel electrodes 1, 1a, 1b, 1c, 1d, 2, 2a, 2b, 2c, 2d, 3, 3a, 3b, 3c, 3d, 4, 4a, 4b, 4c, 4d, are laid out in a pattern exhibiting underlying square symmetry.

Pixel electrodes 1, 1a, ..., 1d are responsible for sensing a certain color, such as for example green. Pixel electrodes 2, 2a, ..., 2d are responsible for sensing a certain color, such as for example red. Pixel electrodes 3, 3a, ..., 3d are responsible for sensing a certain color, such as for example blue. Pixel electrodes 4, 4a, ..., 4d are responsible for sensing a certain color, such as for example green.

Color discrimination in the aforesaid regions may be implemented using, for example, color filters (a color filter array, CFA) overlying the regions.

Color discrimination in the aforesaid regions may be implemented, in an alternative embodiment, an optically sensitive material having a specific color sensing capability overlying the regions. For example, the optically sensitive material may sense primarily a specific wavelength, such as green, at approximately 500 nm to 580 nm wavelength, and may be considerably less sensitive to other colors, such as blue, at approximately 450 nm to 500 nm, and red, at approximately 580 nm to 650 nm.

In the embodiment of FIG. 5, the single-color pixel region 1, 1a, ..., 1d may be said to be spatially oversampled, inasmuch as all five pixel electrodes making up this region are responsible for sensing substantially the same color.

In a mode referred to as unbinned, a signal may be collected independently from each of the four electrodes 1, 1a, ..., 1d. These provide information on the spatial distribution of light impinging upon this "super-region" spanned by electrodes 1, 1a, ..., 1d.

In a second mode referred to as binned, a signal may be collected from the ensemble, or summation of subsets of, or the entire set, of electrodes 1, 1a, ..., 1d. The binned mode has the benefit that a larger signal is collected, enabling greater signal-to-noise ratio in the reported signal. In this mode, less spatial information is conveyed, since the spatial oversampling within the region spanned by 1, 1a, ..., 1d is not provided.

In a mode referred to as unbinned, the reset level of the five pixel electrodes in the region corresponding to 1, 1a, ..., 1d may be selected to be a substantially spatially uniform (same for 1, 1a, ..., 1d) value. In this manner, electrode 1 collects photocharge from the region of optically sensitive material that lies closest to electrode 1; analogously, electrode 1a collects photocharge from the region of optically sensitive material that lies closest to electrode 1a; and so on.

In a mode referred to as binned, the reset level of the five pixel electrodes in the region corresponding to 1, 1a, ..., 1d, may be selected to differ for certain subsets of the list of electrodes. In an example embodiment, a first reset level may be selected for electrode 1; and a second reset level may be selected for electrodes 1, 1a, ..., 1d. The first and second reset levels may be selected such that photocharge from the regions overlying 1, 1a, ..., 1d, are substantially all collected into electrode 1; and electrodes 1a, ..., 1d do not collect appreciable photocharge. In this example embodiment, the photocharge is binned into electrode 1; and electrodes 1a, ..., 1d are non-collecting and may not be read.

In a mode referred to as unbinned subsampled, the reset level of a subset of the five pixel electrodes in the region corresponding to 1, 1a, ..., 1d may be selected to be a substantially spatially uniform (e.g., same for 1a, ..., 1d) value while the remaining electrodes (e.g., 1) may have a different reset level. In this manner, the first subset of electrodes collects photocharge from the region of optically sensitive material that lies closest to the electrodes while the second subset of electrodes remains substantially inactive.

Comparison of Areas, Resolutions: Advantages of Hexagonal Arrangements

The layouts of FIGS. 4 and 5 may be compared for various areal efficiencies.

Areal Efficiencies

In general, as a rule of thumb, the X number of transistors (X may be non-integer in the case of sharing of at least one transistor among multiple pixels) to create a pixel may be fit into a 1.1 μm×1.1 μm area using a 110 nm process. And thus, 4× transistors may be fit into a 2.2 μm×2.2 μm area. This rule of thumb may be expressed: 0.83× transistors per μm².

Considering the example of FIG. 5, since five transistors are required in the region spanned by pixel electrodes 1, 1a, . . . , 1d, this region possesses an area equal to (5× transistors/0.83× transistors/μm²)=6.05 μm². An integrated circuit providing 8 megapixels' worth of superpixels (e.g., 8 megapixels in binned mode) would therefore require an array area of 48.4 mm² of silicon array.

Considering the example of FIG. 4, since 4× transistors are in the region spanned by pixel electrodes 1, 1a, . . . , 1c, this region possesses an area equal to (4× transistors/0.83× transistors/μm²)=4.84 μm². An integrated circuit providing 8 megapixels' worth of superpixels (e.g., 8 megapixels in binned mode) would therefore require an array area of 38.7 mm² of silicon array.

In these example embodiments, the pixel system arrayed based on hexagonal symmetry offers 8 megapixels in binned mode (high signal-to-noise) utilization an appreciably lower silicon array area, corresponding to a lower production cost.

The hexagonal symmetry system can provide 32 megapixels worth of information in unbinned mode. The square array system can provide 40 megapixels worth of information in unbinned mode. Since there are diminishing returns to growing further the extent of oversampling after some point, certain applications may elect the hexagonal symmetry approach for the benefit of excellent SNR, an impressive oversampling factor of 4 times in unbinned mode, and the lower array area.

Variants

In embodiments, the optically sensitive layer may provide sensitivity to wavelengths other than visible, such as infrared wavelengths and/or ultraviolet wavelengths.

In embodiments, the imaging array may include regions in which the optically sensitive material is obscured from exposure to light. Such regions may be termed black pixels. Such pixels may be used to provide references for levels, offsets, and dark current.

In embodiments, the imaging array may include regions in which the optically sensitive material is insensitive to light. Such regions may be termed black pixels. Such pixels may be used to provide references for levels, offsets, and dark current.

In embodiments, two or more pixels covered with the same microlens and color filter can be used to detect a phase difference in the image to aid autofocus functionality. In embodiments, two pixels are placed next to one another laterally, and this structure is employed to detect lateral phase differences. In embodiments, two pixels disposed vertically relative to each other are employed to detect vertical phase differences. In embodiments, both vertical and lateral phase differences are detected to provide maximal enablement of autofocus. In an example embodiment, corresponding to the unbinned case in which six pixels are independent read, phase information along at least three axes can be discerned.

In embodiments, the dimensions of the superpixel region may be selected to accommodate at least an additional transistor per superpixel region. This additional transistor(s) may be employed in, for example, providing extra functionality associated with pixel electrode 1, 2, 3, 4. For example, these center pixels may be global shutter pixels. They may have additional elements between the optically sensitive layer and the sense node that allow implementation of global shutter operations without compromise to frame rate and integration time. In example embodiments, a current-switching approach is provided wherein, during the open-shutter period, photocurrent it switched into a charge store; and where, during the closed-shutter period, photocurrent is switched to a low-impedance node.

In embodiments, one or more sub-pixels may include a current-switching approach in which, during a first integration period, photocurrent it switched into a first charge storage element, and during a second period photocurrent is switched to a second charge storage element. In embodiments, a high-dynamic-range imaging system can be provided thereby by employing the first and second charge stores having capacitances that differ by at least twofold. In embodiments, time of flight imaging may be provided, where the temporal relationship between an emitted brief pulse of light and its incidence onto the time-of-flight sensor is detected determining the time of switching into the first versus the second charge store that maximizes the difference between the signals in the two charge stores.

In embodiments, the center subpixel of each superpixel region may be selected to provide for a different size of charge store, e.g., a different effective capacitance. When read in unbinned mode, the peripheral subpixels 1a, 1b, 1c with their smaller capacitances will offer higher SNR at the expenses of maximum charge storage, while the central subpixel 1 with its higher capacitance will offer a larger charge storage at the expense of SNR in the dark. As a consequence, merging information from 1, 1a, 1b, 1c can provide for extended dynamic range. This extended dynamic range may be provided even within a single frame, and even employing a single integration time.

In embodiments, the electronic circuitry used to reset, read, collect charge, transfer charge, etc., is substantially unilluminated, for the optically sensitive layer as well as light-obscuring materials between the optically sensitive layer and the electronic circuitry obscure the passage of light.

In embodiments, circuitry may be included that can provide at least two modes. Referring again to FIG. 4, in the first mode, the charge collected by pixel electrodes 1, 1a, . . . , 1c, may be conveyed to four independent charge stores corresponding to 1, 1a, . . . , 1c. In the second mode, the charge collected by pixel electrodes 1, 1a, . . . , 1c, may be conveyed to a single charge store, such as for example that originally used for the collection of charge only from pixel electrode 1. An advantage of this embodiment is that the continued biasing of 1, 1a, . . . , 1c, at similar reset levels, even in binned mode, may provide for efficient collection of photocharge from the entire region spanned by 1, 1a, . . . , 1c. A disadvantage is that the additional circuitry used in the switching operation may add area to the circuit, and also may add noise to the reset process.

The means of color sensing described herein can be combined with means of color discrimination beyond the use of color filters. For example, the regions of optically sensitive layer may be differently employed in different regions to provide color discrimination. In an example embodiment, the thickness of the optically sensitive layer may differ over superpixel region {1, 1a, 1b, 1c} of FIG. 4, compared to over superpixel region {2, 2a, 2b, 2c}. For example, if superpixel region {1, 1a, 1b, 1c} is to provide green sensitivity, the optically sensitive layer may be of a first thickness, such as 500 nm, over this region; and if superpixel region {2, 2a, 2b, 2c} is to provide red sensitivity, the optically sensitive layer may be of a first thickness, such as 800 nm, over this region. One means of providing the different thickness regions is to produce a top surface of the silicon wafer, onto which optically sensitive material is to be deposited, having a topography such that the top surface of the 2, 2a, 2b, 2c region is deeper by approximately 300 nm than the top surface of 1, 1a, 1b, 1c, e.g., the top surface of the 2 region is recessed by 300 nm compared to the 1 region.

Figure 6A:
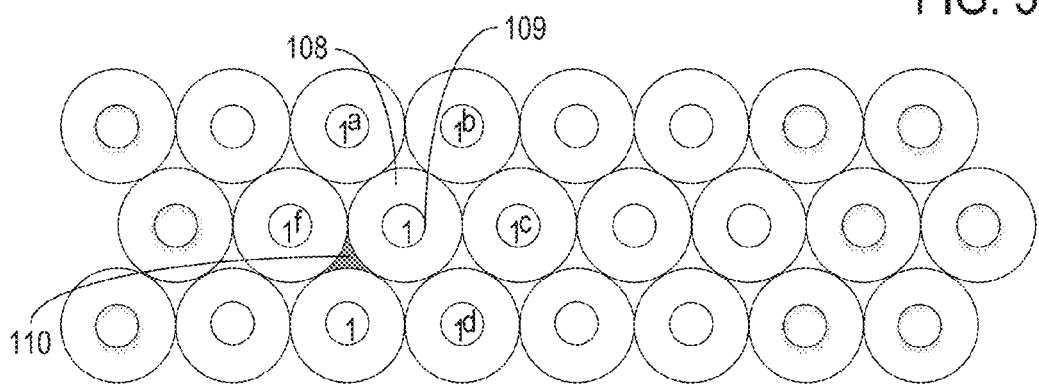
FIGS. 6A and 6B show hexagonal packing used to provide lower non-light-sensitive areas compared to square packing.
Figure 6B:
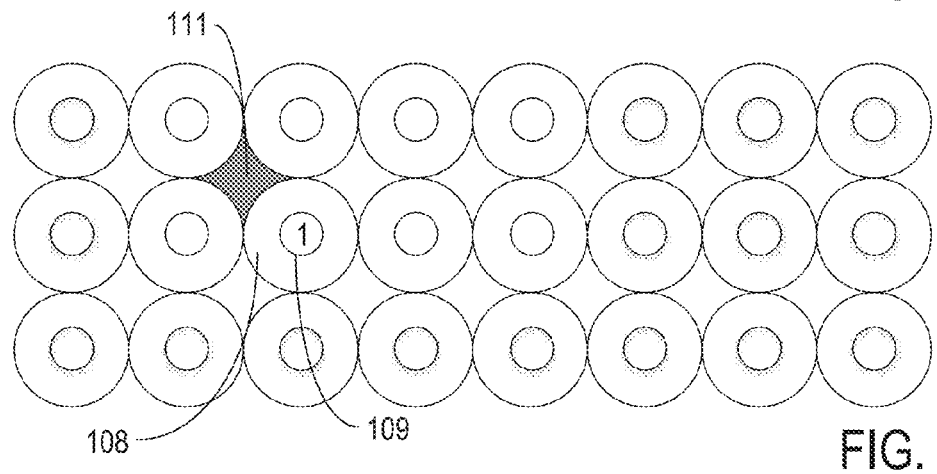

Referring to FIGS. 6A and 6B, the collecting regions may be visualized as substantially circular. For example, pixel electrode 1 efficiently collects from a region of optically sensitive material described by the larger circle that shares its center with the small-circle label corresponding to pixel electrode 1.

Nonuniformly Sized, and Numbered, Subpixels

Figure 10:
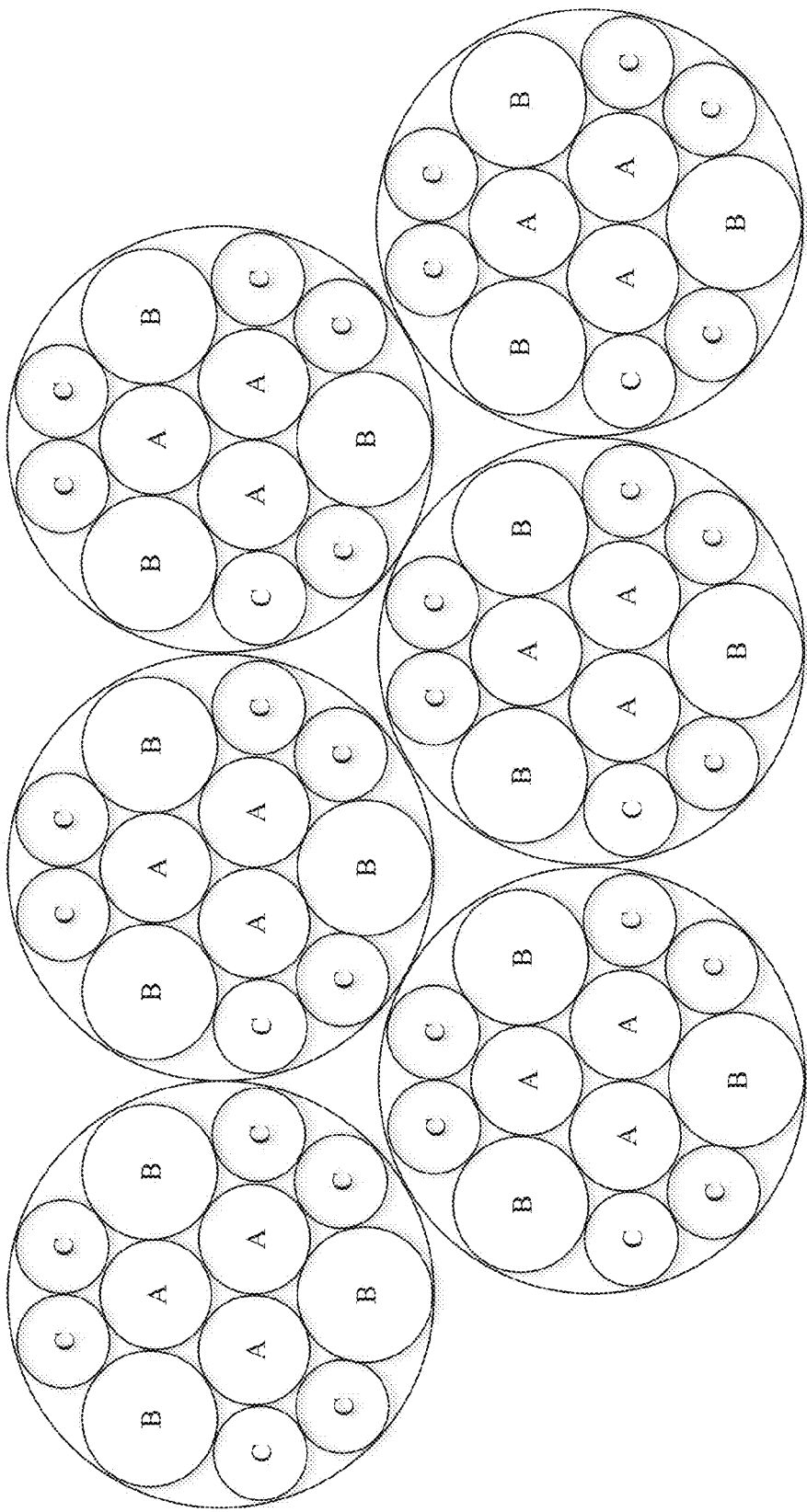

Referring to FIGS. 9 and 10, superpixels that comprise subpixels of varying areas of square and hexagonal layouts, respectively, may be employed. In the example embodiment of FIG. 9, subregions labeled A may be sensitive primarily to a first color, subregions B to a second color, and C to a third color. Note that, as illustrated in the figure, the number of elements A, B, and C may differ from one another; as well, the collection areas associated with subpixels of A, B, and C may differ from one another. The multiple subpixels per superpixel of class A may operate in unbinned mode, analogous to the unbinned descriptions above; or they may operate in binned mode, analogous to the binned descriptions above; and so on for B and C.

With reference again to FIG. 1, in an example of the high resolution mode, charges are collected individually into separate small pixel regions defined by a hexagonal layout of high-resolution charge collecting electrodes 1, 1a, 1b, 1c, 1d, 1e, 1f, 2, 2a, etc; and in the low-resolution mode, different charge-collecting pixel electrodes and a different pixel circuit are used for the collection of photocharges. In the low-resolution mode, the distinct high-resolution pixels such as 1a, 1b, 1c, . . . 2a, 2b, etc. are set to non-collecting: thus, a distinct pixel circuit is employed in this low-resolution binned mode. The circuit may incorporate a larger (more charge capacity) sense node/charge store. The circuit may employ greater circuit complexity, such as additional transistors, such as transistors incorporated to implement global electronic shutter, high dynamic range, analog-to-digital conversion, linearization, and the like.

Figure 2:
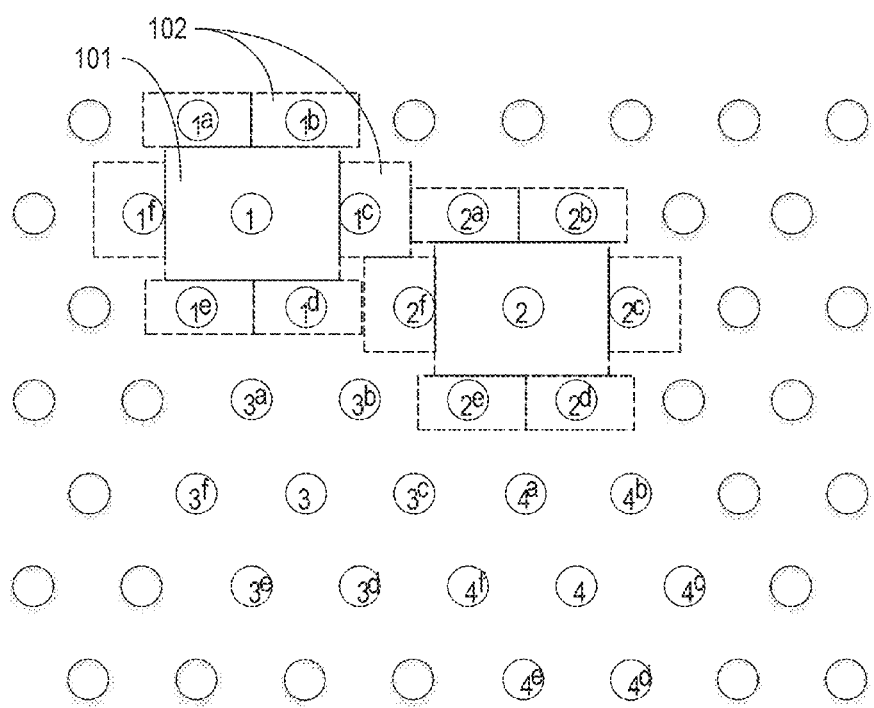

FIG. 2 shows an example of a hexagonal-packing layout of peripheral pixel electrodes 1, 1a, 1b, etc. that are used in the high-resolution mode; and also central pixel electrodes such as 1, 2, 3, etc. that are used in low-resolution mode. In FIG. 2, it is apparent that greater circuit area 101 may be devoted to sensing region connected to electrode 1 used either in low-resolution or high resolution modes compared to smaller sensing regions 102 connected to electrodes 1a, 1b, 1c, etc used in high-resolution mode.

Figure 3:
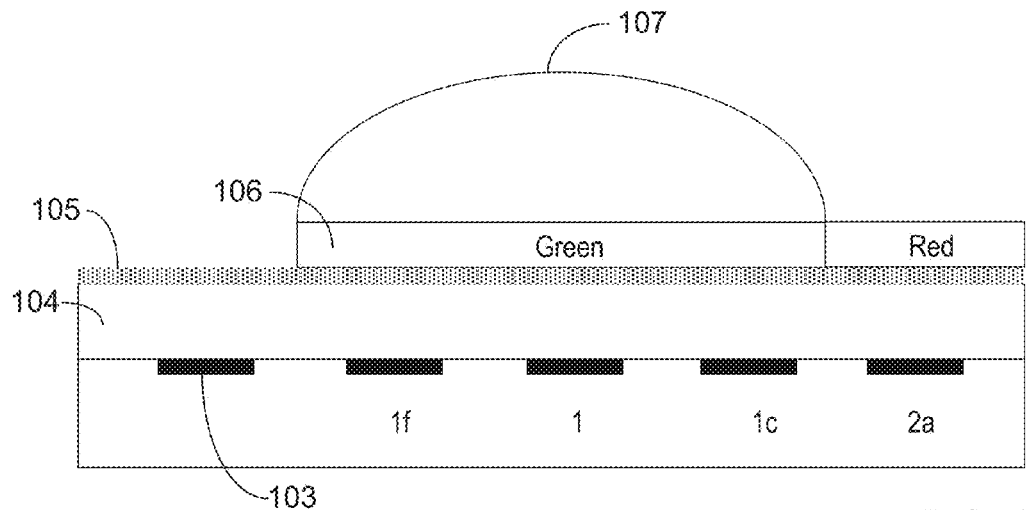
FIG. 3 shows a cross-section of a superpixel through the electrodes 1f, 1, 1c, 2a of, for example, FIG. 1.

With reference to FIG. 3, a cross-section of a superpixel through the electrodes 1f, 1, 1c, 2a shows positions of charge collecting electrodes 103 connected to photosensitive layer 104, location of top opposite charge collecting electrode 105, locations of color defined layers 106, and a microlens 107. The microlens 107 is shown in this example only over green color and defines a superpixel consisting of electrodes 1, 1a, 1b, 1c, 1d, 1e, 1f connected to corresponding silicon circuits below electrodes.

In a low-resolution binning mode, center electrodes 1, 2, 3, etc. are reset to a certain potential, for example to +2.2 V or to another potential within the range +0.5V to +5V; and peripheral electrodes 1a, 1b, 1c, . . . 2a, etc. are floating and not collecting charges generated in the photon absorbing photosensitive layer 104.

In cases, the peripheral electrodes can be reset to a negative potential within a range of, for example, 0 V to 5 V at certain moments and for certain period of time to enhance charge collection through center electrodes 1, 2, 3, etc., reduce dark current, or reset the photosensitive layer.

In a high-resolution non-binning mode the peripheral electrodes 1a, 1b, . . . 2a, etc. are reset to the same potential, for example +2.2 V, but center electrodes 1, 2, etc. are floating and not collecting the charges. In certain high-resolution non-binning modes, the electrodes are reset to the same or similar potential to improve SNR utilizing silicon circuits connected to the center electrodes.

FIGS. 6A and 6B illustrate an advantage of embodiments of the invention. Hexagonal packing may be used to provide lower non-light-sensitive areas compared to square packing. Labels 109 point to size and location of one electrode either in hexagonal-packing pixel layout (FIG. 6A) while labels 108 point to size of charge collecting area within photosensitive layer defined by potential of the electrode. In this case, radii of all charge collecting areas may be substantially the same. Notably both in hexagonal packing, FIG. 6A, and in square packing, FIG. 6B, there are shaded areas 110 and 111, respectively, where charge collection is not efficient. When square packing is used, the corners of the square are a greater distance from the collecting pixel electrodes than non-corner regions of the squares. If photocharges are not efficiently collected from the corner regions, this reduces effective fill factor. Hexagonal implementations such as shown in FIG. 6A come closer to approximating repeat units that are circle-like. Their most remote corners of the hexagons are less distant from the collecting pixel electrode, increasing efficiency and fill factor. By simple calculations the shaded non-charge collecting area 110 of FIG. 6A in hexagonal packing mode is only 10% of a single pixel area, while shaded non-charge collecting area 111 of FIG. 6B in square packing is over 20% of a single pixel area.

Another advantage of the disclosed subject matter includes improved anti-aliasing. In rectangular grids, there occurs spatial sampling of horizontal and vertical spatial frequencies that are periodic.

Aliasing may be reduced using a non-square grid in either high resolution or binning nodes (e.g., as shown in FIG. 1). The pixels can be sampled non-sequentially, selecting rows and columns connected to a multiple pixels within a superpixel of a specific color. In a layout of FIG. 1, signals are collected using 2× number of columns compared to square grid.

In embodiments, when operating in low-resolution mode (e.g., collecting current into 1, 2, 3, etc. of FIG. 1), the biasing of high-resolution pixels (1a, 1b, 1c, etc. of FIG. 1) may be selected in order to drive charge towards the intended collecting pixel 1. If pixel electrode 1 is reset to +2.2 V, and if a transparent top contact is biased at −0.5 V, then the high-resolution pixels not collecting charge may be set to an intermediate voltage, such as +1 V. The biasing of the pixels 1a, 1b, 1c etc. may be chosen to minimize dark associated with pixels 1a, 1b, 1c, etc.

In embodiments, the dark current flowing into 1 may be determined by the potential to which 1a, 1b, etc. are reset. In embodiments, a dark reference is obtained from dark pixels that employ the same biasing conditions as the illuminated inner array pixels. The dark level equal to the amount acquired by said dark pixels is effectively subtracted from reported light pixel values.

In embodiments, a stacked pixel, comprising at least one lower layer of light sensing material, and a distinct upper layer, is formed. In embodiments, the stacked pixels are deployed over a hexagonal array.

Figure 7:
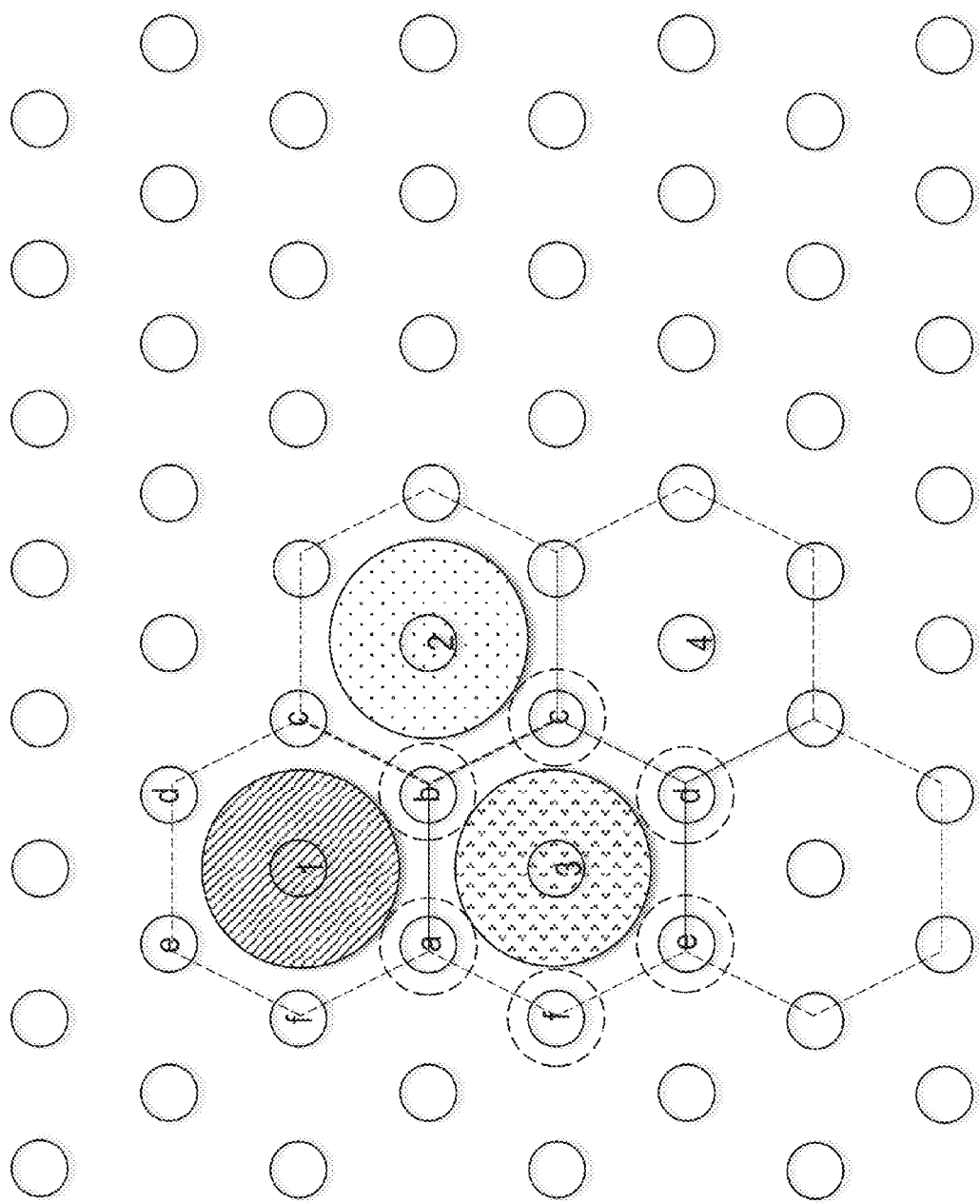
FIG. 7 shows an example embodiment a high density pixel layout with color imaging in binning mode.

FIG. 7 shows an example embodiment a high density pixel layout with color imaging in binning mode. In one mode, peripheral subpixels 1a, 1b, 1c, etc. are non-collecting and the center subpixel 1 collects color information and peripheral subpixels collect all photons within 450-650 nm range providing high sensitivity and high resolution imaging after a demosaic process.

Figure 8A:
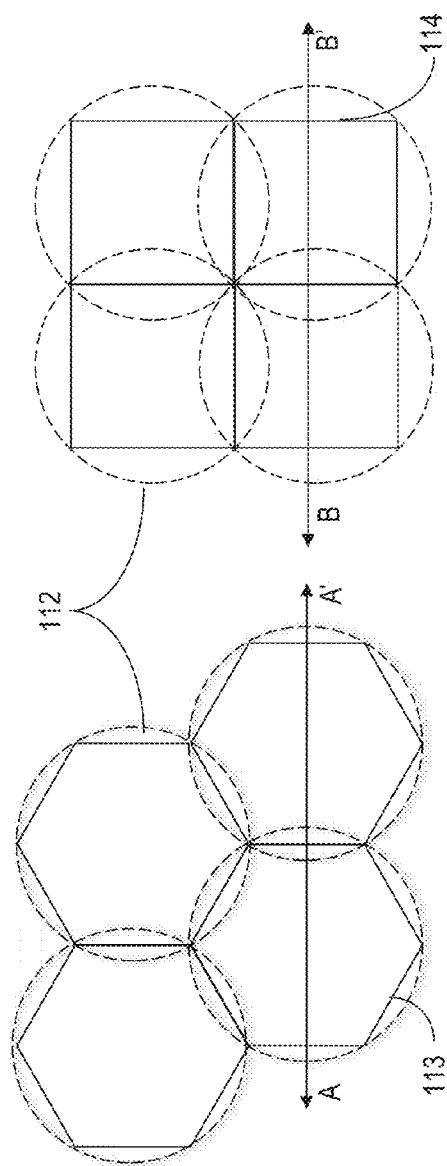
FIGS. 8A and 8B, top view and side view, respectively, show a hexagonal layout and a square layout.
Figure 8B:
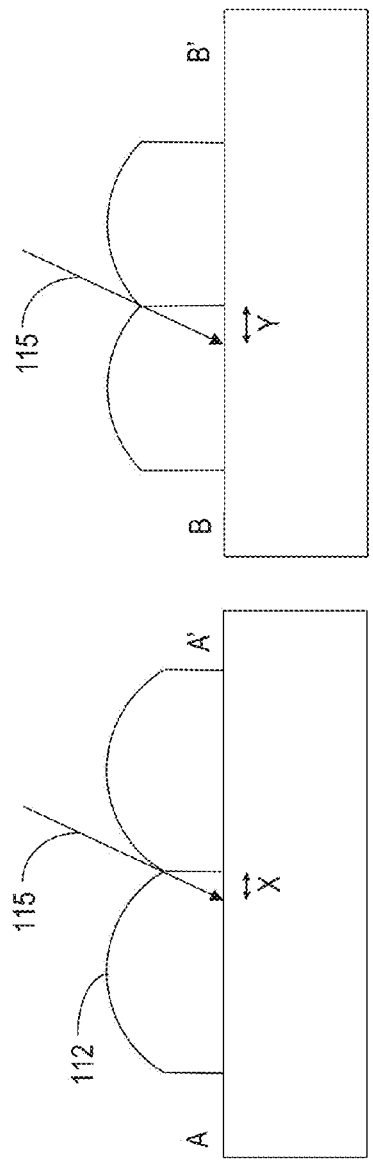

FIGS. 8A and 8B, top view and side view, respectively, depict a hexagonal layout and a square layout. This configuration offers an advantage with respect to crosstalk. A contribution to crosstalk is shape mismatch of a spherical microlens and a pixel. Sizes of a spherical or in some cases aspherical microlenses 112 are typically substantially the same both for hexagonal 113 and square 114 pixels. The minimum thickness of a microlens is defined by microlens radius of curvature and a largest distance across the pixel. In a cross-section view in FIG. 8B, along lines A-A' and B-B', two adjacent microlenses are truncated forming a vertical plane in between. In the example of the hexagonal layout, the left portion of FIG. 8B, the height of vertical plane between microlenses 112 is lower than in the example of the square layout, the right portion of FIG. 8B. As a result, incoming light rays 115 will penetrate into an adjacent pixel by a distance X in the hexagonal layout and by a distance Y in the square layout. The larger distance Y is directly proportional to a larger optical cross-talk as compared with the distance X in the hexagonal layout.

Figure 11:
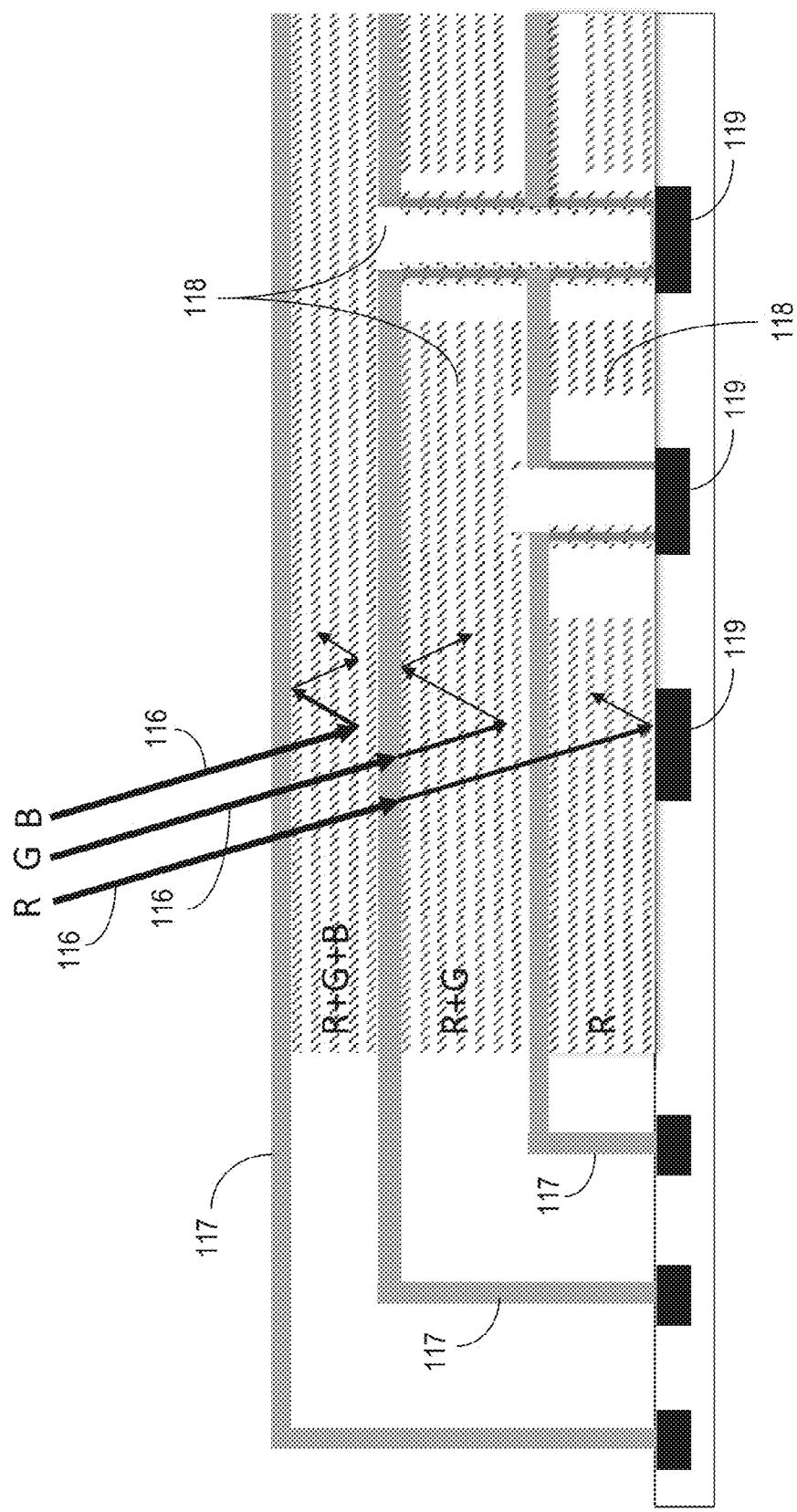
FIG. 11 shows an example embodiment of stacked pixels.

Referring now to FIG. 11, an example embodiment of stacked pixels is shown. Each photosensitive layer 118 is separated from another one of the photosensitive layers with transparent conductive antireflection layers 117. The layers are formed continuously across the pixel array except for small areas occupied by vias connecting each photosensitive layer to charge collecting electrodes. In this embodiment, the transparent conductive antireflection layers 117 are connected outside the pixel array to a common counter electrode in one embodiment or to a separate counter electrodes, one per photosensitive layer.

Bottom electrodes are reset to a certain potential within, for example, a +0.5 V to +5 V range to extract photocharges from each layer separately. Photocharges are collected by the electrodes 119 located on the same plane above a silicon circuit.

The antireflection layers 117 are designed to provide total reflection of blue photons from the two lower photo layers. In it, total reflection of G photons from incoming rays 116 is provided from the lowest photo layer. In such a stacked pixel, minimal signal processing is required to separate RGB colors (bottom layer 1—R only, layer 2—R+G, layer 3—R+G+B)). Continuous photolayers eliminates the need for a demosaic signal process.

Figure 13A:
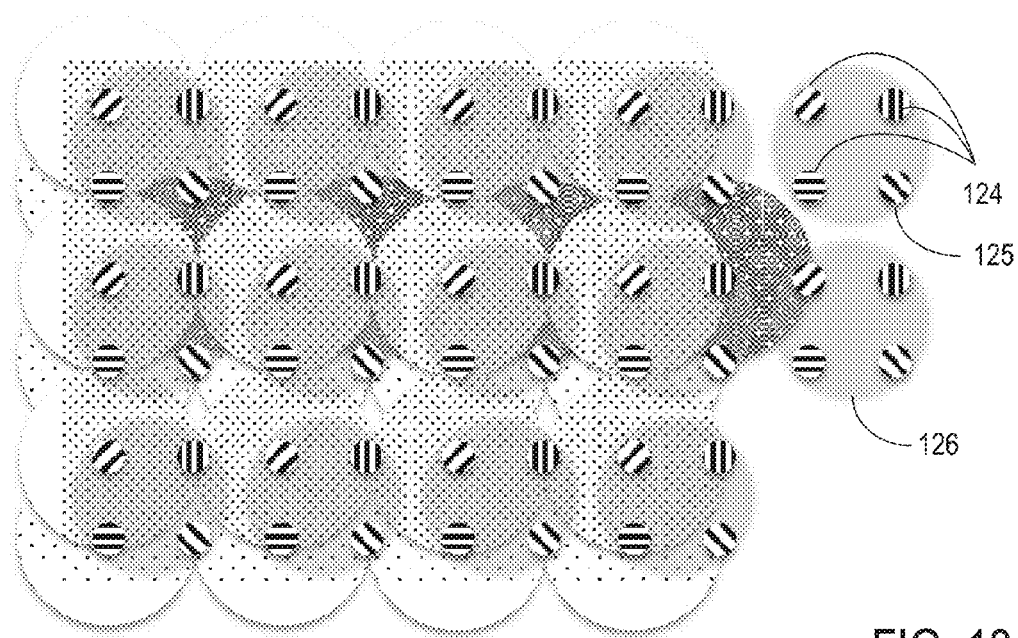
FIGS. 13A and 13B show square grid (tetrachrome) layouts of stacked pixels.
Figure 13B:
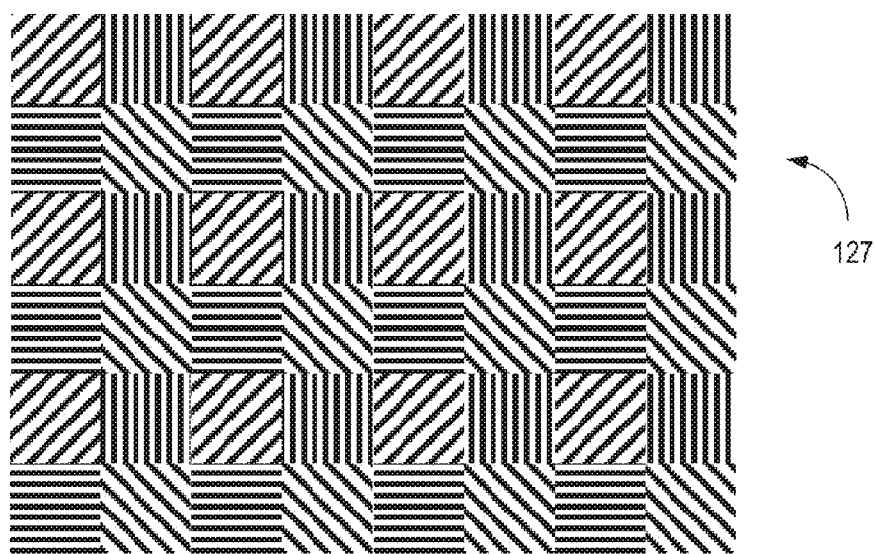

FIGS. 12A and 12B show hexagonal layouts (trichrome) and FIGS. 13A and 13B show square grid (tetrachrome) layouts of stacked pixels with total color EQE above 80%. This is an advantage over traditional color-filter-based systems that reject typically approximately ⅔ of the incident white light through lossy color filtering. Three color-specific electrodes 120 are located within a full color pixel 121. A specific color electrode 122 within each of the full color pixels is sufficiently separated from each other to provide high-resolution individual color imaging to be directly reproduced in matching layout color display, either with the hexagonal layout 123 of FIG. 12B or the square layout 127 of FIG. 13B.

FIG. 13A shows a square layout with four different color electrodes 124, 125 where electrode 125 is connected to a fourth layer within stacked pixel to collect photons outside the visible range, such as IR, UV, X-Ray. All four electrodes are located within one full color pixel 126.

Various embodiments include a combination of hexagonal-packing layout and microlenses that allow Shallow Trench Isolation (STI) of superpixels to reduce cross-talk by either dielectric material or metal which can function as (a) a waveguide and (b) as a grid electrode. The 10% area between the electrodes has very low areal density of incoming photons and is used for Trench Isolation without any significant loss of photoresponse.

Embodiments include an image sensor comprising a semiconductor substrate; a plurality of pixel regions, each pixel region comprising an optically sensitive material over the substrate, the optically sensitive material positioned to receive light; a pixel circuit for each pixel region, each pixel circuit comprising a charge store formed on the semiconductor substrate and a read out circuit; and a non-metallic contact region between the charge store and the optically sensitive material of the respective pixel region, wherein the charge store is in electrical communication with the optically sensitive material of the respective pixel region through the non-metallic contact region.

Embodiments include an image sensor wherein the charge store comprises a doped region of the semiconductor substrate.

Embodiments include an image sensor wherein the charge store comprises an n-type region of the semiconductor substrate.

Embodiments include an image sensor wherein the charge store comprises a diode.

Embodiments include and image sensor wherein the charge store comprises a n-type silicon diode.

Embodiments include an image sensor wherein the charge store comprises a pinned diode.

Embodiments include an image sensor wherein the pinned diode comprises a p-type layer of the optically sensitive material over an n-type region of the semiconductor substrate.

Embodiments include an image sensor wherein the optically sensitive material comprises a p-type semiconductor material.

Embodiments include an image sensor wherein the non-metallic contact region comprises a pn junction.

Embodiments include an image sensor wherein the non-metallic contact region comprises a heterojunction.

Embodiments include an image sensor wherein the optically sensitive material is in direct electrical communication with the charge store.

Embodiments include an image sensor wherein the optically sensitive material is in direct contact with the charge store.

Embodiments include an image sensor wherein the optically sensitive material forms a passivation layer over the charge store.

Embodiments include an image sensor wherein the optically sensitive material forms a hole accumulation layer over the charge store.

Embodiments include an image sensor wherein the charge store comprises a pinned diode, wherein the pinned diode comprises a p-type layer of the optically sensitive material over an n-type region of the semiconductor substrate.

Embodiments include an image sensor wherein the optically sensitive material absorbs light at the wavelength being imaged.

Embodiments include an image sensor wherein the optically sensitive material substantially shields the charge store from the light incident on the optically sensitive layer.

Embodiments include an image sensor wherein the non-metallic contact region comprises at least one layer of material between the optically sensitive material and the charge store.

Embodiments include an image sensor wherein the layer of material comprises a p-type semiconductor material.

Embodiments include an image sensor wherein the layer of material comprises a p-type silicon layer.

Embodiments include an image sensor wherein the layer of material comprises a material selected from the group consisting of a semiconductor material, a polymer material and an organic material.

Embodiments include an image sensor wherein the layer of material provides a non-metallic conductive path for the flow of charge between the optically sensitive material and the charge store.

Embodiments include an image sensor wherein at least one layer of material above the charge store substantially shields the charge store from the light incident on the optically sensitive layer.

Embodiments include an image sensor wherein the pixel circuit comprises at least one transistor formed on a first side of the semiconductor substrate.

Embodiments include an image sensor wherein the semiconductor substrate comprises metal interconnect on a first side of the semiconductor substrate.

Embodiments include an image sensor wherein the charge store is formed on the first side of the semiconductor substrate.

Embodiments include an image sensor wherein the optically sensitive material is positioned over the first side of the semiconductor substrate.

Embodiments include an image sensor wherein an opening is formed in metal interconnect layers of the semiconductor substrate to expose the charge store and the optically sensitive material interfaces with the charge store through the opening.

Embodiments include an image sensor wherein at least a portion of the optically sensitive material is positioned in the opening.

Embodiments include an image sensor wherein at least one additional layer of non-metallic material is included in the opening. Embodiments include an image sensor wherein the charge store is formed on a second side of the semiconductor substrate.

Embodiments include an image sensor wherein the optically sensitive material is positioned over the second side of the semiconductor substrate.

Embodiments include an image sensor wherein at least one electrode is proximate the optically sensitive material of each pixel region.

Embodiments include an image sensor wherein the electrode comprises a transparent electrode positioned over the optically sensitive material of the respective pixel region.

Embodiments include an image sensor wherein the electrode is a lateral electrode proximate the optically sensitive material of the respective pixel region.

Embodiments include an image sensor wherein the electrode is a grid electrode around the optically sensitive material of the respective pixel region.

Embodiments include an image sensor wherein the electrode is in electrical communication with a metal interconnect layer of the semiconductor substrate.

Embodiments include an image sensor wherein the electrode is a common electrode for the plurality of pixel regions.

Embodiments include an image sensor wherein the electrode is configured to provide a bias to the optically sensitive material.

Embodiments include an image sensor wherein the electrode is grounded.

Embodiments include an image sensor wherein the electrode is configured to provide a voltage lower than a depletion voltage of a pinned diode forming the charge store.

Embodiments include an image sensor wherein the pixel circuit further comprises a sense node.

Embodiments include an image sensor wherein the sense node comprises a doped region of the semiconductor substrate.

Embodiments include an image sensor comprising a charge transfer transistor between the sense node that the charge store for selectively transferring charge between the sense node and the charge store when a transfer signal is applied to the gate of the charge transfer transistor.

Embodiments include an image sensor wherein the read out circuit comprises a source follower transistor and a row select transistor for selectively coupling the source follower transistor to a column read out line.

Embodiments include an image sensor wherein the pixel circuit further comprises a reset transistor between the sense node and a reference potential for selectively resetting the voltage of the sense node when a reset signal is applied to the gate of the reset transistor.

Embodiments include an image sensor wherein there are four transistors included in the pixel circuit.

Embodiments include an image sensor wherein the pixel circuit is configured to integrate charge from the optically sensitive material into the charge store during an integration period of time, wherein the charge is transferred from the optically sensitive material to the charge store through the non-metallic contact region.

Embodiments include an image sensor wherein the charge transferred to the charge store is based on intensity of the light absorbed by the optically sensitive material of the respective pixel region over an integration period of time.

Embodiments include an image sensor wherein the pixel circuit is configured to provide a read out signal using correlated double sampling.

Embodiments include an image sensor wherein the pixel circuit is configured to perform a first reset, wherein the sense node is reset to the reference potential and the charge store is reset to a depletion voltage of a pinned diode forming the charge store.

Embodiments include an image sensor reset transistor and the charge transfer transistor are open during the first reset.

Embodiments include an image sensor wherein the charge transfer transistor is closed during the integration period of time.

Embodiments include an image sensor wherein the electrode applies a voltage difference across the optically sensitive material during the integration period of time.

Embodiments include an image sensor wherein the pixel circuit is configured to perform a second reset of the sense node prior to read out, wherein the charge transfer transistor is closed and the reset transistor is open during the second reset.

Embodiments include an image sensor wherein the pixel circuit is configured to transfer charge from the charge store to the sense node for read out after the second reset, wherein the charge transfer transistor is open and the reset transistor is closed during the transfer of charge from the charge store for read out.

Embodiments include an image sensor wherein the optically sensitive material comprises monodispersed nanocrystals.

Embodiments include an image sensor wherein the optically sensitive material comprises a continuous film of interconnected nanocrystal particles in contact with the electrode and the charge store for the respective pixel region.

Embodiments include an image sensor wherein the nanocrystal particles comprise a plurality of nanocrystal cores and a shell over the plurality of nanocrystal cores.

Embodiments include an image sensor wherein the plurality of nanocrystal cores is fused.

Embodiments include an image sensor wherein the plurality of nanocrystal cores is electrically interconnected with linker molecules.

Embodiments include an image sensor wherein optical isolation among pixel regions is achieved using a light-blocking layer disposed in the horizontal plane substantially at the boundary between the pixel regions.

Embodiments include an image sensor wherein the light-blocking layer consists of a material from the group Al, TiN, Cu, Ni, Mo, TiOxNy, and W.

Embodiments include an image sensor wherein the light-blocking layer consists of a material whose width is in the range 5 nm-100 nm.

Embodiments include an image sensor wherein the light-blocking layer consists of a material whose width is in the range 5 nm-100 nm.

Embodiments include an image sensor comprising a semiconductor substrate; a plurality of pixel regions, each pixel region comprising an optically sensitive material over the substrate, the optically sensitive material positioned to receive light; and a pinned diode comprising a doped region of the semiconductor substrate and a portion of the optically sensitive material over the doped region.

Embodiments include an image sensor wherein the interface between the optically sensitive material and the doped region forms a pn junction.

Embodiments include an image sensor wherein the interface between the optically sensitive material and the doped region forms a heterojunction.

Embodiments include a semiconductor substrate; a plurality of pixel regions, each pixel region comprising an optically sensitive material over the substrate, the optically sensitive material positioned to receive light; and a diode formed on the semiconductor substrate, wherein the optically sensitive material directly contacts the diode to provide electrical communication between the optically sensitive material and the diode.

Embodiments include an image sensor wherein the interface between the optically sensitive material and the doped region forms a pn junction.

Embodiments include an image sensor wherein the interface between the optically sensitive material and the doped region forms a heterojunction.

Embodiments include a method for read out of an image sensor comprising: providing an optically sensitive material over a semiconductor substrate; exposing the optically sensitive material to light; integrating charge from the optically sensitive material to a charge store formed on the semiconductor substrate through a non-metallic contact region between the optically sensitive material and the charge store.

Embodiments include the method wherein the charge store is a pinned diode.

Embodiments include the method wherein the pinned diode is substantially shielded from light incident on the optically sensitive material.

Embodiments include the method wherein the optically sensitive material is the primary location for the absorption of light to be imaged.

Embodiments include a method for read out of an image sensor comprising: providing an optically sensitive material over a semiconductor substrate; exposing the optically sensitive material to light; performing a first reset to reset a sense node to a reference potential and a pinned diode to a depletion voltage level; isolating the pinned diode from the sense node during an integration period of time; integrating charge from the optically sensitive material to the pinned diode during the integration period of time, wherein the amount of charge integrated during the integration period depends on the intensity of light incident on the photosensitive material; performing a second reset to reset the sense node prior to read out while the sense node is isolated from the pinned diode; transferring charge from the pinned diode to the sense node after the second reset; and reading out a signal from the sense node.

Embodiments include a method wherein the charge is integrated from the optically sensitive material to the pinned diode through a direct interface in the absence of metal interconnect between the optically sensitive material and the pinned diode.

Embodiments include a method wherein the optically sensitive material interfaces with the diode to form a pn junction and the charge is integrated from the optically sensitive material to the diode through the interface.

Image sensors incorporate arrays of photodetectors. These photodetectors sense light, converting it from an optical to an electronic signal.

In the description that follows, each drawing refers to an image sensor, or portions of an image sensor that, in example embodiments, would have one or more of the features, such as (1) direct interface/non-metallic contact region between film and pinned diode, and/or (2) new pixel circuit, and/or (3) new pixel isolation techniques, and/or (4) new backside illumination architecture.

Figure 14:
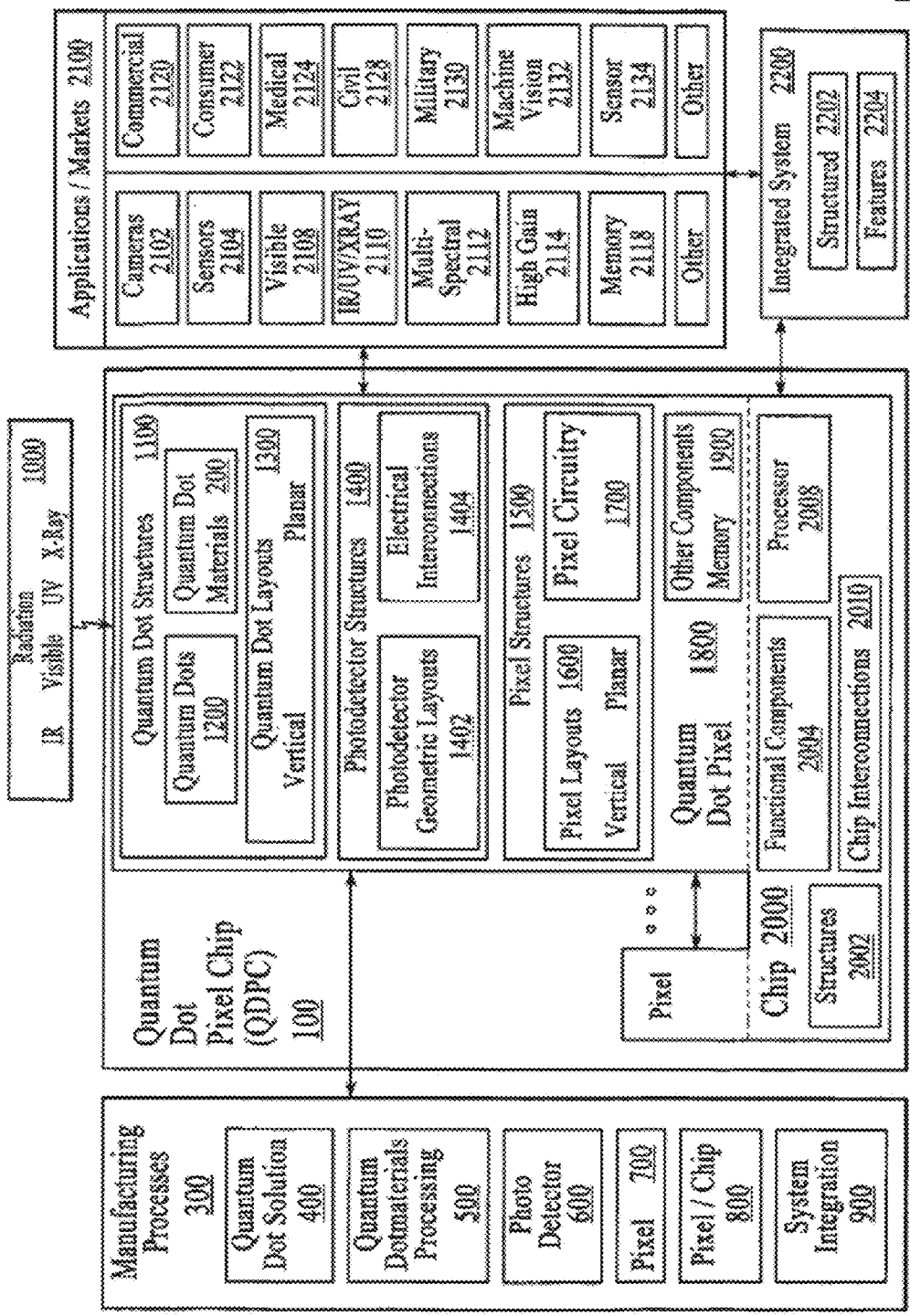
FIG. 14 shows overall structure and areas according to an embodiment.

FIG. 14 shows structure of and areas relating to quantum dot pixel chip structures (QDPCs) 100, according to example embodiments. As illustrated in FIG. 14, the QDPC 100 may be adapted as a radiation 1000 receiver where quantum dot structures 1100 are presented to receive the radiation 1000, such as light. The QDPC 100 includes quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. From an electrical viewpoint, the pixel circuitry 1700 may be in communication with other electronics (e.g. chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color.'

In the example embodiment of FIG. 14, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, potential to bin, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure, that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 15:
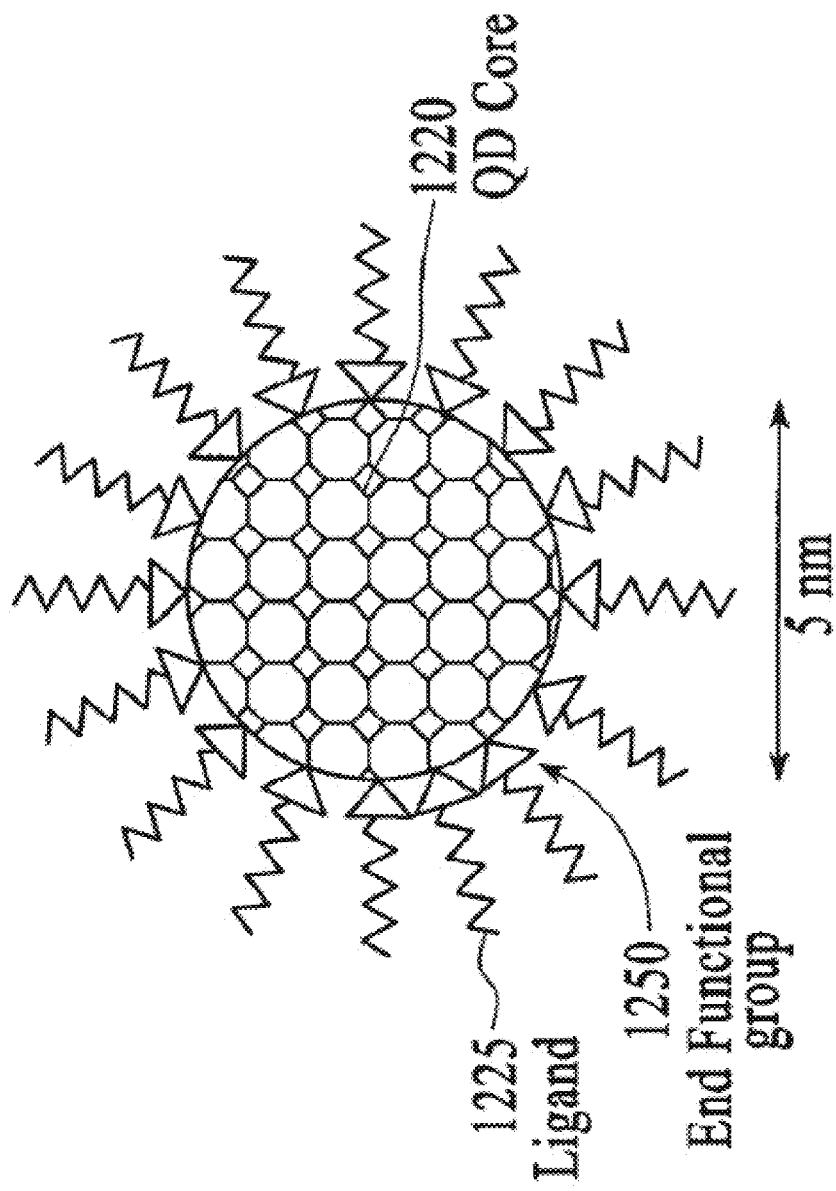
FIG. 15 shows an example of a quantum dot 1200.

FIG. 15 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, such as 700×700 nm, or as large as 30 by 30 microns or more or any range subsumed therein.

The photodetector structure 1400 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing my include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure.

In embodiments the chip may have functional components that enable high-speed readout capabilities, which may facilitate the readout of large arrays, such as 5 Mpixels, 6 Mpixels, 8 Mpixels, 12 Mpixels, 24 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. Embodiments include the use of micro-lenses. Embodiments include using smaller process geometries.

In embodiments, pixel size, and thus chip size, may be scaled down without decreasing fill factor. In embodiments, larger process geometries may be used because transistor size, and interconnect line-width, may not obscure pixels since the photodetectors are on the top surface, residing above the interconnect. In embodiments, geometries such as 90 nm, 0.13 µm and 0.18 µm may be employed without obscuring pixels. In embodiments, small geometries such as 90 nm and below may also be employed, and these may be standard, rather than image-sensor-customized, processes, leading to lower cost. In embodiments, the use of small geometries may be more compatible with high-speed digital signal processing on the same chip. This may lead to faster, cheaper, and/or higher-quality image sensor processing on chip. In embodiments, the use of more advanced geometries for digital signal processing may contribute to lower power consumption for a given degree of image sensor processing functionality.

Figure 18:
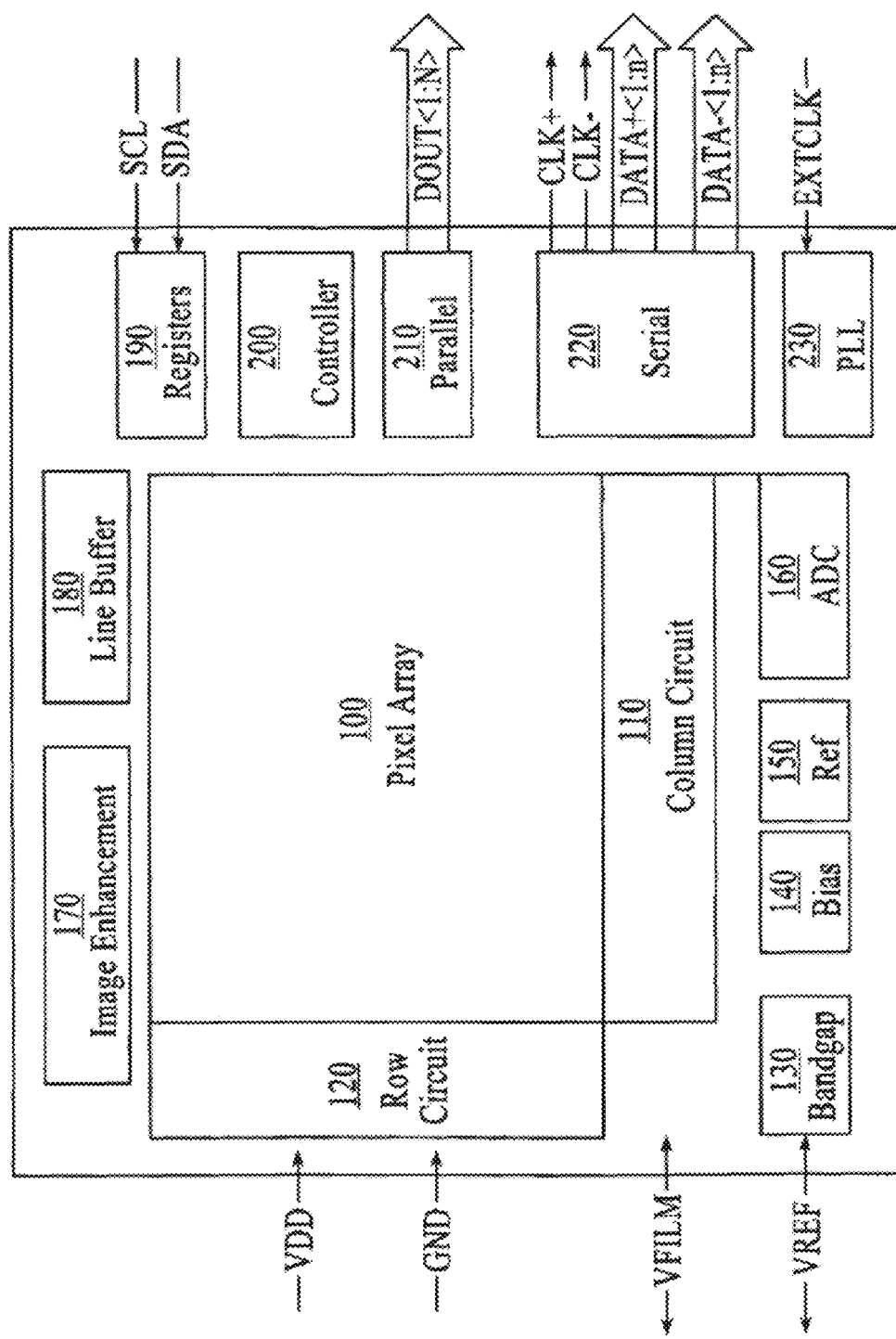
FIG. 18 is a block diagram of an example system configuration that may be used in combination with embodiments described herein.

An example integrated circuit system that can be used in combination with the above photodetectors, pixel regions and pixel circuits will now be described in connection with FIG. 18. FIG. 18 is a block diagram of an image sensor integrated circuit (also referred to as an image sensor chip). The chip includes:

a pixel array (100) in which incident light is converted into electronic signals, and in which electronic signals are integrated into charge stores whose contents and voltage levels are related to the integrated light incident over the frame period;

row and column circuits (110 & 120) which are used to reset each pixel, and read the signal related to the contents of each charge store, in order to convey the information related to the integrated light over each pixel over the frame period to the outer periphery of the chip analog circuits (130, 140, 150, 160, 230). The pixel electrical signal from the column circuits is fed into the analog-to-digital conver (160) where it is converted into a digital number representing the light level at each pixel. The pixel array and ADC are supported by analog circuits that provide bias and reference levels (130, 140, & 150).

digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and JO functionality. (190) is a bank of registers that prescribe the global operation of the system and/or the frame format. Block 200 controls the operation of the chip.

IO circuits (210 & 220) support both parallel input/output and serial input/output. (210) is a parallel JO interface that outputs every bit of a pixel value simultaneously. (220) is a serial JO interface where every bit of a pixel value is output sequentially.

a phase-locked loop (230) provides a clock to the whole chip.

In a particular example embodiment, when 0.11 µm CMOS technology node is employed, the periodic repeat distance of pixels along the row-axis and along the column-axis may be 700 nm, 900 nm, 1.1 µm, 1.2 µm, 1.4 µm, 1.55 µm, 1.75 µm, 2.2 µm, or larger. The implementation of the smallest of these pixels sizes, especially 700 nm, 900 nm, 1.1 µm, and 1.2 µm, and 1.4 µm, may require transistor sharing among pairs or larger group of adjacent pixels.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack. In the case of conventional CMOS image sensors, this presents an additional constraint in the routing of interconnect. This often reduces the extent to which a transistor, or transistors, can practically be shared. For example, 4:1 sharing is often employed, but higher sharing ratios are not. In contrast, a read-out circuit designed for use with a top-surface optically-sensitive layer can employ 8:1 and 16:1 sharing.

In embodiments, the optically sensitive layer may connect electrically to the read-out circuit beneath without a metal intervening between the optically sensitive layer and the read-out circuit beneath.

Embodiments of QD devices include a QD layer and a custom-designed or pre-fabricated electronic read-out integrated circuit. The QD layer is then formed directly onto the custom-designed or pre-fabricated electronic read-out integrated circuit. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation 1000 on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes.

In embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

Figure 16A:
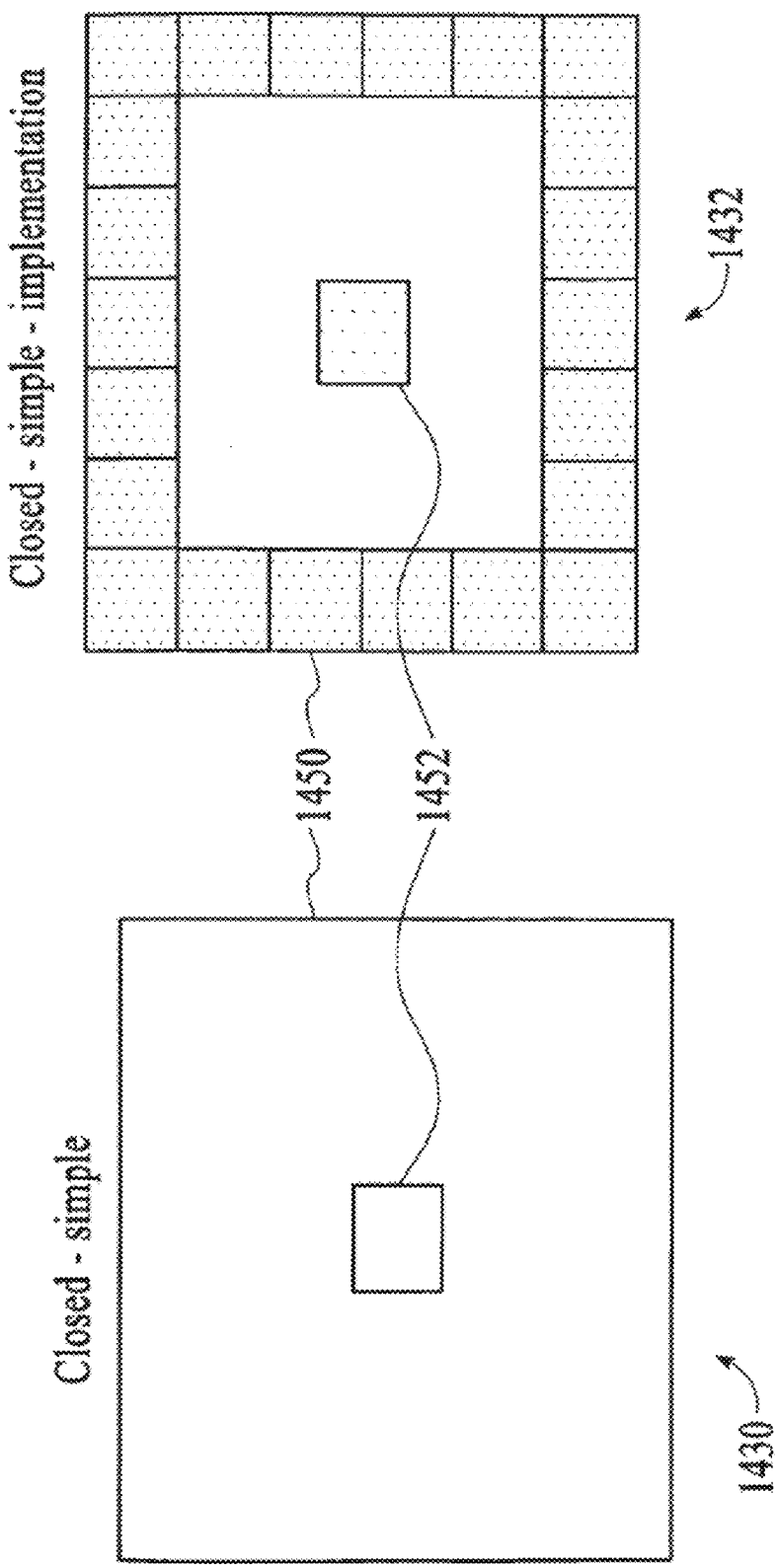
FIG. 16A shows an aspect of a closed simple geometrical arrangement of pixels.
Figure 16B:
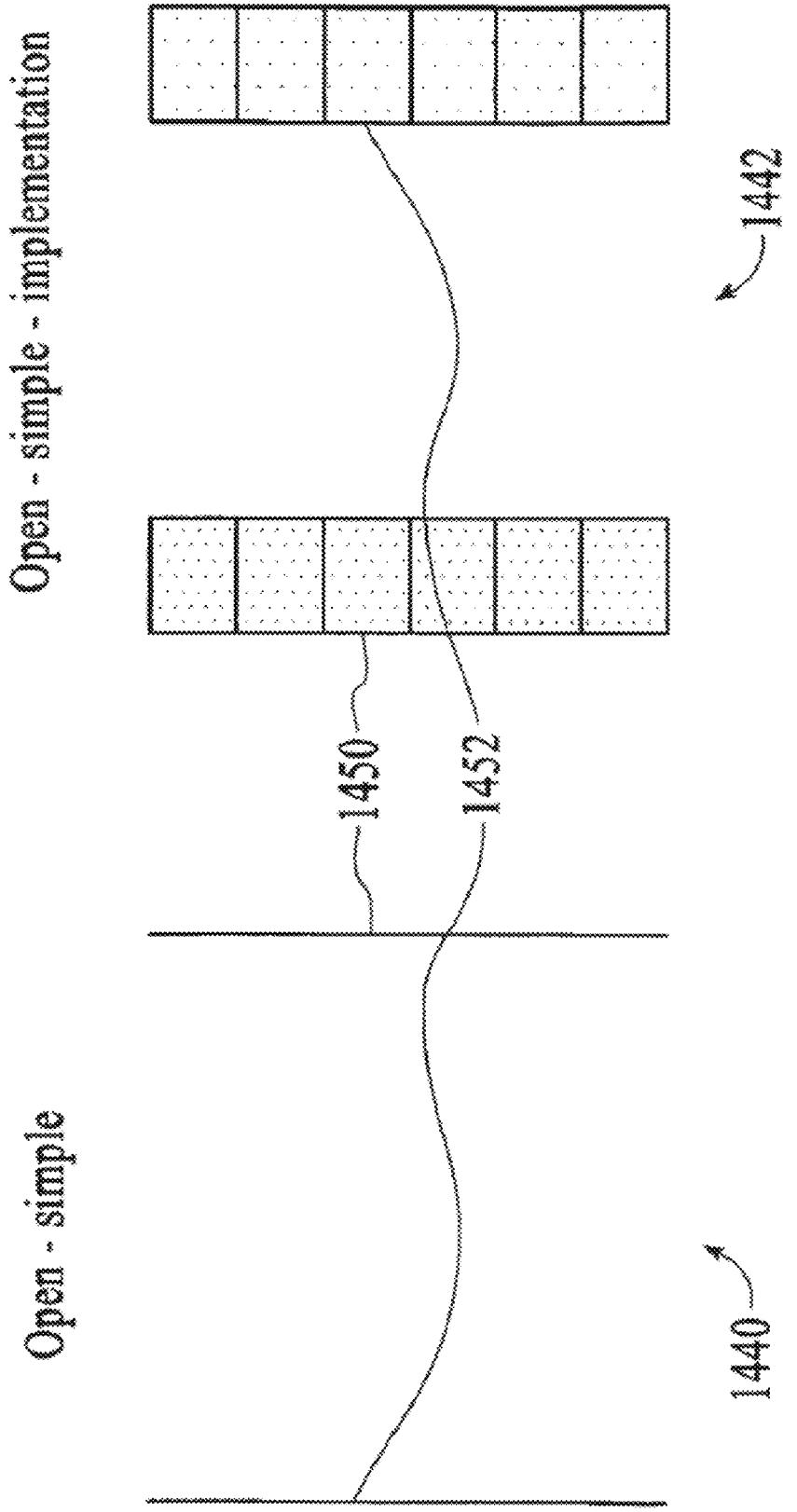
FIG. 16B shows an aspect of an open simple geometrical arrangement of pixels.
Figure 16C:
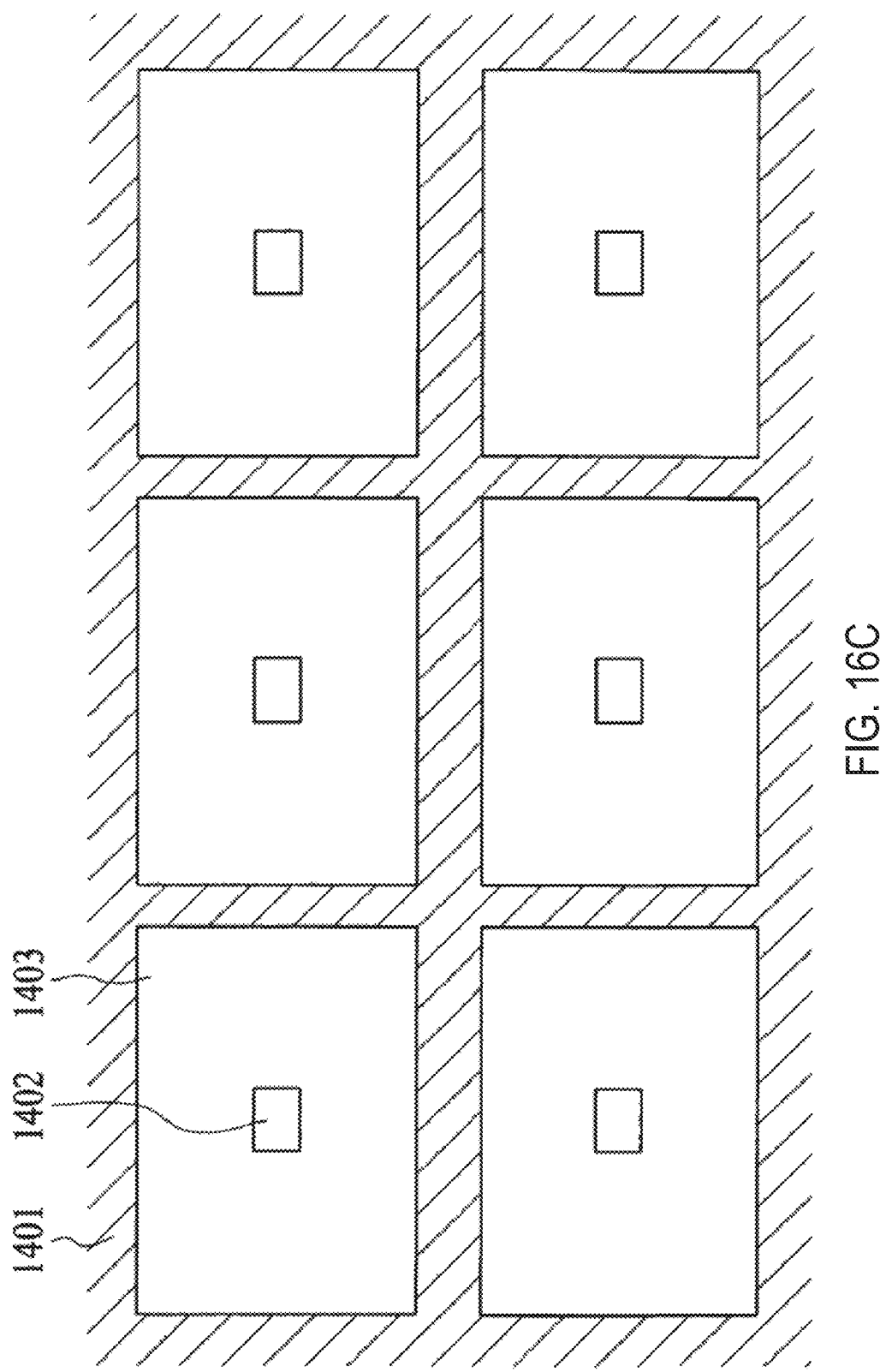
FIG. 16C shows a two-row by three-column sub-region within a generally larger array of top-surface electrodes.

FIG. 16C shows a two-row by three-column sub-region within a generally larger array of top-surface electrodes. The array of electrical contacts provides electrical communication to an overlying layer of optically sensitive material. 1401 represents a common grid of electrodes used to provide one shared contact to the optically sensitive layer. 1402 represents the pixel-electrodes which provide the other contact for electrical communication with the optically sensitive layer. In embodiments, a voltage bias of −2 V may be applied to the common grid 1401, and a voltage of +2.5 V may be applied at the beginning of each integration period to each pixel electrode 1402.

In embodiments, a direct non-metallic contact region (e.g., pn junction contact) may be used instead of a metal interconnect pixel electrode for 1402.

Whereas the common contact 1401 is at a single electrical potential across the array at a given time, the pixel electrodes 1402 may vary in time and space across the array. For example if a circuit is configured such that the bias at 1402 varies in relation to current flowing into or out of 1402, then different electrodes 1402 may be at different biases throughout the progress of the integration period. Region 1403 represents the non-contacting region that lies between 1401 and 1402 within the lateral plane. 1403 is generally an insulating material in order to minimize dark current flowing between 1401 and 1402. 1401 and 1402 may generally consist of different materials. Each may for example be chosen for example from the list: TiN; TiN/Al/TiN; Cu; TaN; Ni; Pt; and from the preceding list there may reside superimposed on one or both contacts a further layer or set of layers chosen from: Pt, alkanethiols, Pd, Ru, Au, ITO, or other conductive or partially conductive materials.

In example embodiments, the pixel electrodes 1402 may consist of a semiconductor, such as silicon, including p-type or n-type silicon, instead of a metal interconnect pixel electrode.

Embodiments described herein may be combined. Example embodiments include a pixel circuit employing a pixel electrode that consists of a semiconductor, such as silicon, instead of a metal. In embodiments a direct connection between film and diode instead of metallic pixel electrodes (either front side or back side) may be formed. Other features described herein may be used in combination with this approach or architecture.

In example embodiments using the above structures, interconnect 1452 may form an electrode in electrical communication with a capacitance, impurity region on the semiconductor substrate or other charge store.

In embodiments, the charge store may be a pinned diode. In embodiments, the charge store may be a pinned diode in communication with an optically sensitive material without an intervening metal being present between the pinned diode and the optically sensitive layer.

In some embodiments, a voltage is applied to the charge store and discharges due to the flow of current across the optically sensitive film over an integration period of time. At the end of the integration period of time, the remaining voltage is sampled to generate a signal corresponding to the intensity of light absorbed by the optically sensitive layer during the integration period. In other embodiments, the pixel region may be biased to cause a voltage to accumulate in a charge store over an integration period of time. At the end of the integration period of time, the voltage may be sampled to generate a signal corresponding to the intensity of light absorbed by the optically sensitive layer during the integration period. In some example embodiments, the bias across the optically sensitive layer may vary over the integration period of time due to the discharge or accumulation of voltage at the charge store. This, in turn, may cause the rate of current flow across the optically sensitive material to also vary over the integration period of time. In addition, the optically sensitive material may be a nanocrystal material with photoconductive gain and the rate of current flow may have a non-linear relationship with the intensity of light absorbed by the optically sensitive layer. As a result, in some embodiments, circuitry may be used to convert the signals from the pixel regions into digital pixel data that has a linear relationship with the intensity of light absorbed by the pixel region over the integration period of time. The non-linear properties of the optically sensitive material can be used to provide a high dynamic range, while circuitry can be used to linearize the signals after they are read in order to provide digital pixel data. Example pixel circuits for read out of signals from pixel regions are described further below.

FIG. 16A represents closed—simple patterns 1430 (e.g., conceptual illustration) and 1432 (e.g., vias used to create photodetector structures). In the closed-simple illustrations 1430-1432 the positively biased electrical interconnect 1452 is provided in the center area of a grounded contained square electrical interconnect 1450. Square electrical interconnect 1450 may be grounded or may be at another reference potential to provide a bias across the optically sensitive material in the pixel region. For example, interconnect 1452 may be biased with a positive voltage and interconnect may be biased with a negative voltage to provide a desired voltage drop across a nanocrystal material in the pixel region between the electrodes. In this configuration, when radiation 1000 to which the layer is responsive falls within the square area a charge is developed and the charge is attracted to and move towards the center positively biased electrical interconnect 1452. If these closed-simple patterns are replicated over an area of the layer, each closed simple pattern forms a portion or a whole pixel where they capture charge associated with incident radiation 1000 that falls on the internal square area. In example embodiments, the electrical interconnect 1450 may be part of a grid that forms a common electrode for an array of pixel regions. Each side of the interconnect 1450 may be shared with the adjacent pixel region to form part of the electrical interconnect around the adjacent pixel. In this embodiment, the voltage on this electrode may be the same for all of the pixel regions (or for sets of adjacent pixel regions) whereas the voltage on the interconnect 1452 varies over an integration period of time based on the light intensity absorbed by the optically sensitive material in the pixel region and can be read out to generate a pixel signal for each pixel region. In example embodiments, interconnect 1450 may form a boundary around the electrical interconnect 1452 for each pixel region. The common electrode may be formed on the same layer as interconnect 1452 and be positioned laterally around the interconnect 1450. In some embodiments, the grid may be formed above or below the layer of optically sensitive material in the pixel region, but the bias on the electrode may still provide a boundary condition around the pixel region to reduce cross over with adjacent pixel regions.

In embodiments, said optically sensitive material may be in direct electrical communication with a pixel electrode, charge store, or pinned diode, without an intervening metal being present between said optically sensitive material and said pixel electrode, charge store, or pinned diode.

FIG. 16B illustrates open simple patterns of electrical interconnects. The open simple patterns do not, generally, form a closed pattern. The open simple pattern does not enclose a charge that is produced as the result of incident radiation 1000 with the area between the positively biased electrical interconnect 1452 and the ground 1450; however, charge developed within the area between the two electrical interconnects will be attracted and move to the positively biased electrical interconnect 1452. An array including separated open simple structures may provide a charge isolation system that may be used to identify a position of incident radiation 1000 and therefore corresponding pixel assignment. As above, electrical interconnect 1450 may be grounded or be at some other reference potential. In some embodiments, electrical interconnect 1450 may be electrically connected with the corresponding electrode of other pixels (for example, through underlying layers of interconnect) so the voltage may be applied across the pixel array. In other embodiments, the interconnect 1450 may extend linearly across multiple pixel regions to form a common electrode across a row or column.

Pixel circuitry that may be used to read out signals from the pixel regions will now be described. As described above, in embodiments, pixel structures 1500 within the QDPC 100 of FIG. 14 may have pixel layouts 1600, where pixel layouts 1600 may have a plurality of layout configurations such as vertical, planar, diagonal, or the like. Pixel structures 1500 may also have embedded pixel circuitry 1700. Pixel structures may also be associated with the electrical interconnections 1404 between the photodetector structures 1400 and pixel circuitry 1700.

In embodiments, quantum dot pixels 1800 within the QDPC 100 of FIG. 14 may have pixel circuitry 1700 that may be embedded or specific to an individual quantum dot pixel 1800, a group of quantum dot pixels 1800, all quantum dot pixels 1800 in an array of pixels, or the like. Different quantum dot pixels 1800 within the array of quantum dot pixels 1800 may have different pixel circuitry 1700, or may have no individual pixel circuitry 1700 at all. In embodiments, the pixel circuitry 1700 may provide a plurality of circuitry, such as for biasing, voltage biasing, current biasing, charge transfer, amplifier, reset, sample and hold, address logic, decoder logic, memory, TRAM cells, flash memory cells, gain, analog summing, analog-to-digital conversion, resistance bridges, or the like. In embodiments, the pixel circuitry 1700 may have a plurality of functions, such as for readout, sampling, correlated double sampling, sub-frame sampling, timing, integration, summing, gain control, automatic gain control, off-set adjustment, calibration, offset adjustment, memory storage, frame buffering, dark current subtraction, binning, or the like. In embodiments, the pixel circuitry 1700 may have electrical connections to other circuitry within the QDPC 100, such as wherein other circuitry located in at least one of a second quantum dot pixel 1800, column circuitry, row circuitry, circuitry within the functional components 2004 of the QDPC 100, or other features 2204 within the integrated system 2200 of the QDPC 100, or the like. The design flexibility associated with pixel circuitry 1700 may provide for a wide range of product improvements and technological innovations.

Pixel circuitry 1700 within the quantum dot pixel 1800 may take a plurality of forms, ranging from no circuitry at all, just interconnecting electrodes, to circuitry that provides functions such as biasing, resetting, buffering, sampling, conversion, addressing, memory, and the like. In embodiments, electronics to condition or process the electrical signal may be located and configured in a plurality of ways. For instance, amplification of the signal may be performed at each pixel, group of pixels, at the end of each column or row, after the signal has been transferred off the array, just prior to when the signal is to be transferred off the chip 2000, or the like. In another instance, analog-to-digital conversion may be provided at each pixel, group of pixels, at the end of each column or row, within the chip's 2000 functional components 2004, after the signal has been transferred off the chip 2000, or the like. In addition, processing at any level may be performed in steps, where a portion of the processing is performed in one location and a second portion of the processing is performed in another location. An example may be the performing analog-to-digital conversion in two steps, say with an analog combining at the pixel 1800 and a higher-rate analog-to-digital conversion as a part of the chip's 2000 functional components 2004.

In embodiments, different electronic configurations may require different levels of post-processing, such as to compensate for the fact that every pixel has its own calibration level associated with each pixel's readout circuit. The QDPC 100 may be able to provide the readout circuitry at each pixel with calibration, gain-control, memory functions, and the like. Because of the QDPC's 100 highly integrated structure, circuitry at the quantum dot pixel 1800 and chip 2000 level may be available, which may enable the QDPC 100 to be an entire image sensor system on a chip. In some embodiments, the QDPC 100 may also be comprised of a quantum dot material 200 in combination with conventional semiconductor technologies, such as CCD and CMOS.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout.

In embodiments, the biasing of the photodetector may be time invariant or time varying. Varying space and time may reduce cross-talk, and enable a shrinking the quantum dot pixel 1800 to a smaller dimension, and require connections between quantum dot pixels 1800. Biasing could be implemented by grounding at the corner of a pixel 1800 and dots in the middle. Biasing may occur only when performing a read, enabling either no field on adjacent pixels 1800, forcing the same bias on adjacent pixels 1800, reading odd columns first then the even columns, and the like. Electrodes and/or biasing may also be shared between pixels 1800. Biasing may be implemented as a voltage source or as a current source. Voltage may be applied across a number of pixels, but then sensed individually, or applied as a single large bias across a string of pixels 1800 on a diagonal. The current source may drive a current down a row, then read it off across the column. This may increase the level of current involved, which may decrease read noise levels.

In embodiments, configuration of the field, by using a biasing scheme or configuration of voltage bias, may produce isolation between pixels. Currently may flow in each pixel so that only electron-hole pairs generated in that volume of pixel flow within that pixel. This may allow electrostatically implemented inter-pixel isolation and cross-talk reduction, without physical separation. This could break the linkage between physical isolation and cross-talk reduction.

In embodiments, the pixel circuitry 1700 may include circuitry for pixel readout. Pixel readout may involve circuitry that reads the signal from the quantum dot material 200 and transfers the signal to other components 1900, chip functional components 2004, to the other features 2204 of the integrated system 2200, or to other off-chip components. Pixel readout circuitry may include quantum dot material 200 interface circuitry, such as 3T and 4T circuits, for example. Pixel readout may involve different ways to readout the pixel signal, ways to transform the pixel signal, voltages applied, and the like. Pixel readout may require a number of metal contacts with the quantum dot material 200, such as 2, 3, 4, 20, or the like. In embodiments, pixel readout may involve direct electrical communication between the optically sensitive material and a pixel electrode, charge store, or pinned diode, without an intervening metal being present between said optically sensitive material and said pixel electrode, charge store, or pinned diode.

These electrical contacts may be custom configured for size, degree of barrier, capacitance, and the like, and may involve other electrical components such a Schottky contact. Pixel readout time may be related to how long the radiation 1000-induced electron-hole pair lasts, such as for milliseconds or microseconds. In embodiments, this time my be associated with quantum dot material 200 process steps, such as changing the persistence, gain, dynamic range, noise efficiency, and the like.

Figure 17A:
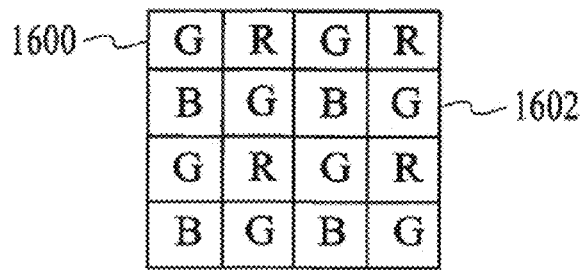
FIG. 17A shows a Bayer filter pattern.
Figure 17B:
FIG. 17B-17F show examples of some alternative pixel layouts.
Figure 17C:
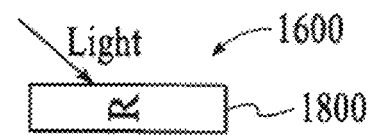
Figure 17D:
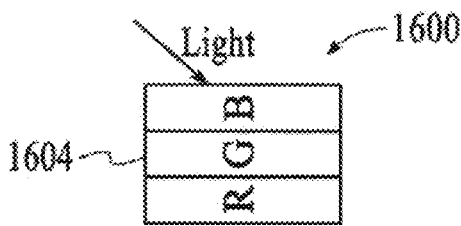
Figure 17E:
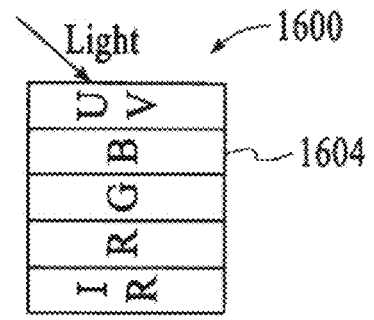
Figure 17F:
Figure 17G:
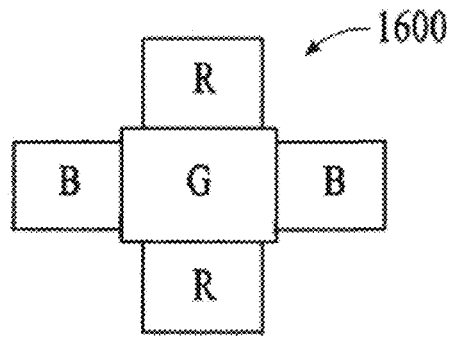
FIG. 17G-17L show pixels of different sizes, layouts and types used in pixel layouts.
Figure 17H:
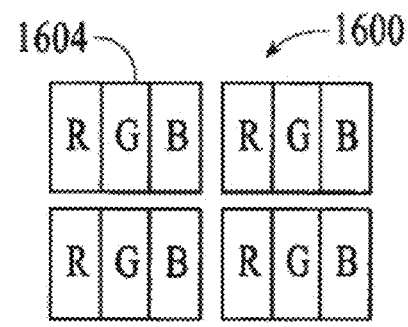
Figure 17I:
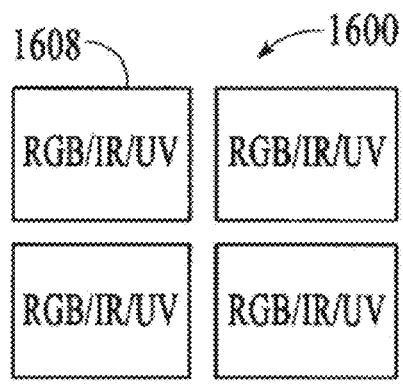
Figure 17J:
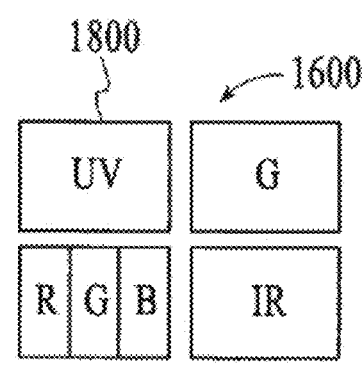
Figure 17K:
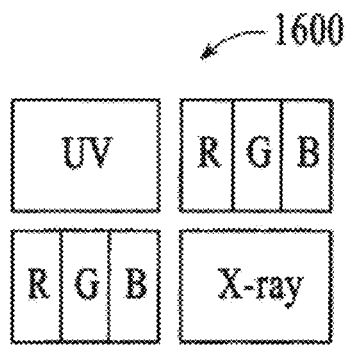
Figure 17L:
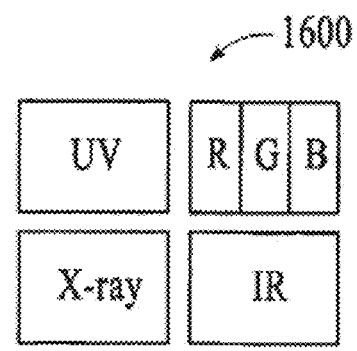
Figure 17M:
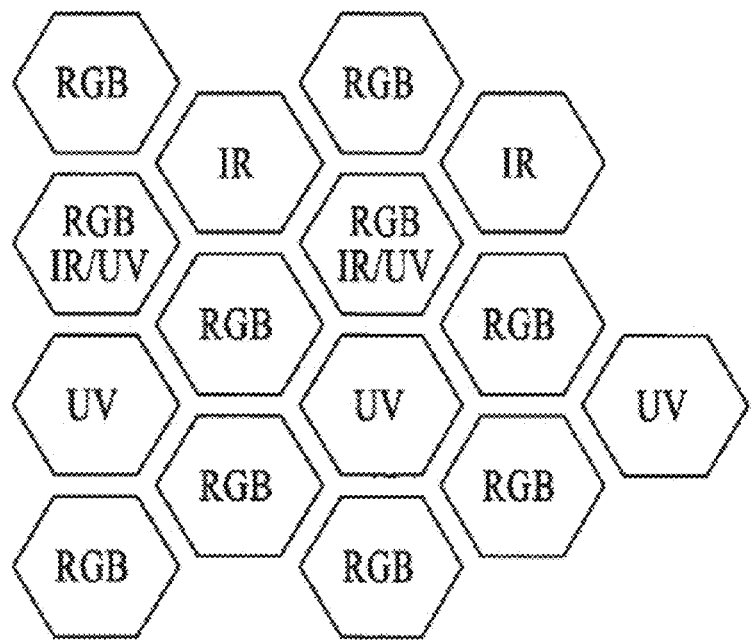
FIG. 17M shows pixel layouts with different shapes, such as hexagons.
Figure 17N:
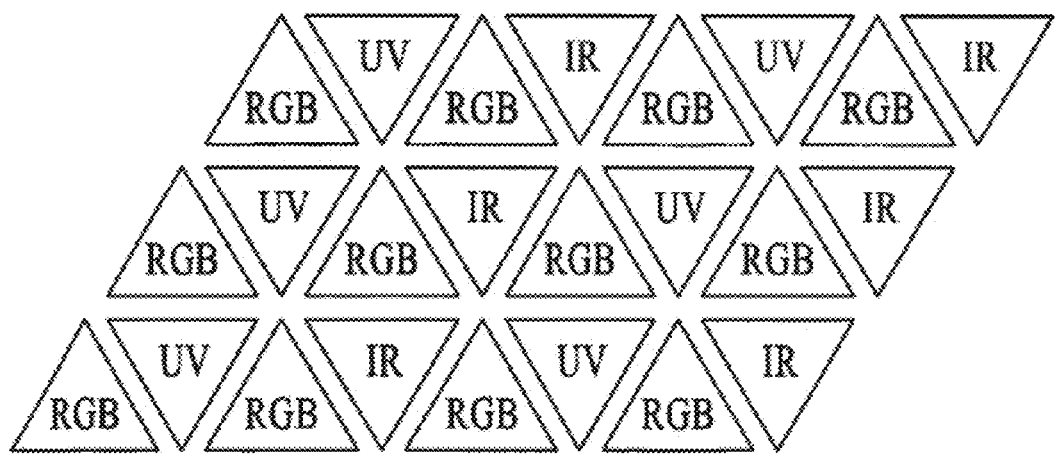
FIG. 17N shows pixel layouts with different shapes, such as triangles.
Figure 17O:
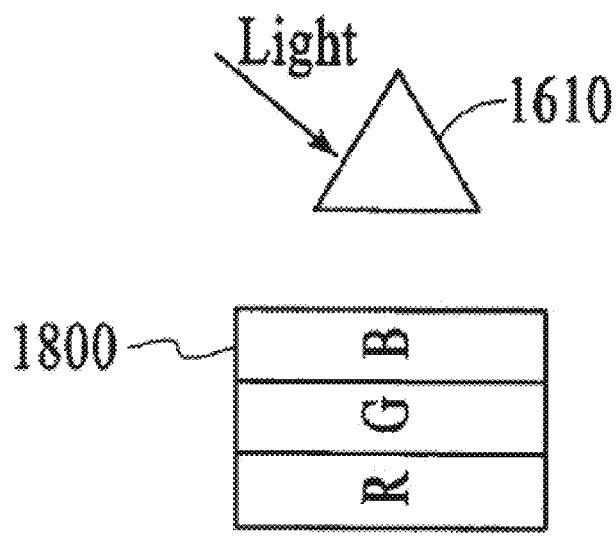
FIG. 17O shows a quantum dot pixel, such as a multispectral quantum dot pixel or other pixel, provided in association with an optical element.
Figure 17P:
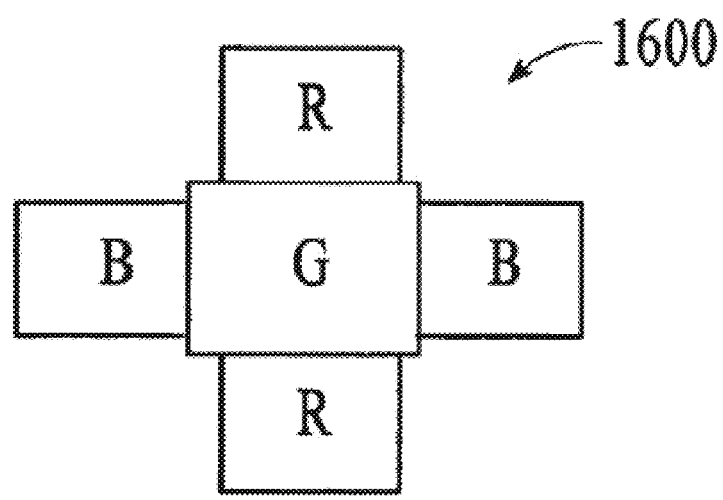
FIG. 17P shows an example of a pixel layout.

The quantum dot pixels 1800 described herein can be arranged in a wide variety of pixel layouts 1600. Referring to FIGS. 17A through 17P for example, a conventional pixel layout 1600, such as the Bayer filter layout 1602, includes groupings of pixels disposed in a plane, which different pixels are sensitive to radiation 1000 of different colors. In conventional image sensors, such as those used in most consumer digital cameras, pixels are rendered sensitive to different colors of radiation 1000 by the use of color filters that are disposed on top of an underlying photodetector, so that the photodetector generates a signal in response to radiation 1000 of a particular range of frequencies, or color. In this configuration, mosaic of different color pixels is referred to often as a color filter array, or color filter mosaic. Although different patterns can be used, the most typical pattern is the Bayer filter pattern 1602 shown in FIG. 17A, where two green pixels, one red pixel and one blue pixel are used, with the green pixels (often referred to as the luminance-sensitive elements) positioned on one diagonal of a square and the red and blue pixels (often referred to as the chrominance-sensitive elements) are positioned on the other diagonal. The use of a second green pixel is used to mimic the human eye's sensitivity to green light. Since the raw output of a sensor array in the Bayer pattern consists of a pattern of signals, each of which corresponds to only one color of light, demosaicing algorithms are used to interpolate red, green and blue values for each point. Different algorithms result in varying quality of the end images. Algorithms may be applied by computing elements on a camera or by separate image processing systems located outside the camera. Quantum dot pixels may be laid out in a traditional color filter system pattern such as the Bayer RGB pattern; however, other patterns may also be used that are better suited to transmitting a greater amount of light, such as Cyan, Magenta, Yellow (CMY). Red, Green, Blue (RGB) color filter systems are generally known to absorb more light than a CMY system. More advanced systems such as RGB Cyan or RGB Clear can also be used in conjunction with Quantum dot pixels.

In one embodiment, the quantum dot pixels 1800 described herein are configured in a mosaic that imitates the Bayer pattern 1602; however, rather than using a color filter, the quantum dot pixels 1800 can be configured to respond to radiation 1000 of a selected color or group of colors, without the use of color filters. Thus, a Bayer pattern 1602 under an embodiment includes a set of green-sensitive, red-sensitive and blue-sensitive quantum dot pixels 1800. Because, in embodiments, no filter is used to filter out different colors of radiation 1000, the amount of radiation 1000 seen by each pixel is much higher.

The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/106,256, entitled "Materials, Systems and Methods for Optoelectronic Devices," filed Apr. 18, 2008 (U.S. Published Patent Application No. 2009/0152664) includes additional descriptions of optoelectronic devices, systems and materials that may be used in connection with example embodiments and is hereby incorporated herein by reference in its entirety. This is an example embodiment only and other embodiments may use different photodetectors and photosensitive materials. For example, embodiments may use silicon or Gallium Arsenide (GaAs) photodetectors.

In example embodiments, an image sensor may be provided with a large number of pixel elements to provide high resolution. For example, an array of 4, 6, 8, 12, 24 or more megapixels may be provided.

The use of such large numbers of pixel elements, combined with the desirability of producing image sensor integrated circuits having small areas such as diagonal dimensions of order ⅓ inch or ¼ inch, entails the use of small individual pixels. Desirable pixel geometries include, for example, 1.75 µm linear side dimensions, 1.4 µm linear side dimensions, 1.1 µm linear side dimensions, 0.9 µm linear side dimensions, 0.8 µm linear side dimensions, and 0.7 µm linear side dimensions.

Embodiments include systems that enable a large fill factor by ensuring that 100%, or nearly 100%, of the area of each pixel includes an optically sensitive material on which incident light of interest in imaging is substantially absorbed. Embodiments include imaging systems that provide a large chief ray acceptance angle. Embodiments include imaging systems that do not required microlenses. Embodiments include imaging systems that are less sensitive to the specific placement of microlenses (microlens shift) in view of their increased fill factor. Embodiments include highly sensitive image sensors. Embodiments include imaging systems in which a first layer proximate the side of optical incidence substantially absorbs incident light; and in which a semiconductor circuit that may included transistors carriers out electronic read-out functions.

Embodiments include optically sensitive materials in which the absorption is strong, i.e., the absorption length is short, such as an absorption length (1/alpha) less than 1 um. Embodiments include image sensor comprising optically sensitive materials in which substantially all light across the visible wavelength spectrum, including out to the red ~630 nm, is absorbed in a thickness of optically sensitive material less than approximately 1 micrometer.

Embodiments include image sensors in which the lateral spatial dimensions of the pixels are approximately 2.2 µm, 1.75 µm, 1.55 µm, 1.4 µm, 1.1 µm, 900 nm, 700 nm, 500 nm; and in which the optically sensitive layer is less than 1 µm and is substantially absorbing of light across the spectral range of interest (such as the visible in example embodiments); and in which crosstalk (combined optical and electrical) among adjacent pixels is less than 30%, less than 20%, less than 15%, less than 10%, or less than 5%.

Embodiments include pixel circuits, functioning in combination with an optically sensitive material, in which at least one of dark current, noise, photoresponse nonuniformity, and dark current nonuniformity are minimized through the means of integrating the optically sensitive material with the pixel circuit.

Embodiments include integration and processing approaches that are achieved at low additional cost to manufacture, and can be achieved (or substantially or partially achieved) within a CMOS silicon fabrication foundry.

Figure 19A:
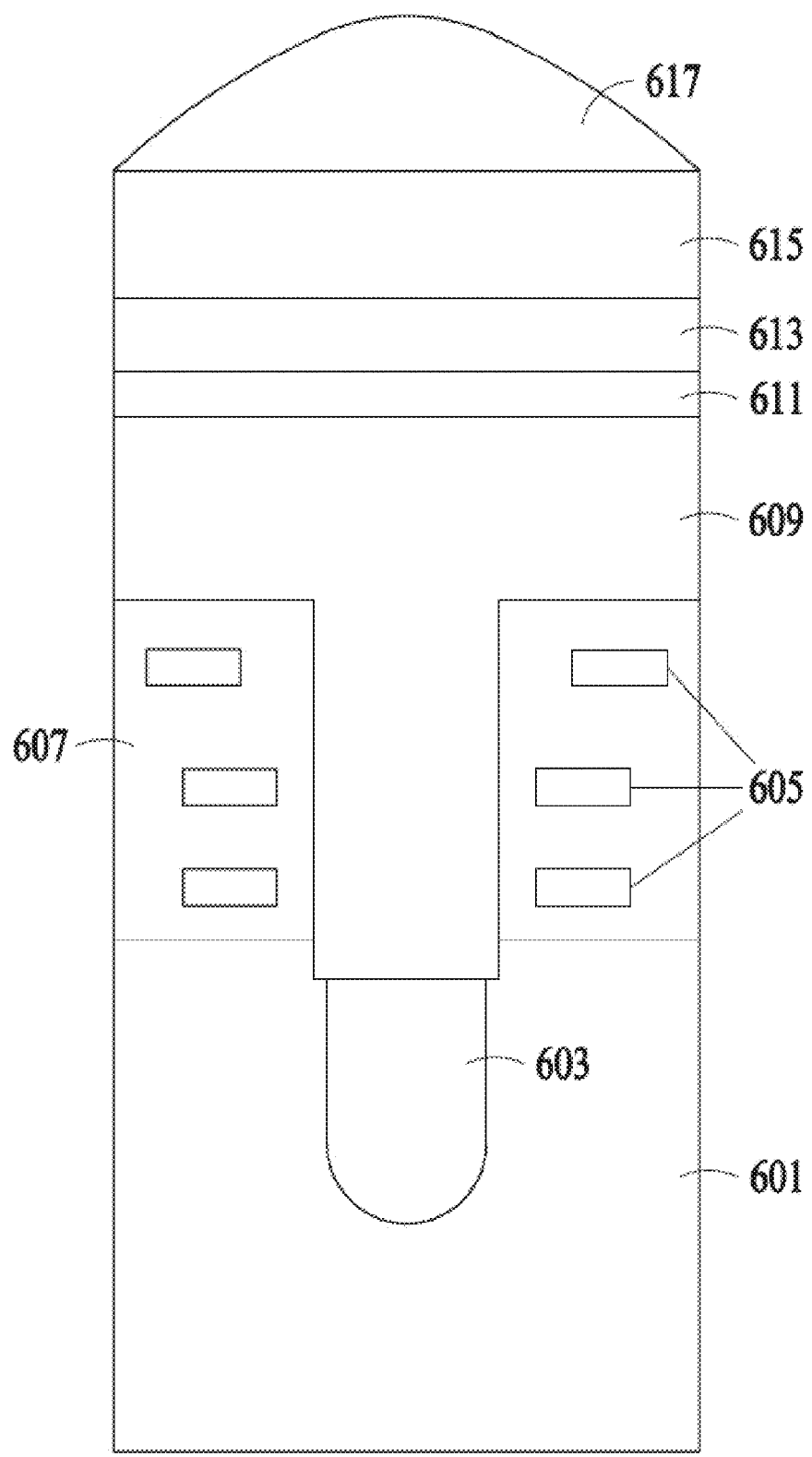
FIGS. 19A, 19B, and 19C present a cross-section of a CMOS image sensor pixel in which an optically sensitive material has been integrated in intimate contact with the silicon diode.

FIG. 19A depicts a front-side illuminated CMOS image sensor pixel in which an optically sensitive material has been integrated in intimate contact with the silicon diode. 601 depicts a silicon substrate on which the image sensor is fabricated. 603 depicts a diode formed in silicon. 605 is the metal interconnect and 607 is the interlayer dielectric stack that serves to provide communication of electrical signals within and across the integrated circuit. 609 is an optically sensitive material that is the primary location for the absorption of light to be imaged. 611 is a transparent electrode that is used to provide electrical biasing of the optically sensitive material to enable photocarrier collection from it. 613 is a passivation layer that may consist of at least one of an organic or polymer encapsulant (such as parylene) or an inorganic such as Si3N4 or a stack incorporating combinations thereof. 613 serves to protect the underlying materials and circuits from environmental influences such as the impact of water or oxygen. 615 is a color filter array layer that is a spectrally-selective transmitter of light used in aid of achieving color imaging. 617 is a microlens that aids in the focusing of light onto 609 the optically sensitive material.

Referring to FIG. 19A, in embodiments, photocurrent generated in 609 the optically sensitive material due to illumination may be transferred, with high efficiency, from the sensitizing material 609 to the diode '2.' Since most incident photons will be absorbed by the sensitizing material '5', the diode 603 no longer needs serve the predominant photodetection role. Instead its principal function is to serve as diode that enables maximal charge transfer and minimal dark current.

Referring to FIG. 19A, the diode 603 may be pinned using the sensitizing material 609 at its surface. The thickness of the sensitizing material 609 may be approximately 500 nm, and may range from 100 nm to 5 um. In embodiments, a p-type sensitizing material 609 may be employed for the light conversion operation and for depleting an n-type silicon diode 603. The junction between the sensitizing material 609 and the silicon diode 603 may be termed a p-n heterojunction in this example.

Referring to FIG. 19A, in the absence of an electrical bias, the n-type silicon 603 and p-type sensitizing material 609 reach equilibrium, i.e., their Fermi levels come into alignment. In an example embodiment, the resultant band-bending produce a built-in potential in the p-type sensitizing material 609 such that a depletion region is formed therein. Upon the application of an appropriate bias within the silicon circuitry (this potential difference applied, for example, via the difference between 611 and 603 in FIG. 19A), the amplitude of this potential is augmented by an applied potential, resulting in a deepening of the depletion region that reaches into the p-type sensitizing material 609. The resultant electrical field results in the extraction of photoelectrons from the sensitizing material 609 into the n+ silicon layer 603. Biasing and doping in the silicon 603 achieve the collection of the photoelectrons from the sensitizing layer 609, and can achieve fully depletion of the n-type silicon 603 under normal bias (such as 3 V, with a normal range of 1V to 5V). Holes are extracted through a second contact (such as 611 in FIG. 19A) to the sensitizing layer 609.

Referring to FIG. 19A, in the case of a vertical device, the contact 611 may be formed atop the sensitizing material 609.

Figure 19B:
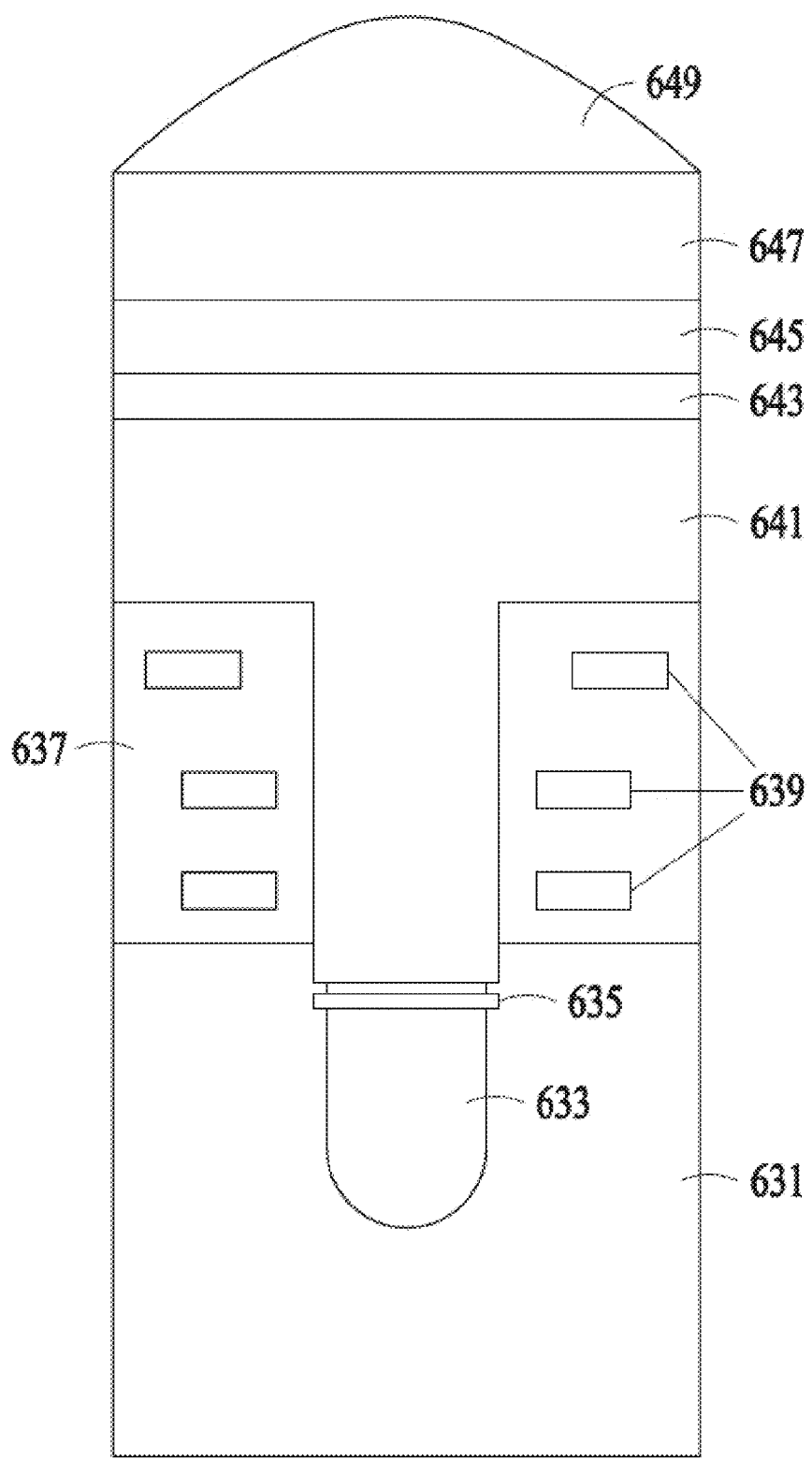

FIG. 19B depicts a front-side illuminated CMOS image sensor pixel in which an optically sensitive material has been integrated in intimate contact with the silicon diode. 631 depicts a silicon substrate on which the image sensor is fabricated. 633 depicts a diode formed in silicon. 639 is the metal interconnect and 637 the interlayer dielectric stack that serves to provide communication of electrical signals within and across the integrated circuit. 641 is an optically sensitive material that is the primary location for the absorption of light to be imaged. 643 is a transparent electrode that is used to provide electrical biasing of the optically sensitive material to enable photocarrier collection from it. 645 is a passivation layer that may consist of at least one of an organic or polymer encapsulant (such as parylene) or an inorganic such as Si3N4 or a stack incorporating combinations thereof. 645 serves to protect the underlying materials and circuits from environmental influences such as the impact of water or oxygen. 647 is a color filter array layer that is a spectrally-selective transmitter of light used in aid of achieving color imaging. 649 is a microlens that aids in the focusing of light onto 641 the optically sensitive material. 635 is a material that resides between the optically sensitive material 641 and the diode 633. 635 may be referred to as an added pinning layer. Example embodiments include a p-type silicon layer. Example embodiments include a non-metallic material such as a semiconductor and/or it could include polymer and/or organic materials. In embodiments, material 635 may provide a path having sufficient conductivity for charge to flow from the optically sensitive material to the diode, but would not be metallic interconnect. In embodiments, 635 serves to passivate the surface of the diode and create the pinned diode in this example embodiment (instead of the optically sensitive material, which would be on top of this additional layer).

Figure 19C:
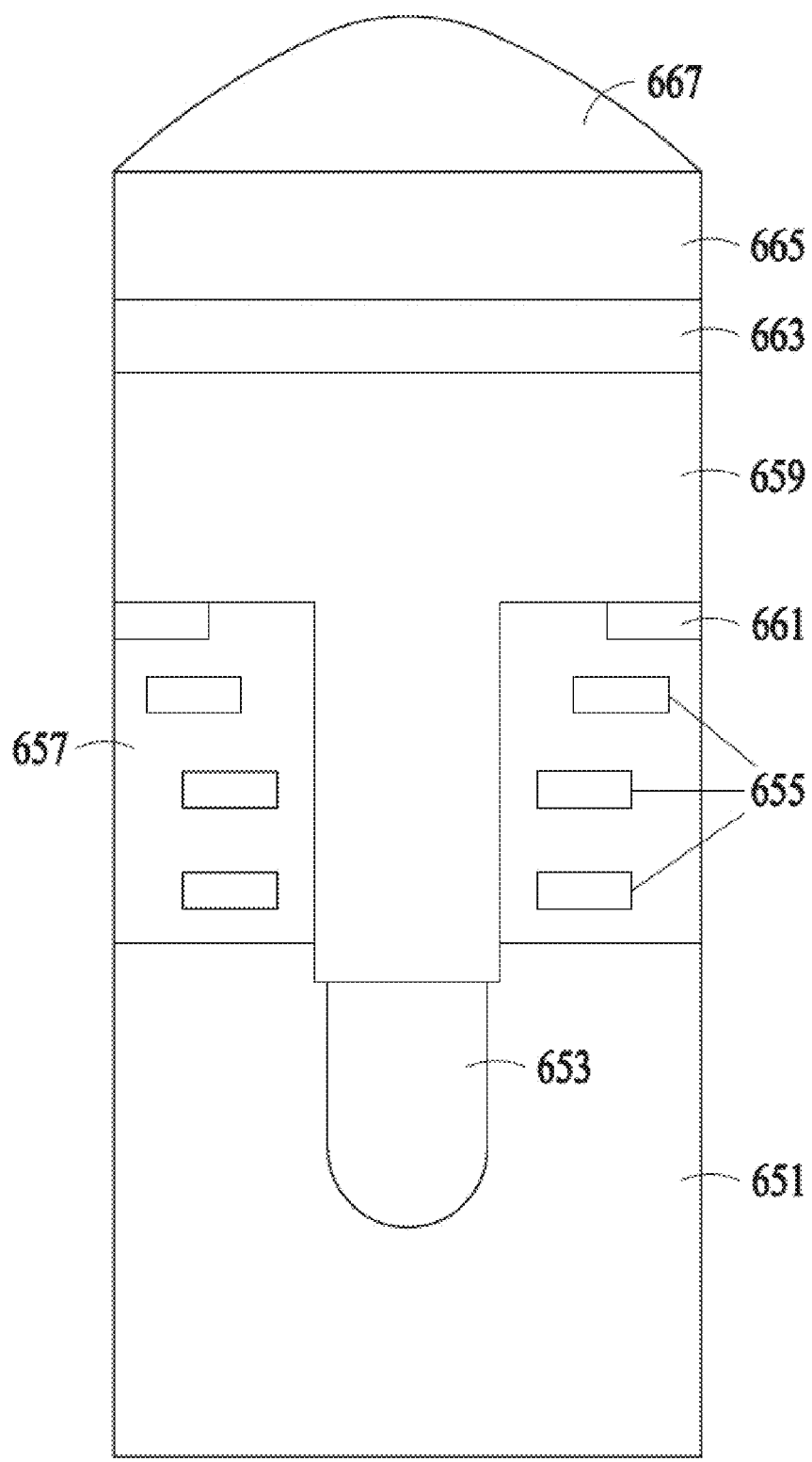

Referring to FIG. 19C, a substantially lateral device may be formed wherein an electrode atop the silicon 661 that resides beneath the sensitizing material 659 may be employed. In embodiments, the electrode 661 may be formed using metals or other conductors such as TiN, TiOxNy, Al, Cu, Ni, Mo, Pt, PtSi, or ITO.

Referring to FIG. 19C, a substantially lateral device may be formed wherein the p-doped silicon 661 that resides beneath the sensitizing material 659 may be employed for biasing.

Example embodiments provide image sensors that use an array of pixel elements to detect an image. The pixel elements may include photosensitive material, also referred to herein as the sensitizing material, corresponding to 609 in FIG. 19A, 641 in FIG. 19B, 659 in FIG. 19C, 709 in FIG. 19A, the filled ellipse in FIG. 21 on which light 801 is incident, 903 in FIG. 22, 1003 in FIG. 23, and 1103 in FIGS. 24A through 24F.

FIG. 19C depicts a front-side illuminated CMOS image sensor pixel in which an optically sensitive material has been integrated in intimate contact with the silicon diode. In this embodiment the optically sensitive material is biased by the silicon substrate directly; as a result, in this embodiment, no transparent electrode is required on top. 651 depicts a silicon substrate on which the image sensor is fabricated. 653 depicts a diode formed in silicon. 655 is the metal interconnect and 657 the interlayer dielectric stack that serves to provide communication of electrical signals within and across the integrated circuit. 659 is an optically sensitive material that is the primary location for the absorption of light to be imaged. 661 points to an example region of the silicon substrate 651 that is used to provide electrical biasing of the optically sensitive material to enable photocarrier collection from it. 663 is a passivation layer that may consist of at least one of an organic or polymer encapsulant (such as parylene) or an inorganic such as Si3N4 or a stack incorporating combinations thereof. 663 serves to protect the underlying materials and circuits from environmental influences such as the impact of water or oxygen. 665 is a color filter array layer that is a spectrally-selective transmitter of light used in aid of achieving color imaging. 667 is a microlens that aids in the focusing of light onto 659 the optically sensitive material.

Figure 20A:
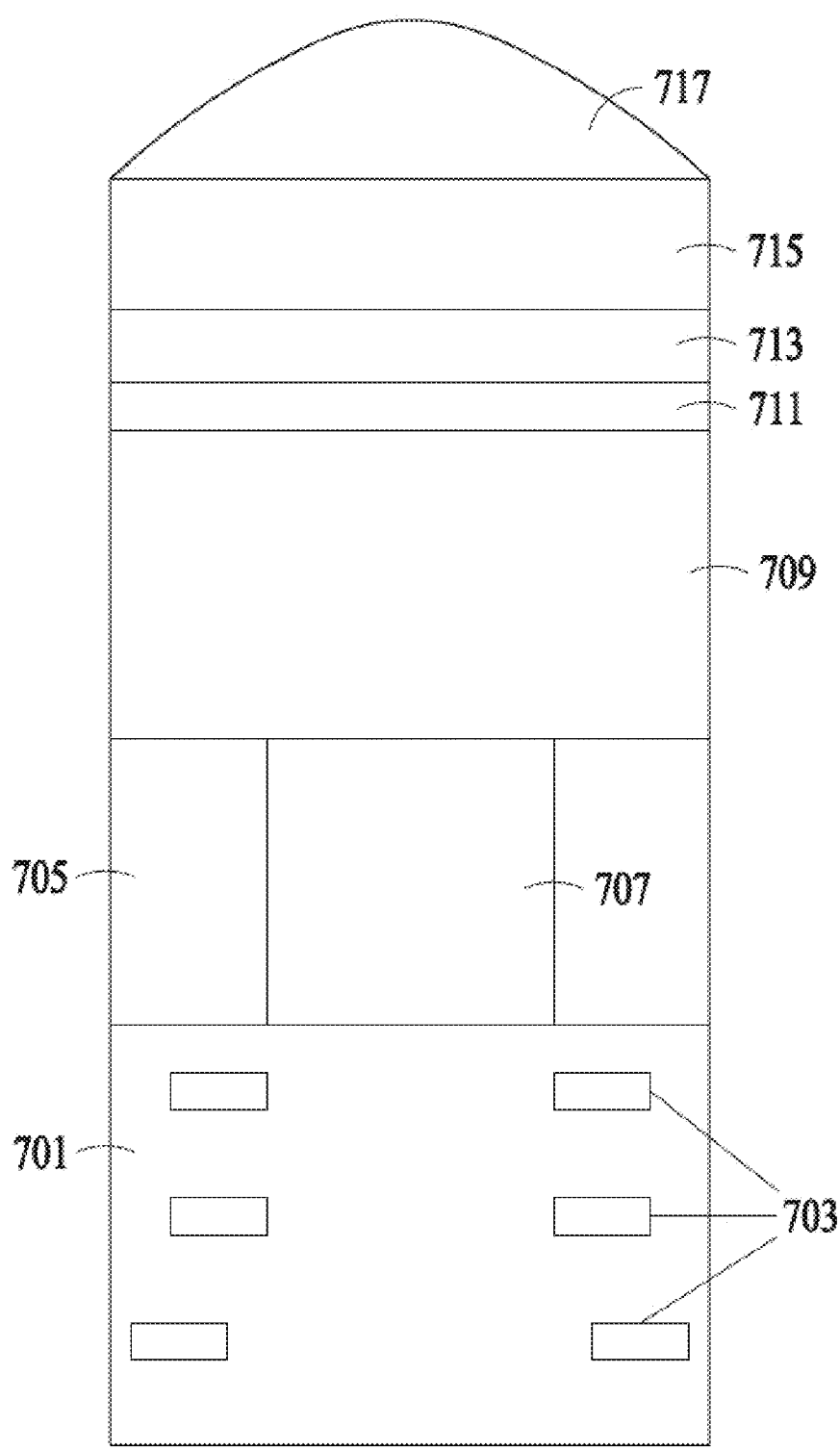
FIGS. 20A and 20B present cross-sections of a CMOS image sensor pixel in which an optically sensitive material has been integrated in intimate contact with the silicon photodiode.

FIG. 20A depicts a cross-section of a back-side illuminated CMOS image sensor pixel in which an optically sensitive material has been integrated in intimate contact with the silicon photodiode. 705 depicts a silicon substrate on which the image sensor is fabricated. 707 depicts a diode formed in silicon. 703 is the metal interconnect and 701 the interlayer dielectric stack that serves to provide communication of electrical signals within and across the integrated circuit. 709 is an optically sensitive material that is the primary location for the absorption of light to be imaged. 711 is a transparent electrode that is used to provide electrical biasing of the optically sensitive material to enable photocarrier collection from it. 713 is a passivation layer that may consist of at least one of an organic or polymer encapsulant (such as parylene) or an inorganic such as Si3N4 or a stack incorporating combinations thereof. 713 serves to protect the underlying materials and circuits from environmental influences such as the impact of water or oxygen. 715 is a color filter array layer that is a spectrally-selective transmitter of light used in aid of achieving color imaging. 717 is a microlens that aids in the focusing of light onto 709 the optically sensitive material.

Figure 20B:
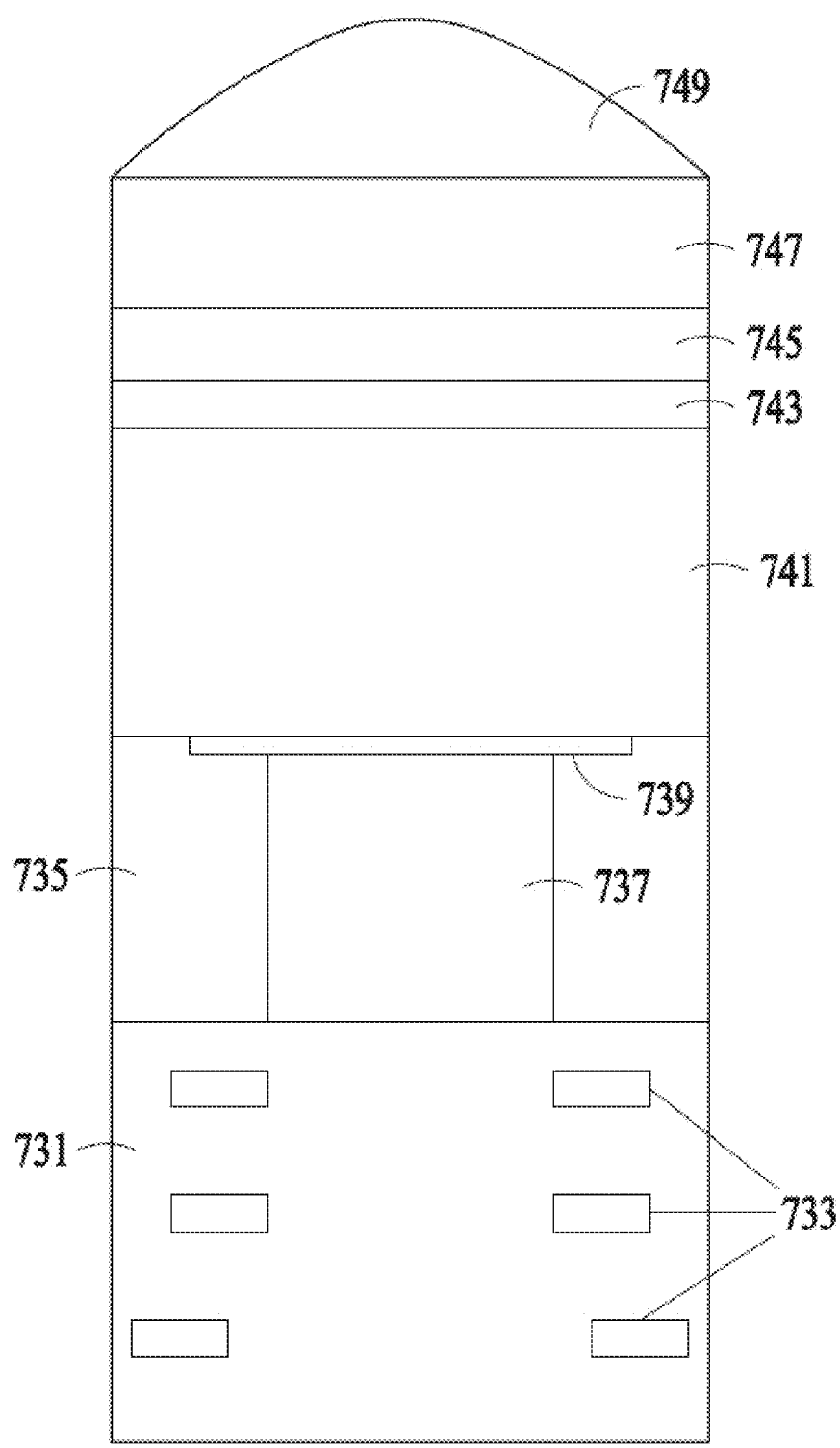

FIG. 20B depicts a cross-section of a back-side illuminated CMOS image sensor pixel in which an optically sensitive material has been integrated in intimate contact with the silicon photodiode. 735 depicts a silicon substrate on which the image sensor is fabricated. 737 depicts a diode formed in silicon. 733 is the metal interconnect and 731 the interlayer dielectric stack that serves to provide communication of electrical signals within and across the integrated circuit. 741 is an optically sensitive material that is the primary location for the absorption of light to be imaged. 743 is a transparent electrode that is used to provide electrical biasing of the optically sensitive material to enable photocarrier collection from it. 745 is a passivation layer that may consist of at least one of an organic or polymer encapsulant (such as parylene) or an inorganic such as Si3N4 or a stack incorporating combinations thereof. 745 serves to protect the underlying materials and circuits from environmental influences such as the impact of water or oxygen. 747 is a color filter array layer that is a spectrally-selective transmitter of light used in aid of achieving color imaging. 749 is a microlens that aids in the focusing of light onto '5' the optically sensitive material. 739 is a material that resides between the optically sensitive material 741 and the diode 737. 739 may be referred to as an added pinning layer. Example embodiments include a p-type silicon layer. Example embodiments include a non-metallic material such as a semiconductor and/or it could include polymer and/or organic materials. In embodiments, material 739 may provide a path having sufficient conductivity for charge to flow from the optically sensitive material to the diode, but would not be metallic interconnect. In embodiments, 739 serves to passivate the surface of the diode and create the pinned diode in this example embodiment (instead of the optically sensitive material, which would be on top of this additional layer).

Figure 21:
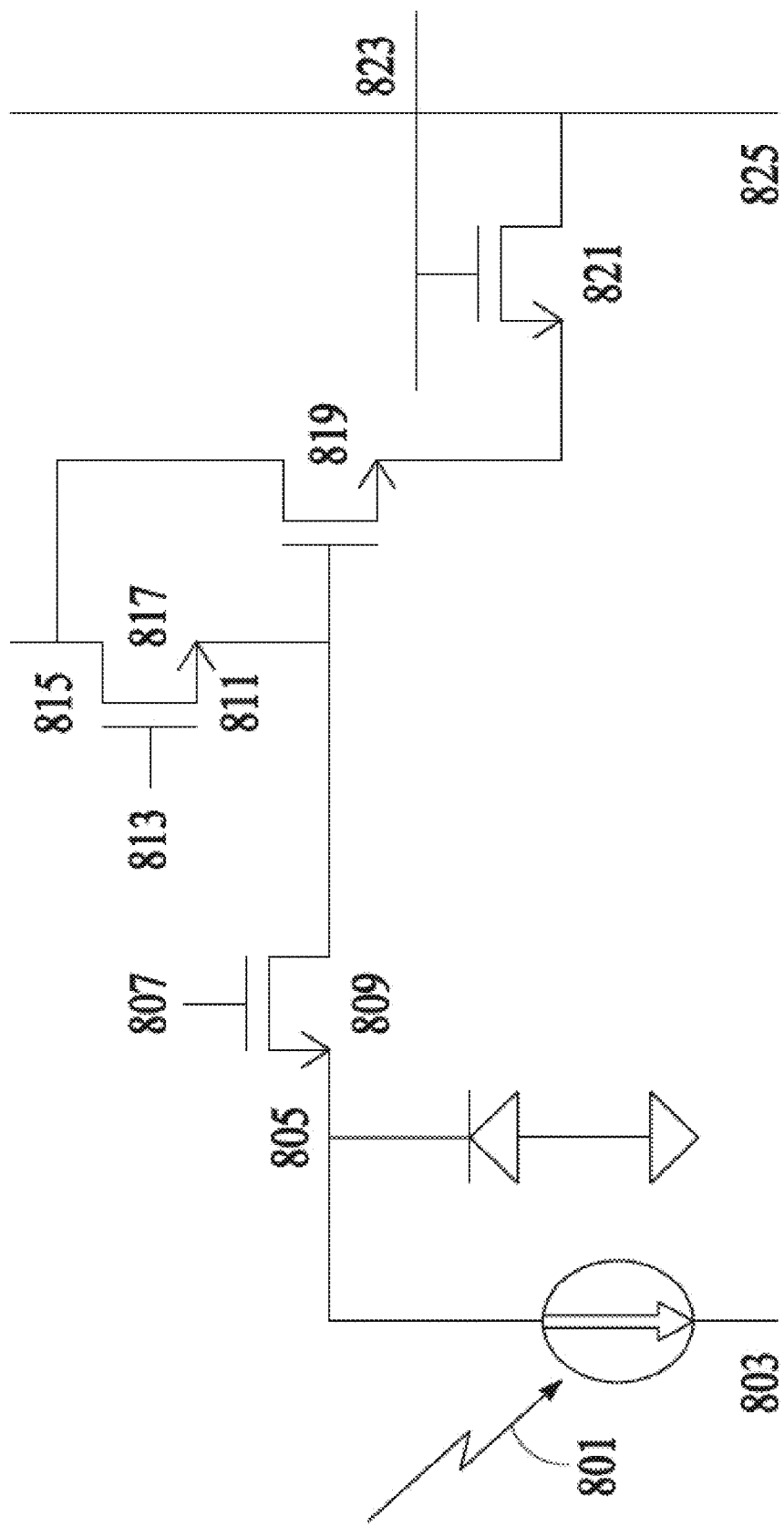
FIG. 21 is a circuit diagram showing a pixel which has been augmented with an optically sensitive material.

FIG. 21 is a circuit diagram for a back-side illuminated image sensor in which optically sensitive material is integrated to silicon chip from the back side. 801 depicts light illuminating the optically sensitive material (filled circle with downward-pointing arrow). 803 is an electrode that provides bias across the optically sensitive material. It corresponds to the top transparent electrode (711 of FIG. 20A) or to the region of the silicon substrate used to provide electrical biasing (743 of FIG. 20B). 805 is the silicon diode (corresponding to 603, 633, 653, 707, and 737 in FIGS. 6A, 6B, 6C, 7A, and 7B, respectively). 805 may also be termed the charge store. 805 may be termed the pinned diode. 807 is an electrode on the front side of silicon (metal), which ties to transistor gate of M1. 809 is the transistor M1, which separates the diode from sense node and the rest of the readout circuitry. The gate of this transistor is 807. A transfer signal is applied to this gate to transfer charge between the diode and the sense node 811. 811 is the sense node. It is separated from diode, allowing flexibility in the readout scheme. 813 is an electrode on the front side of silicon (metal), which ties to the transistor gate of M2. 815 is an electrode on the front side of silicon (metal), which ties to transistor drain of M2. 815 may be termed a reference potential. 815 can provide VDD for reset. 817 is the transistor M2, which acts as a reset device. It is used to initialize the sense node before readout. It is also used to initialize the diode before integration (when M1 and M2 are both turned on). The gate of this transistor is 813. A reset signal is applied to this gate to reset the sense node 811. 819 is transistor M3, which is used to read out the sense node voltage. 821 is transistor M4, which is used to connect the pixel to the readout bus. 823 is an electrode on the front side of silicon (metal), which ties to the gate of M4. When it is high, the pixel driving the readout bus vcol. 825 is the readout bus vcol. 801 and 803 and 805 reside within the backside of silicon. 807-825 reside within the frontside of silicon, including metal stack and transistors.

Referring to FIG. 21, the diagonal line is included to help describe the backside implementation. The transistors to the right of this line would be formed on the front side. The diode and optically sensitive material on the left would be on the back side. The diode would extend from the back side through the substrate and near to the front side. This allows a connection to be formed between the transistors on the front side to transfer charge from the diode to the sense node 811 of the pixel circuit.

Referring to FIG. 21, the pixel circuit may be defined as the set of all circuit elements in the figure, with the exception of the optically sensitive material. The pixel circuit includes the read-out circuit, the latter include a source follower transistor 819, row select transistor 821 with row select gate 823, and column read out 825.

Referring to FIG. 25, in embodiments, the pixel circuit may operate in the following manner.

A first reset (FIG. 25 at "A") is performed to reset the sense node (811 from FIG. 21) and the diode (805 from FIG. 21) prior to integration. Reset transistor (817 from FIG. 21) and charge transfer transistor (809 from FIG. 21) are open during the first reset. This resets the sense node (811 from FIG. 21) to the reference potential (for example 3 Volts). The diode is pinned to a fixed voltage when it is depleted. Said fixed voltage to which the diode is pinned may be termed the depletion voltage of the diode. The reset depletes the diode which resets its voltage (for example to 1 Volt). Since it is pinned, it will not reach the same voltage level as the sense node.

The charge transfer transistor (809 from FIG. 21) is then closed (FIG. 25 at "B") to start the integration period which isolates the sense node from the diode.

Charge is integrated (FIG. 25 at "C") from the optically sensitive material into the diode during the integration period of time. The electrode that biases the optically sensitive film is at a lower voltage than the diode (for example 0 Volts) so there is a voltage difference across the material and charge integrates to the diode. The charge is integrated through a non-metallic contact region between the material and the diode. In embodiments, this is the junction between the optically sensitive material and the n-doped region of the diode. In embodiments, there may reside other non-metallic layers (such as p-type silicon) between the optically sensitive material and the diode. The interface with the optically sensitive material causes the diode to be pinned and also passivates the surface of the n-doped region by providing a hole accumulation layer. This reduces noise and dark current that would otherwise be generated by silicon oxide formed on the top surface of the diode.

After the integration period, a second reset (FIG. 25 at "D") of the sense node occurs immediately prior to read out (the reset transistor is turned on while the diode remains isolated). This provides a known starting voltage for read out and eliminates noise/leakage introduced to the sense node during the integration period. The double reset process for pixel read out is referred to as true correlated double sampling.

The reset transistor is then closed and the charge transfer transistor is opened (FIG. 25 at "E") to transfer charge from the diode to the sense node which is then read out through the source follower and column line.

Referring to FIG. 19A, the use of the sensitizing material 609 may provide shorter absorption length than silicon's across the spectra range of interest. The sensitizing material may provide absorption lengths of 1 μm and shorter.

Referring to FIG. 19A, the high efficiency of photocarrier transfer from the sensitizing material 609 to a read-out integrated circuit beneath via diode 603 may be achieved.

Referring FIG. 19A, the system described may achieve a minimum of dark current and/or noise and/or photoresponse nonuniformity and/or dark current nonuniformity by integrating the optically sensitive material 609 with the silicon read-out circuit via diode 603.

Referring to FIG. 19A, examples of optically sensitive material 609 include dense thin films made of colloidal quantum dots. Constituent materials include PbS, PbSe, PbTe; CdS, CdSe, CdTe; $Bi_2S_3$, $In_2S_3$, $In_2Se_3$; SnS, SnSe, SnTe; ZnS, ZnSe, ZnTe. The nanoparticles may be in the range of 1 nm to 10 nm in diameter, and may be substantially monodispersed, i.e., may possess substantially the same size and shape. The materials may include organic ligands and/or crosslinkers to aid in surface passivation and of a length and conductivity that, combined, facilitate inter-quantum-dot charge transfer.

Referring to FIG. 19A, examples of optically sensitive material 609 include thin films made of organic materials that are strongly absorptive of light in some or all wavelength ranges of interest. Constituent materials include P3HT, PCBM, PPV, MEH-PPV, and copper phthalocyanine and related metal phthalocyanines.

Referring to FIG. 19A, examples of optically sensitive material 609 include thin films made of inorganic materials such as CdTe, copper indium gallium (di)selenide (CIGS), $Cu_2ZnSnS_4$ (CZTS), or III-V type materials such as AlGaAs.

Referring to FIG. 19A, optically sensitive material 609 may be directly integrated with a diode 603 in a manner that may, among other benefits, reduce dark currents. The direct integration of the optically sensitive material 609 with the silicon diode 603 may lead to reduced dark currents associated with interface traps located on the surface of a diode. This concept may enable substantially complete transfer of charge from the diode into a floating sense node, enabling true correlated double sample operation.

Referring to FIGS. 19A, 19B, and 19C, the respective sensitizing materials 609, 641, and 659 may be integrated with, and serve to augment the sensitivity and reduce the crosstalk of, a front-side-illuminated image sensor. Electrical connection is made between the sensitizing material 609, 641, and 659 and the respective diode 603, 633, and 653.

Referring to FIGS. 20A and 20B, the respective sensitizing materials 709 and 741 may be integrated with, and serve to augment the sensitivity and reduce the crosstalk of, a back-side-illuminated image sensor. Following the application and thinning of the second wafer atop a first, plus any further implants and surface treatments, a substantially planar silicon surface is presented. With this material may be integrated the sensitizing material materials 709 and 741.

The electrical biasing of the sensitizing material may be achieved substantially in the lateral or in the vertical direction.

Referring to FIG. 19A, which may be termed a substantially vertical biasing case, bias across the sensitizing material 609 is provided between the diode 603 and a top electrode 611. In this case the top electrode 611 is desired to be substantially transparent to the wavelengths of light to be sensed. Examples of materials that can be used to form top electrode 611 include MoO3, ITO, AZO, organic materials such as BPhen, and very thin layers of metals such as aluminum, silver, copper, nickel, etc.

Referring to FIG. 19B, which may be termed a substantially lateral, or coplanar, biasing case, bias across the sensitizing material 641 is provided between the diode 633 and silicon substrate electrode 639.

Referring to FIG. 19C, which may be termed partially lateral, partially vertical, biasing case, bias across the sensitizing material 659 is provided between the diode 653 and electrode 661.

Figure 22:
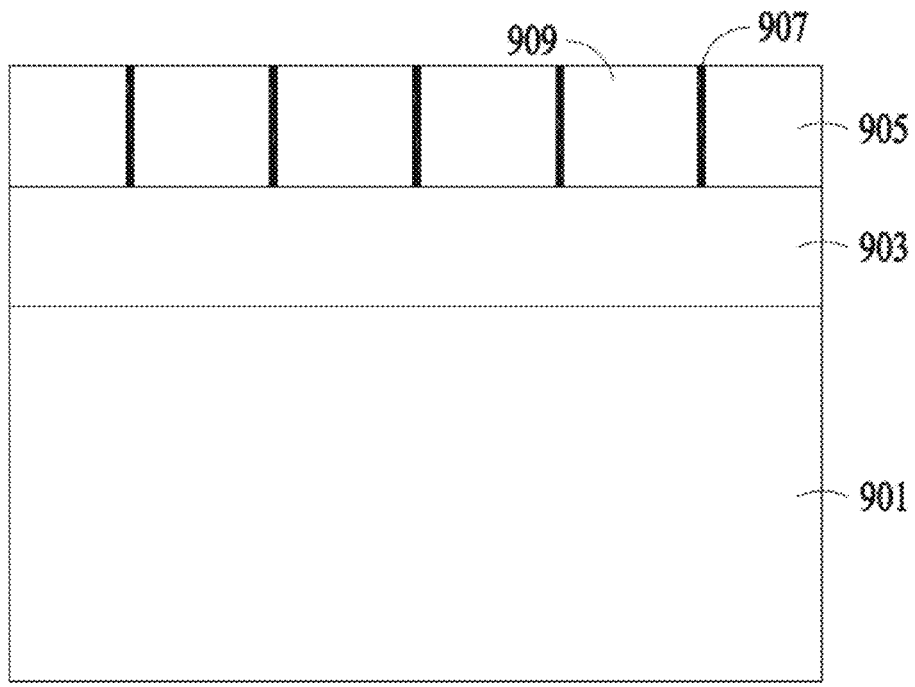
FIG. 22 is a cross-section depicting a means of reducing optical crosstalk among pixels by incorporating light-blocking layers in the color filter array or the passivation or the encapsulation or combinations thereof.

FIG. 22 depicts an image sensor device in cross-section. 901 is the substrate and may also include circuitry and metal and interlayer dielectric and top metal. 903 is a continuous photosensitive material that is contacted using metal in 901 and possibly in 905. 905 is transparent, or partially-transparent, or wavelength-selectively transparent, material on top of 903. 907 is an opaque material that ensures that light incident from the top of the device, and arriving at a non-normal angle of incidence onto region 905, is not transferred to adjacent pixels such as 909, a process that would, if it occurred, be known as optical crosstalk.

Figure 23:
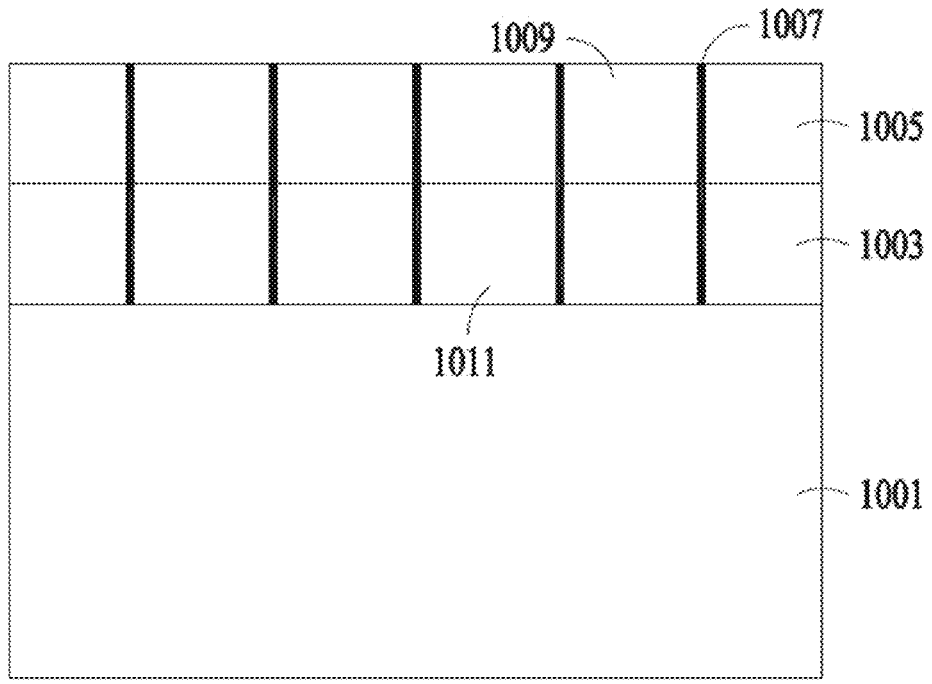
FIG. 23 is a cross-section depicting a means of reducing crosstalk among pixels by incorporating light-blocking layers in the color filter array or the passivation or the encapsulation or combinations thereof and also into the optically sensitive material.

FIG. 23 depicts an image sensor device in cross-section. 1001 is the substrate and may also include circuitry and metal and interlayer dielectric and top metal. 1003 is a photosensitive material that is contacted using metal in 1001 and possibly in 1005. 1005 is transparent, or partially-transparent, or wavelength-selectively transparent, material on top of 1003. 1007 is an opaque material that ensures that light incident from the top of the device, and arriving at a non-normal angle of incidence onto region 1005 and thence to 1003, is not transferred to adjacent pixels such as 1009 or 1011, a process that would, if it occurred, be known as optical or electrical or optical and electrical crosstalk.

Figure 24C:
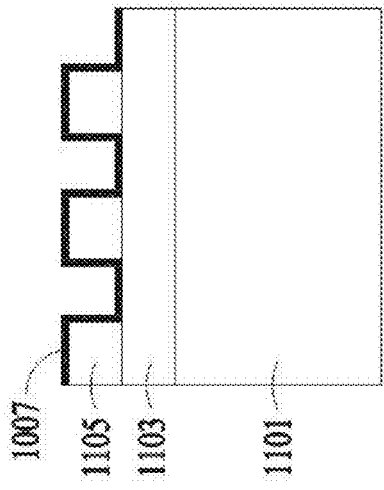
FIGS. 24A-24F are cross-sections depicting a means of fabricating an optical-crosstalk-reducing structure such as that shown in FIG. 22.
Figure 24B:
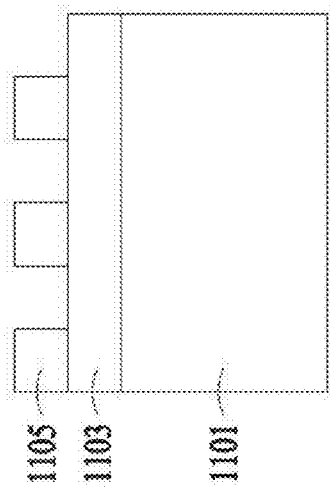
Figure 24A:
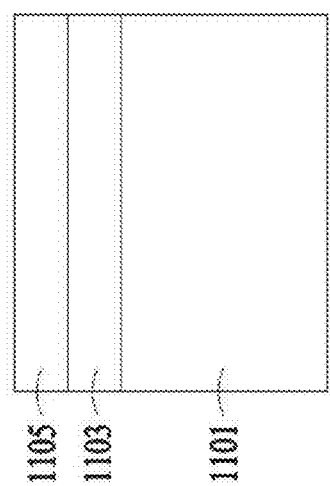
Figure 24F:
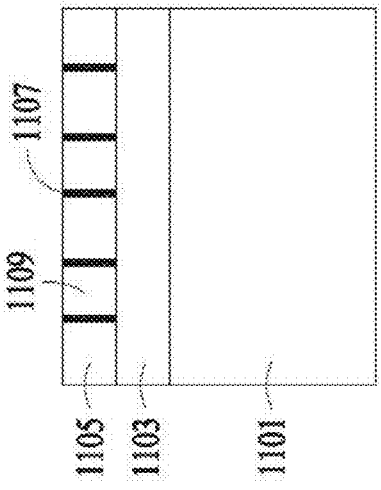
Figure 24E:
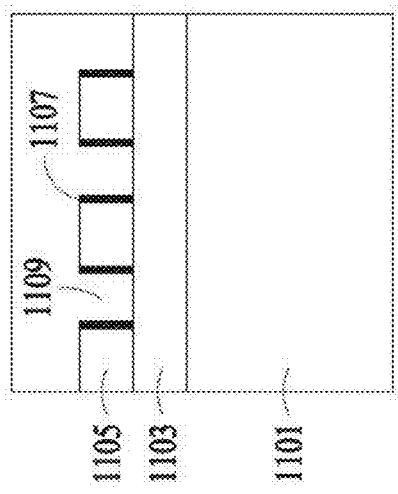
Figure 24D:
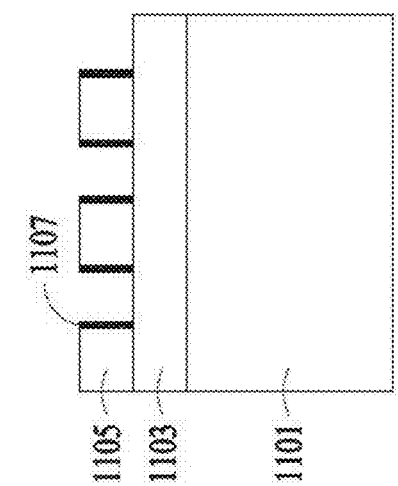

FIGS. 24A through 24F depict in cross-section a means of fabricating an optical-crosstalk-reducing structure such as that shown in FIG. 22. FIG. 24A depicts a substrate 1101 onto which is deposited an optically sensitive material 1103 and an ensuing layer or layers 1105 including as examples encapsulant, passivation material, dielectric, color filter array, microlens material, as examples. In FIG. 24B, layer 1105 has been patterned and etched in order to define pixellated regions. In FIG. 24C, a blanket of metal 1107 has been deposited over the structure shown in FIG. 24B. In FIG. 24D, the structure of FIG. 24C has been directionally etched such as to remove regions of metal from 1107 on horizontal surfaces, but leave it on vertical surfaces. The resulting vertical metal layers will provide light obscuring among adjacent pixels in the final structure. In FIG. 24E a further passivation/encapsulation/color/microlens layer or layers have been deposited 1109. In FIG. 24F, the structure has been planarized.

Referring again to FIG. 22, optical cross-talk between pixels may be reduced by deposition of a thin layer 907 (e.g., 10 nm to 20 nm depending on material) of a reflective material on a sidewall of the recess of the passivation layer between photosensitive layer 903 and color filter array (top portion of 905). Since the layer 905 is deposited on the sidewall, its minimum thickness is defined only by optical properties of the material, not by minimum critical dimension of the lithography process used.

In embodiments, a thin (e.g., 5 nm to 10 nm) dielectric transparent etch stop layer is deposited as a blanket film over an optically sensitive material. A thicker (e.g., 50 nm to 200 nm) also transparent dielectric passivation layer ($SiO_2$) is deposited over an etch stop layer. The checkerboard pattern the size of the pixel per unit is etched, the 10 nm aluminum metal layer is deposited over the topography using a conformal process (e.g., CVD, PECVD, ALD) and metal is removed from the bottom of the recessed parts of the pattern using directional (anisotropic) reactive ion plasma etch process. The recessed areas are filled with the same transparent passivation dielectric ($SiO_2$) and overfilled to provide sufficiently thick film to allow a planarization process, for example, either using Chemical Mechanical Polishing or Back Etch. Said processes remove excess $SiO_2$ and also residual metal film over horizontal surfaces. Similar processes can be applied for isolation of CFA or microlens layers.

Referring to FIG. 22, a vertical metal layer 907 may provide improved optical isolation between small pixels without substantial photoresponse loss.

Referring to FIG. 23, for optical isolation of pixels through the optically sensitive material 1003, the following structure and process may be employed. A hard mask protective pattern is formed on the surface of optically sensitive material using high-resolution lithography techniques such as double-exposure or imprint technology. The mask forms a grid with the minimum dimensions (for example, 22 nm or 16 nm width). Exposed photosensitive material is etched using anisotropic reactive ion plasma etch process thru all or a major part of the photosensitive layer. The formed recess is filled with, for example, a) one or more dielectric materials with the required refractive index to provide complete internal reflection of photons back into the pixel or b) exposed photosensitive material is oxidized to form an electrical isolation layer about 1-5 nm thick on sidewalls of the recess and the remaining free space is filled with the reflective metal material such as aluminum using, for example, conventional vacuum metallization processes. The residual metal on the surface of photosensitive material is removed either by wet or dry etching or by mechanical polishing.

Figure 26:
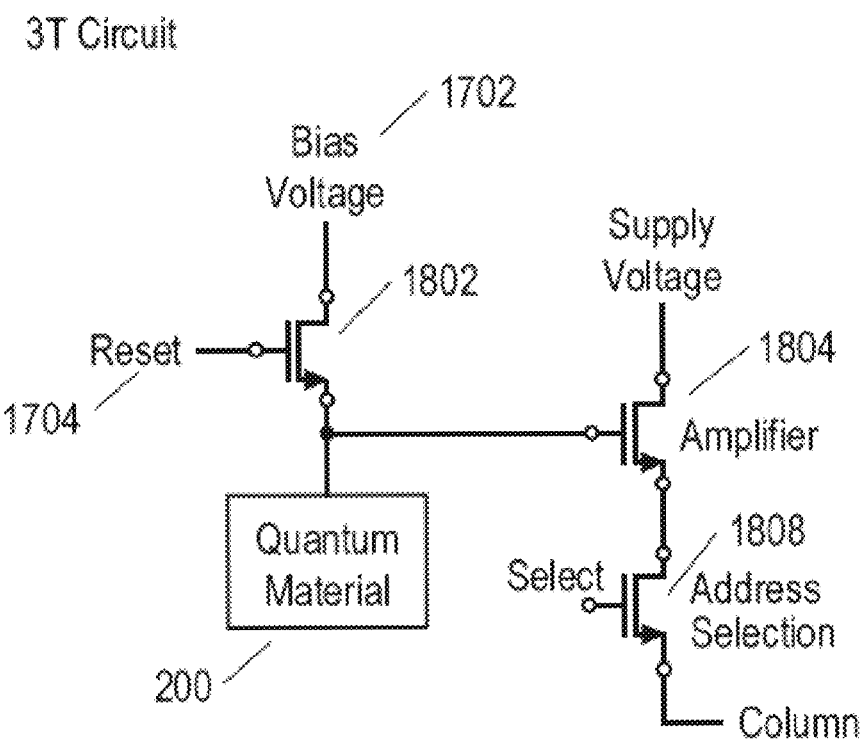
FIG. 26 illustrates a 3T transistor configuration for interfacing with the quantum dot material.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout. One embodiment of a pixel circuit shown in FIG. 26 uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the photoconductive photovoltaic quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit. In example, embodiments, additional circuitry may be added for film binning or circuit binning.

Figure 27:
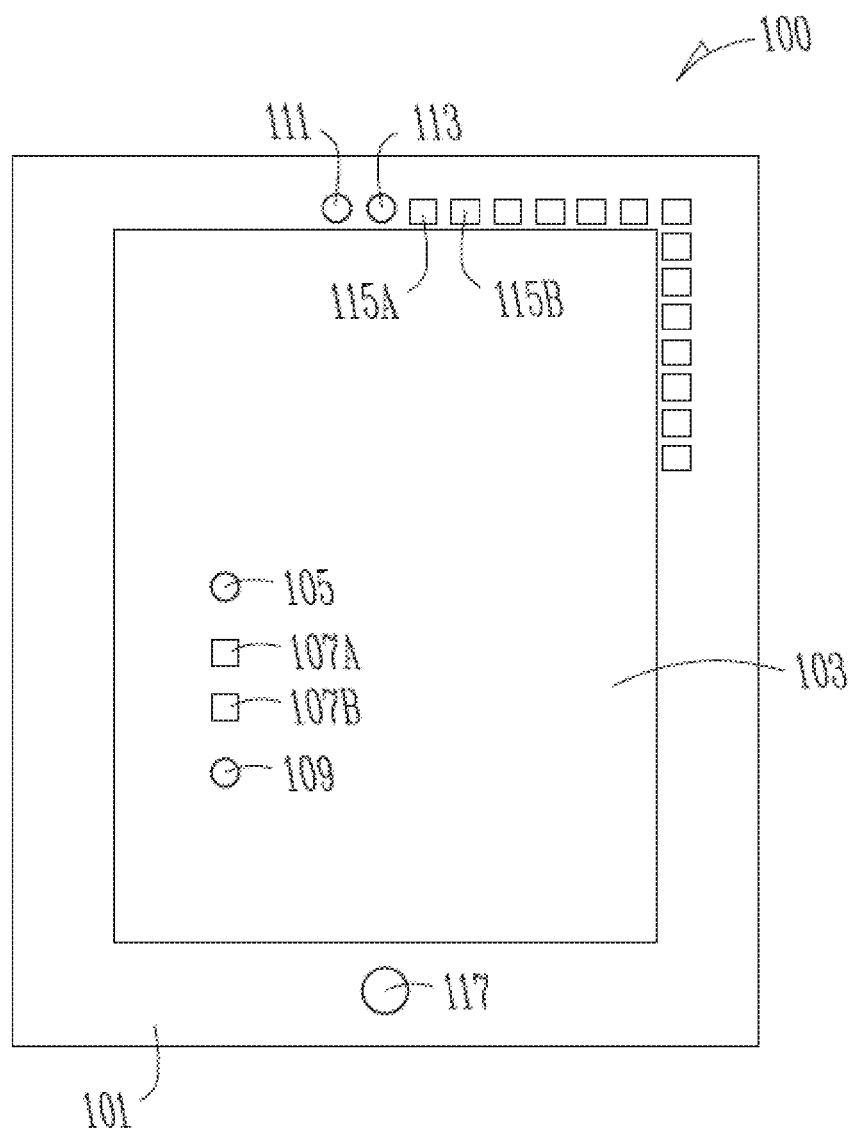

FIG. 27 shows an embodiment of a single-plane computing device 100 that may be used in computing, communication, gaming, interfacing, and so on. The single-plane computing device 100 is shown to include a peripheral region 101 and a display region 103. A touch-based interface device 117, such as a button or touchpad, may be used in interacting with the single-plane computing device 100.

An example of a first camera module 113 is shown to be situated within the peripheral region 101 of the single-plane computing device 100 and is described in further detail, below. Example light sensors 115A, 115B are also shown to be situated within the peripheral region 101 of the single-plane computing device 100 and are described in further detail, below, with reference to FIG. 30. An example of a second camera module 105 is shown to be situated in the display region 103 of the single-plane computing device 100 and is described in further detail, below, with reference to FIG. 29.

Examples of light sensors 107A, 107B, shown to be situated in the display region 103 of the single-plane computing device 100 and are described in further detail, below, with reference to FIG. 30. An example of a first source of optical illumination 111 (which may be structured or unstructured) is shown to be situated within the peripheral region 101 of the single-plane computing device 100. An example of a second source of optical illumination 109 is shown to be situated in the display region 103.

In embodiments, the display region 103 may be a touch-screen display. In embodiments, the single-plane computing device 100 may be a tablet computer. In embodiments, the single-plane computing device 100 may be a mobile handset.

Figure 28:
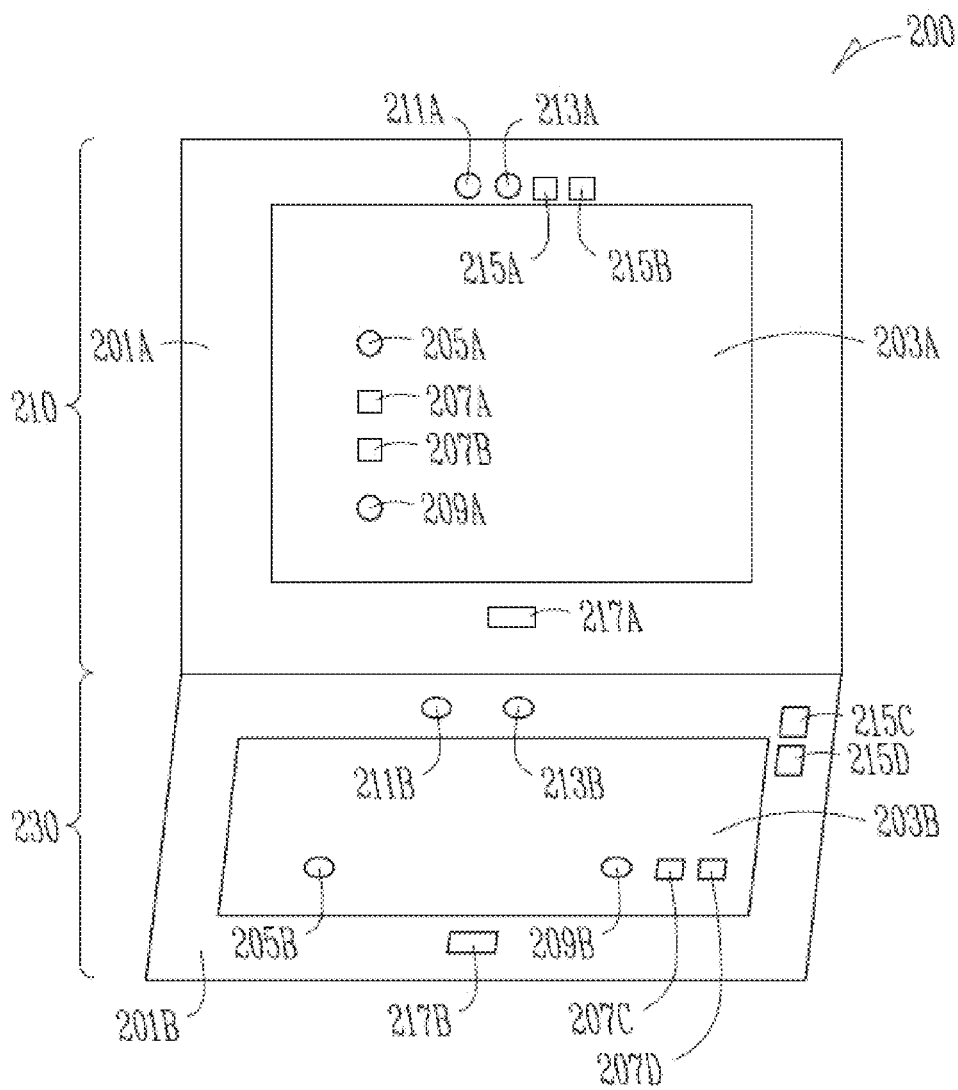

FIG. 28 shows an embodiment of a double-plane computing device 200 that may be used in computing, communication, gaming, interfacing, and so on. The double-plane computing device 200 is shown to include a first peripheral region 201A and a first display region 203A of a first plane 210, a second peripheral region 201B and a second display region 203B of a second plane 230, a first touch-based interface device 217A of the first plane 210 and a second touch-based interface device 217B of the second plane 230. The example touch-based interface devices 217A, 217B may be buttons or touchpads that may be used in interacting with the double-plane computing device 200. The second display region 203B may also be an input region in various embodiments.

The double-plane computing device 200 is also shown to include examples of a first camera module 213A in the first peripheral region 201A and a second camera module 213B in the second peripheral region 201B. The camera modules 213A, 213B are described in more detail, below, with reference to FIG. 29. As shown, the camera modules 213A, 213B are situated within the peripheral regions 201A, 201B of the double-plane computing device 200. Although a total of two camera modules are shown, a person of ordinary skill in the art will recognize that more or fewer light sensors may be employed.

A number of examples of light sensors 215A, 215B, 215C, 215D, are shown situated within the peripheral regions 201A, 201B of the double-plane computing device 200. Although a total of four light sensors are shown, a person of ordinary skill in the art will recognize that more or fewer light sensors may be employed. Examples of the light sensors 215A, 215B, 215C, 215D, are described, below, in further detail with reference to FIG. 4. As shown, the light sensors 215A, 215B, 215C, 215D, are situated within the peripheral regions 201A, 201B of the double-plane computing device 200.

The double-plane computing device 200 is also shown to include examples of a first camera module 205A in the first display region 203A and a second camera module 205B in the second display region 203B. The camera modules 205A, 205B are described in more detail, below, with reference to FIG. 29. As shown, the camera modules 205A, 205B are situated within the display regions 203A, 203B of the double-plane computing device 200. Also shown as being situated within the display regions 203A, 203B of the double-plane computing device 200 are examples of light sensors 207A, 207B, 207C, 207D. Although a total of four light sensors are shown, a person of ordinary skill in the art will recognize that more or fewer light sensors may be employed. Examples of the light sensors 207A, 207B, 207C, 207D are described, below, in further detail with reference to FIG. 30. Example sources of optical illumination 211A, 211B are shown situated within the peripheral region 201A, 201B and other example sources of optical illumination 209A, 209B are shown situated within one of the display regions 203A, 203B and are also described with reference to FIG. 30, below. A person of ordinary skill in the art will recognize that various numbers and locations of the described elements, other than those shown or described, may be implemented.

In embodiments, the double-plane computing device 200 may be a laptop computer. In embodiments, the double-plane computing device 200 may be a mobile handset.

Figure 29:
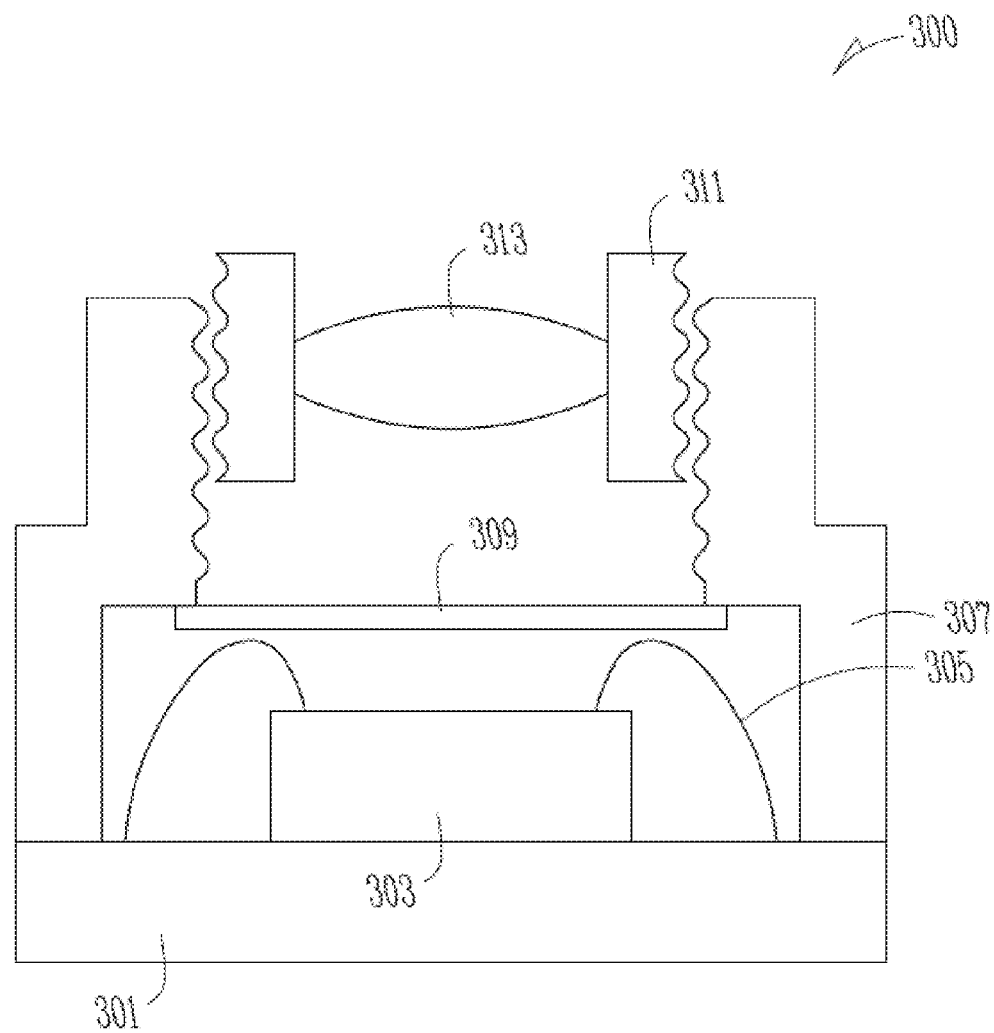
FIG. 29 shows an embodiment of a camera module that may be used with the computing devices of FIG. 27 or FIG. 28.

With reference now to FIG. 29, an embodiment of a camera module 300 that may be used with the computing devices of FIG. 27 or FIG. 28 is shown. The camera module 300 may correspond to the camera module 113 of FIG. 27 or the camera modules 213A, 213B of FIG. 28. As shown in FIG. 29, the camera module 300 includes a substrate 301, an image sensor 303, and bond wires 305. A holder 307 is positioned above the substrate. An optical filter 309 is shown mounted to a portion of the holder 307. A barrel 311 holds a lens 313 or a system of lenses.

Figure 30:
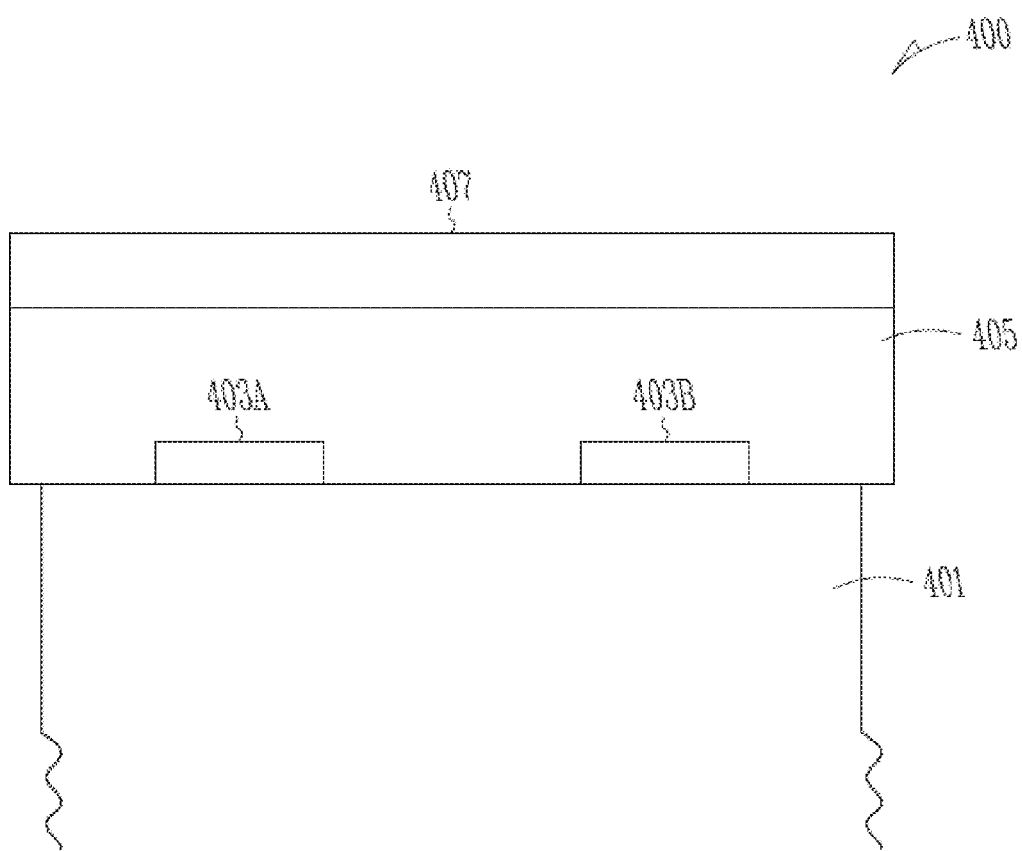
FIG. 30 shows an embodiment of a light sensor that may be used with the computing devices of FIG. 27 or FIG. 28.

FIG. 30 shows an embodiment of a light sensor 400 that may be used with the computing devices of FIG. 27 or FIG. 28 an example embodiment of a light sensor. The light sensor 400 may correspond to the light sensors 115A, 115B of FIG. 27 of the light sensors 215A, 215B, 215C, 215D of FIG. 28. The light sensor 400 is shown to include a substrate 401, which may correspond to a portion of either or both of the peripheral region 101 or the display region 103 of FIG. 27. The substrate 401 may also correspond to a portion of either or both of the peripheral regions 201A, 201B or the display regions 203A, 203B of FIG. 28. The light sensor 400 is also shown to include electrodes 403A, 403B used to provide a bias across light-absorbing material 405 and to collect photoelectrons therefrom. An encapsulation material 407 or a stack of encapsulation materials is shown over the light-absorbing material 405. Optionally, the encapsulation material 407 may include conductive encapsulation material for biasing and/or collecting photoelectrons from the light-absorbing material 405.

Elements of a either the single-plane computing device 100 of FIG. 27, or the double-plane computing device 200 of FIG. 28, may be connected or otherwise coupled with one another. Embodiments of the computing devices may include a processor. It may include functional blocks, and/or physically distinct components, that achieve computing, image processing, digital signal processing, storage of data, communication of data (through wired or wireless connections), the provision of power to devices, and control of devices. Devices that are in communication with the processor include devices of FIG. 27 may include the display region 103, the touch-based interface device 117, the camera modules 105, 113, the light sensors 115A, 115B, 107A, 107B, and the sources of optical illumination 109, 111. Similarly correspondences may apply to FIG. 28 as well.

The light sensor of FIG. 30 may include a light-absorbing material 405 of various designs and compositions. In embodiments, the light-absorbing material may be designed to have an absorbance that is sufficiently small, across the visible wavelength region approximately 450 nm to 650 nm, such that, in cases in which the light sensor of FIG. 30 is incorporated into the display region of a computing device, only a modest fraction of visible light incident upon the sensor is absorbed by the light-absorbing material. In this case, the quality of the images displayed using the display region is not substantially compromised by the incorporation of the light-absorbing material along the optical path of the display. In embodiments, the light-absorbing material 405 may absorb less than 30%, or less than 20%, or less than 10%, of light impinging upon it in across the visible spectral region.

In embodiments, the electrodes 403A, 403B, and, in the case of a conductive encapsulant for 407, the top electrode 407, may be constituted using materials that are substantially transparent across the visible wavelength region approximately 450 nm to 650 nm. In this case, the quality of the images displayed using the display region is not substantially compromised by the incorporation of the light-absorbing material along the optical path of the display.

In embodiments, the light sensor of FIG. 30 may include a light-sensing material capable of sensing infrared light. In embodiments, the light-sensing material may be a semiconductor having a bandgap corresponding to an infrared energy, such as in the range 0.5 eV-1.9 eV. In embodiments, the light-sensing material may have measurable absorption in the infrared spectral range; and may have measurable absorption also in the visible range. In embodiments, the light-sensing material may absorb a higher absorbance in the visible spectral range as in the infrared spectral range; yet may nevertheless be used to sense gesture-related signals in the infrared spectral range.

In an example embodiment, the absorbance of the light-sensing display-incorporated material may lie in the range 2-20% in the visible; and may lie in the range 0.1-5% in the infrared. In an example embodiment, the presence of visible light in the ambient, and/or emitted from the display, may produce a background signal within the light sensor, as a consequence of the material visible-wavelength absorption within the light-absorbing material of the light sensor. In an example embodiment, sensing in the infrared region may also be achieved. The light sources used in aid of gesture recognition may be modulated using spatial, or temporal, codes, allowing them to be distinguished from the visible-wavelength-related component of the signal observed in the light sensor. In an example embodiment, at least one light source used in aid of gesture recognition may be modulated in time using a code having a frequency component greater than 100 Hz, 1000 Hz, 10 kHz, or 100 kHz. In an example embodiment, the light sensor may have a temporal response having a cutoff frequency greater than said frequency components. In embodiments, circuitry may be employed to ensure that the frequency component corresponding to gesture recognition can be extracted and monitored, with the background components related to the room ambient, the display illumination, and other such non-gesture-related background information substantially removed. In this example, the light sensors, even though they absorb both visible and infrared light, can provide a signal that is primarily related to gestural information of interest in gesture recognition.

In an example embodiment, an optical source having a total optical power of approximately 1 mW may be employed. When illuminating an object a distance approximately 10 cm away, where the object has area approximately 1 $cm^2$ and diffuse reflectance approximately 20%, then the amount of power incident on a light sensor having area 1 cm2 may be of order 100 pW. In an example embodiment, a light sensor having absorbance of 1% may be employed, corresponding to a photocurrent related to the light received as a consequence of the illumination via the optical source, and reflected or scattered off of the object, and thus incident onto the light sensor, may therefore be of order pW. In example embodiments, the electrical signal reported by the light sensor may correspond to approximately pA signal component at the modulation frequency of the optical source. In example embodiments, a large additional signal component, such as in the nA or to range, may arise due to visible and infrared background, display light, etc. In example embodiments, the relatively small signal components, with its distinctive temporal and/or spatial signature as provided by modulation (in time and/or space) of the illumination source, may nevertheless be isolated relative to other background/signal, and may be employed to discern gestural information.

In embodiments, light-absorbing material 405 may consist of a material that principally absorbs infrared light in a certain band; and that is substantially transparent to visible-wavelength light. In an example embodiment, a material such as PBDTT-DPP, the near-infrared light-sensitive polymer poly(2,60-4,8-bis(5-ethylhexylthienyl)benzo-[1,2-b;3,4-b]dithiophene-alt-5-dibutyloctyl-3,6-bis(5-bromothiophen-2-yl)pyrrolo[3,4-c]pyrrole-1,4-dione), may be employed as a component of the light-absorbing layer.

In embodiments, the electronic signal produced by the light sensor may be communicated to a device for electronic amplification. This device may amplify a specific electronic frequency band more than other bands, producing an enhanced signal component that is related to the gestural information. The signal from the light sensor, possibly with the combination of amplification (potentially frequency-dependent), may be input to an analog-to-digital converter that can produce a digital signal related to the gestural information. The digital information related to gestural information can be further conveyed to other integrated circuits and/or signal processing engines in the context of a system. For example, it may be conveyed to an application processor.

In embodiments, optical sources used to illuminate a volume of space, with the goal of enabling gesture recognition, may use illumination at a near infrared wavelength that is substantially unseen by the human eye. In an example embodiment, a light-emitting diode having center wavelength of approximately 950 nm may be employed.

In embodiments, gesture recognition may be accomplished by combining information from at least one camera, embedded into the computing device, and having a lens providing a substantially focused image onto an image sensor that is part of the camera; and may also incorporate sensors in the peripheral region, and/or integrated into the display region. In embodiments, the distributed sensors may provide general information on the spatio-temporal movements of the object being imaged; and the signals from the at least one camera(s) may be combined with the distributed sensors' signals to provide a more spatially-/temporally-accurate picture of the two- or three-dimensional motion of the object whose gesture is to be recognized. In an example embodiment, the camera may employ an image sensor providing a modest spatial resolution, such as QVGA, VGA, SVGA, etc., and thus be implemented using an image sensor having small die size and thus low cost; and also be implemented using a camera module having small x, y, and z form factor, enabling minimal consumption of peripheral region area, and no substantial addition to the z-height of the tablet or other computing device. In embodiments, a moderate frame rate, such as 15 fps, 30 fps, or 60 fps may be employed, which, combined with a modest resolution, enables a low-cost digital communication channel and moderate complexity of signal processing in the recognition of gestures. In embodiments, the at least one camera module may implement wide field of view imaging in order to provide a wide angular range in the assessment of gestures in relation to a display. In embodiments, at least one camera module may be tilted, having its angle of regard nonparallel to the normal direction (perpendicular direction) to the display, enabling the at least one camera to image an angular extent in closer proximity to the display. In embodiments, multiple cameras may be employed in combination, each having an angle of regard distinct from at least one another, thereby enabling gestures in moderate proximity to the display to be imaged and interpreted. In embodiments, the at least one camera may employ an image sensor sensitized using light-detecting materials that provide high quantum efficiency, for example, greater than 30%, at near infrared wavelength used by the illuminating source; this enables reduced requirement for power and/or intensity in the illuminating source. In embodiments, the illuminating source may be modulated in time at a specific frequency and employing a specific temporal pattern (e.g., a series of pulses of known spacing and width in time); and the signal from the at least one camera and/or the at least one distributed sensor may be interpreted with knowledge of the phase and temporal profile of the illuminating source; and in this manner, increased signal-to-noise ratio, akin to lock-in or boxcar-averaging or other filtering and/or analog or digital signal processing methods, may be used to substantially pinpoint the modulated, hence illuminated signal, and substantially remove or minimize the background signal associated with the background scene.

Figure 31:
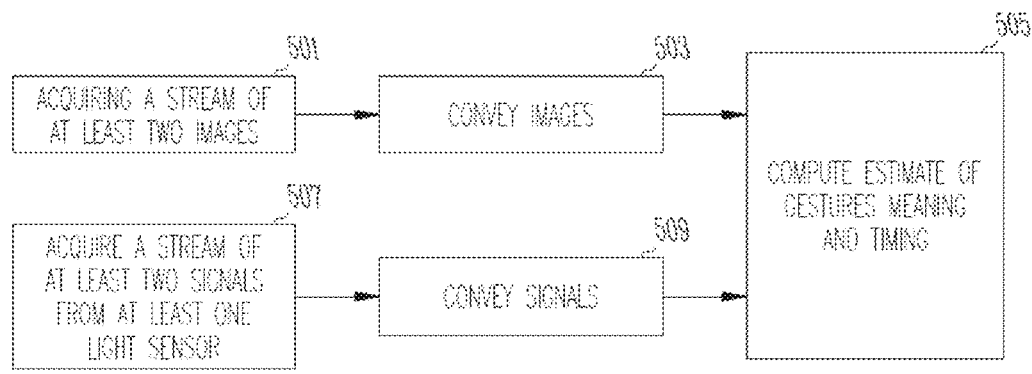
FIG. 31 and FIG. 32 show embodiments of methods of gesture recognition.

FIG. 31 shows an embodiment of a method of gesture recognition. The method comprises an operation 501 that includes acquiring a stream in time of at least two images from each of at least one of the camera module(s); and an operation 507 that includes also acquiring a stream, in time, of at least two signals from each of at least one of the light sensors. The method further comprises, at operations 503 and 509, conveying the images and/or signals to a processor. The method further comprises, at operation 505, using the processor, an estimate of a gesture's meaning, and timing, based on the combination of the images and signals.

Figure 32:
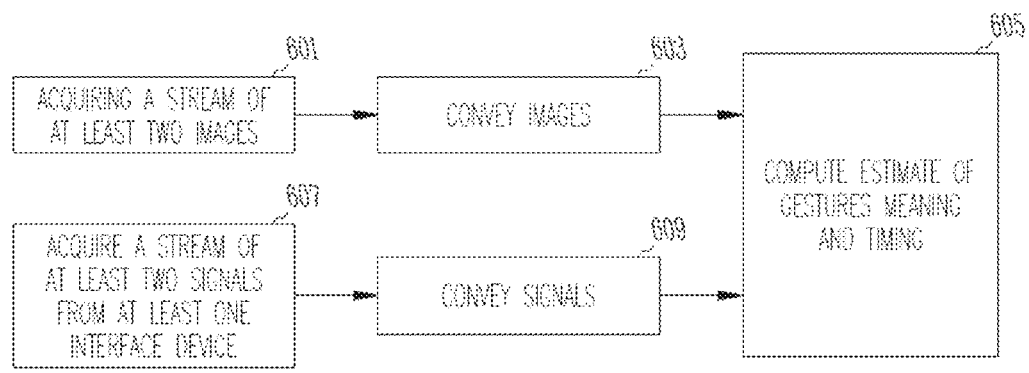

FIG. 32 shows an embodiment of a method of gesture recognition. The method comprises an operation 601 that includes acquiring a stream in time of at least two images from each of at least one of the camera modules; and an operation 607 that includes also acquiring a stream, in time, of at least two signals from each of at least one of the touch-based interface devices. The method further comprises, at operations 603 and 609, conveying the images and/or signals to a processor. The method further comprises, at operation 605, using the processor, an estimate of a gesture's meaning, and timing, based on the combination of the images and signals.

In embodiments, signals received by at least one of (1) the touch-based interface devices; (2) the camera modules; (3) the light sensors, each of these either within the peripheral and/or the display or display/input regions, may be employed and, singly or jointly, used to determine the presence, and the type, of gesture indicated by a user of the device.

Referring again to FIG. 16, in embodiments, a stream, in time, of images is acquired from each of at least one of the camera modules. A stream, in time, of at least two signals from each of at least one of the light sensors is also acquired. In embodiments, the streams may be acquired from the different classes of peripheral devices synchronously. In embodiments, the streams may be acquired with known time stamps indicating when each was acquired relative to the others, for example, to some conference reference time point. In embodiments, the streams are conveyed to a processor. The processor computes an estimate of the gesture's meaning, and timing, based on the combination of the images and signals.

In embodiments, at least one camera module has a wide field of view exceeding about 40°. In embodiments, at least one camera module employs a fisheye lens. In embodiments, at least one image sensor achieves higher resolution at its center, and lower resolution in its periphery. In embodiments, at least one image sensor uses smaller pixels near its center and larger pixels near its periphery.

In embodiments, active illumination via at least one light source; combined with partial reflection and/or partial scattering off of a proximate object; combined with light sensing using at least one optical module or light sensor; may be combined to detect proximity to an object. In embodiments, information regarding such proximity may be used to reduce power consumption of the device. In embodiments, power consumption may be reduced by dimming, or turning off, power-consuming components such as a display.

In embodiments, at least one optical source may emit infrared light. In embodiments, at least one optical source may emit infrared light in the near infrared between about 700 nm and about 1100 nm. In embodiments, at least one optical source may emit infrared light in the short-wavelength infrared between about 1100 nm and about 1700 nm wavelength. In embodiments, the light emitted by the optical source is substantially not visible to the user of the device.

In embodiments, at least one optical source may project a structured light image. In embodiments, spatial patterned illumination, combined with imaging, may be employed to estimate the relative distance of objects relative to the imaging system.

In embodiments, at least two lensing systems may be employed to image a scene, or portions of a scene, onto two distinct regions of a monolithically-integrated single image sensor integrated circuit; and the patterns of light thus acquired using the image sensor integrated circuit may be used to aid in estimating the relative or absolute distances of objects relative to the image sensor system.

In embodiments, at least two lensing systems may be employed to image a scene, or portions of a scene, onto two distinct image sensor integrated circuits housed within a single camera system; and the patterns of light thus acquired using the image sensor integrated circuits may be used to aid in estimating the relative or absolute distances of objects relative to the image sensor system.

In embodiments, at least two lensing systems may be employed to image a scene, or portions of a scene, onto two distinct image sensor integrated circuits housed within separate camera systems or subsystems; and the patterns of light thus acquired using the image sensor integrated circuits may be used to aid in estimating the relative or absolute distances of objects relative to the image sensor systems or subsystems.

In embodiments, the different angles of regard, or perspectives, from which the at least two optical systems perceive the scene, may be used to aid in estimating the relative or absolute distances of objects relative to the image sensor system.

In embodiments, light sensors such as the light sensors 115A, 115B situated in the peripheral region 101 of FIG. 27, and/or the light sensors 107A, 107B situated in the display region 103 of FIG. 27, may be used singly, or in combination with one another, and/or in combination with camera modules, to acquire information about a scene. In embodiments, light sensors may employ lenses to aid in directing light from certain regions of a scene onto specific light sensors. In embodiments, light sensors may employ systems for aperturing, such as light-blocking housings, that define a limited angular range over which light from a scene will impinge on a certain light sensor. In embodiments, a specific light sensor will, with the aid of aperturing, be responsible for sensing light from within a specific angular cone of incidence.

In embodiments, the different angles of regard, or perspectives, from which the at least two optical systems perceive the scene, may be used to aid in estimating the relative or absolute distances of objects relative to the image sensor system.

In embodiments, the time sequence of light detector from at least two light sensors may be used to estimate the direction and velocity of an object. In embodiments, the time sequence of light detector from at least two light sensors may be used to ascertain that a gesture was made by a user of a computing device. In embodiments, the time sequence of light detector from at least two light sensors may be used to classify the gesture that was made by a user of a computing device. In embodiments, information regarding the classification of a gesture, as well as the estimated occurrence in time of the classified gesture, may be conveyed to other systems or subsystems within a computing device, including to a processing unit.

In embodiments, light sensors may be integrated into the display region of a computing device, for example, the light sensors 107A, 107B of FIG. 27. In embodiments, the incorporation of the light sensors into the display region can be achieved without the operation of the display in the conveyance of visual information to the user being substantially altered. In embodiments, the display may convey visual information to the user principally using visible wavelengths in the range of about 400 nm to about 650 nm, while the light sensors may acquire visual information regarding the scene principally using infrared light of wavelengths longer than about 650 nm. In embodiments, a 'display plane' operating principally in the visible wavelength region may reside in front of—closer to the user—than a 'light sensing plane' that may operate principally in the infrared spectral region.

In embodiments, structured light of a first type may be employed, and of a second type may also be employed, and the information from the at least two structured light illuminations may be usefully combined to ascertain information regarding a scene that exceeds the information contained in either isolated structured light image.

In embodiments, structured light of a first type may be employed to illuminate a scene and may be presented from a first source providing a first angle of illumination; and structured light of a second type may be employed to illuminate a scene and may be presented from a second source providing a second angle of illumination.

In embodiments, structured light of a first type and a first angle of illumination may be sensed using a first image sensor providing a first angle of sensing; and also using a second image sensor providing a second angle of sensing.

In embodiments, structured light having a first pattern may be presented from a first source; and structured light having a second pattern may be presented from a second source.

In embodiments, structured light having a first pattern may be presented from a source during a first time period; and structured light having a second pattern may be presented from a source during a second time period.

In embodiments, structured light of a first wavelength may be used to illuminate a scene from a first source having a first angle of illumination; and structured light of a second wavelength may be used to illuminate a scene from a second source having a second angle of illumination.

In embodiments, structured light of a first wavelength may be used to illuminate a scene using a first pattern; and structured light of a second wavelength may be used to illuminate a scene using a second pattern. In embodiments, a first image sensor may sense the scene with a strong response at the first wavelength and a weak response at the second wavelength; and a second image sensor may sense the scene with a strong response at the second wavelength and a weak response at the first wavelength. In embodiments, an image sensor may consist of a first class of pixels having strong response at the first wavelength and weak response at the second wavelength; and of a second class of pixels having strong response at the second wavelength and weak response at the first wavelength.

Embodiments include image sensor systems that employ a filter having a first bandpass spectral region; a first bandblock spectral region; and a second bandpass spectral region. Embodiments include the first bandpass region corresponding to the visible spectral region; the first bandblock spectral region corresponding to a first portion of the infrared; and the second bandpass spectral region corresponding to a second portion of the infrared. Embodiments include using a first time period to detect primarily the visible-wavelength scene; and using active illumination within the second bandpass region during a second time period to detect the sum of a visible-wavelength scene and an actively-illuminated infrared scene; and using the difference between images acquired during the two time periods to infer a primarily actively-illuminated infrared scene. Embodiments include using structured light during the second time period. Embodiments include using infrared structured light. Embodiments include using the structured light images to infer depth information regarding the scene; and in tagging, or manipulating, the visible images using information regarding depth acquired based on the structured light images.

In embodiments, gestures inferred may include one-thumb-up; two-thumbs-up; a finger swipe; a two-finger swipe; a three-finger swipe; a four-finger-swipe; a thumb plus one finger swipe; a thumb plus two finger swipe; etc. In embodiments, gestures inferred may include movement of a first digit in a first direction; and of a second digit in a substantially opposite direction. Gestures inferred may include a tickle.

Sensing of the intensity of light incident on an object may be employed in a number of applications. One such application includes estimation of ambient light levels incident upon an object so that the object's own light-emission intensity can be suitable selected. In mobile devices such as cell phones, personal digital assistants, smart phones, and the like, the battery life, and thus the reduction of the consumption of power, are of importance. At the same time, the visual display of information, such as through the use of a display such as those based on LCDs or pixellated LEDs, may also be needed. The intensity with which this visual information is displayed depends at least partially on the ambient illumination of the scene. For example, in very bright ambient lighting, more light intensity generally needs to be emitted by the display in order for the display's visual impression or image to be clearly visible above the background light level. When ambient lighting is weaker, it is feasible to consume less battery power by emitting a lower level of light from the display.

As a result, it is of interest to sense the light level near or in the display region. Existing methods of light sensing often include a single, or a very few, light sensors, often of small area. This can lead to undesired anomalies and errors in the estimation of ambient illumination levels, especially when the ambient illumination of the device of interest is spatially inhomogeneous. For example, shadows due to obscuring or partially obscuring objects may—if they obscure one or a few sensing elements—result in a display intensity that is less bright than desirable under the true average lighting conditions.

Embodiments include realization of a sensor, or sensors, that accurately permit the determination of light levels. Embodiments include at least one sensor realized using solution-processed light-absorbing materials. Embodiments include sensors in which colloidal quantum dot films constitute the primary light-absorbing element. Embodiments include systems for the conveyance of signals relating to the light level impinging on the sensor that reduce, or mitigate, the presence of noise in the signal as it travels over a distance between a passive sensor and active electronics that employ the modulation of electrical signals used in transduction. Embodiments include systems that include (1) the light-absorbing sensing element; (2) electrical interconnect for the conveyance of signals relating to the light intensity impinging upon the sensing element; and (3) circuitry that is remote from the light-absorbing sensing element, and is connected to it via the electrical interconnect, that achieves low-noise conveyance of the sensed signal through the electrical interconnect. Embodiments include systems in which the length of interconnect is more than one centimeter in length. Embodiments include systems in which interconnect does not require special shielding yet achieve practically useful signal-to-noise levels.

Embodiments include sensors, or sensor systems, that are employed, singly or in combination, to estimate the average color temperature illuminating the display region of a computing device. Embodiments include sensors, or sensor systems, that accept light from a wide angular range, such as greater than about ±20° to normal incidence, or greater than about ±30° to normal incidence, or greater than about ±40° to normal incidence. Embodiments include sensors, or sensor systems, that include at least two types of optical filters, a first type passing primarily a first spectral band, a second type passing primarily a second spectral band. Embodiments include using information from at least two sensors employing at least two types of optical filters to estimate color temperature illuminating the display region, or a region proximate the display region.

Embodiments include systems employing at least two types of sensors. Embodiments include a first type constituted of a first light-sensing material, and a second type constituted of a second light-sensing material. Embodiments include a first light-sensing material configured to absorb, and transduce, light in a first spectral band, and a second light-sensing material configured to transduce a second spectral band. Embodiments include a first light-sensing material employing a plurality of nanoparticles having a first average diameter, and a second light-sensing material employing a plurality of nanoparticles have a second average diameter. Embodiments include a first diameter in the range of approximately 1 nm to approximately 2 nm, and a second diameter greater than about 2 nm.

Embodiments include methods of incorporating a light-sensing material into, or onto, a computing device involving ink-jet printing. Embodiments include using a nozzle to apply light-sensing material over a defined region. Embodiments include defining a primary light-sensing region using electrodes. Embodiments include methods of fabricating light sensing devices integrated into, or onto, a computing device involving: defining a first electrode; defining a second electrode; defining a light-sensing region in electrical communication with the first and the second electrode. Embodiments include methods of fabricating light sensing devices integrated into, or onto, a computing device involving: defining a first electrode; defining a light-sensing region; and defining a second electrode; where the light sensing region is in electrical communication with the first and the second electrode.

Embodiments include integration at least two types of sensors into, or onto, a computing device, using ink-jet printing. Embodiments include using a first reservoir containing a first light-sensing material configured to absorb, and transduce, light in a first spectral band; and using a second reservoir containing a second light-sensing material configured to absorb, and transduce, light in a second spectral band.

Embodiments include the use of differential or modulated signaling in order to substantially suppress any external interference. Embodiments include subtracting dark background noise.

Figure 33:
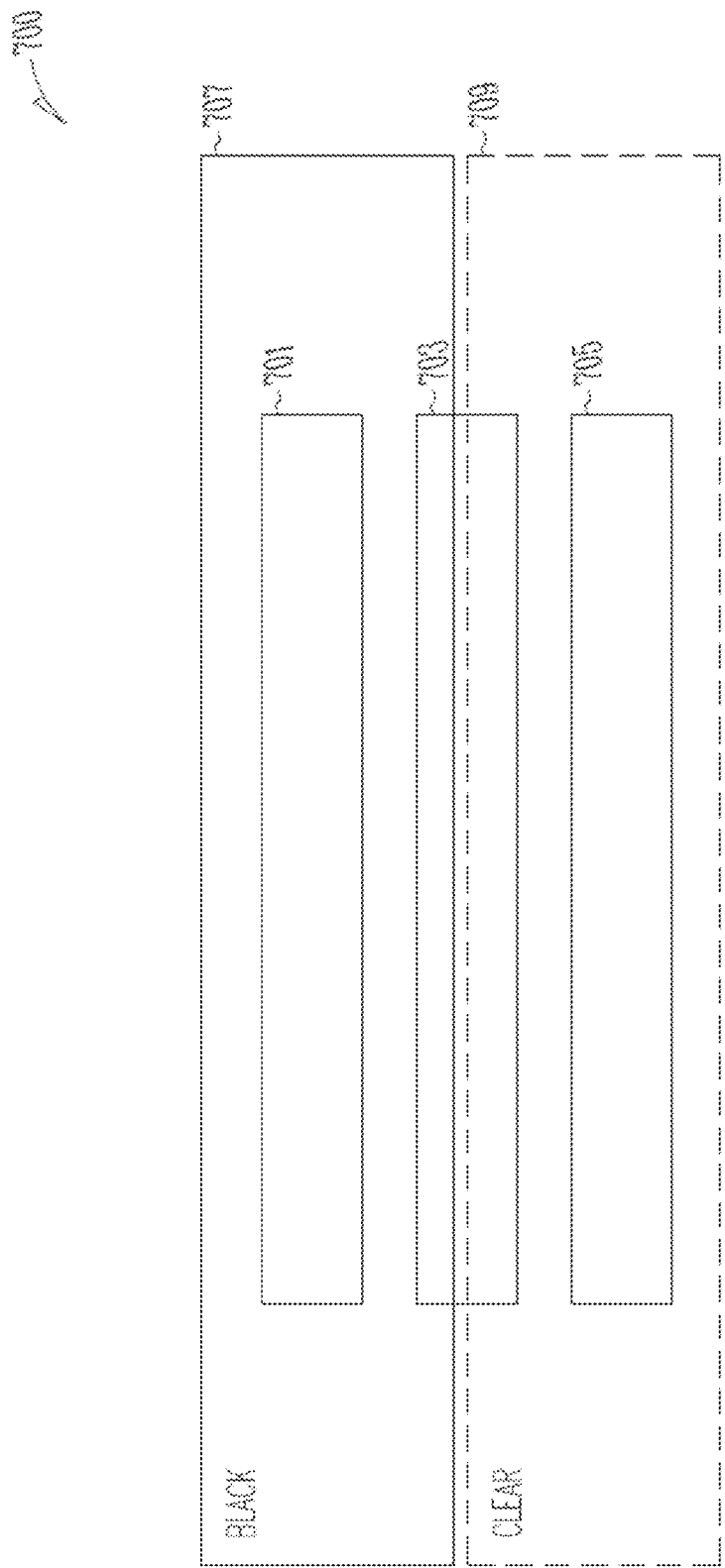
FIG. 33 shows an embodiment of a three-electrode differential-layout system to reduce external interferences with light sensing operations.

Embodiments include a differential system depicted in FIG. 33. FIG. 33 shows an embodiment of a three-electrode differential-layout system 700 to reduce external interferences with light sensing operations. The three-electrode differential-layout system 700 is shown to include a light sensing material covering all three electrodes 701, 703, 705. A light-obscuring material 707 (Black) prevents light from impinging upon the light-sensing material in a region that is electrically accessed using the first electrode 701 and the second electrode 703. A substantially transparent material 709 (Clear) allows light to impinge upon the light-sensing material in a substantially distinct region that is electrically accessed using the second electrode 703 and the third electrode 705. The difference in the current flowing through the Clear-covered electrode pair and the Black-covered electrode pair is equal to the photocurrent—that is, this difference does not include any dark current, but instead is proportional to the light intensity, with any dark offset substantially removed.

Embodiments include the use of a three-electrode system as follows. Each electrode consists of a metal wire. Light-absorbing material may be in electrical communication with the metal wires. Embodiments include the encapsulation of the light-absorbing material using a substantially transparent material that protects the light-absorbing material from ambient environmental conditions such as air, water, humidity, dust, and dirt. The middle of the three electrodes may be biased to a voltage $V_1$, where an example of a typical voltage is about 0 V. The two outer electrodes may be biased to a voltage $V_2$, where a typical value is about 3 V. Embodiments include covering a portion of the device using light-obscuring material that substantially prevents, or reduces, the incidence of light on the light-sensing material.

The light-obscuring material ensures that one pair of electrodes sees little or no light. This pair is termed the dark, or reference, electrode pair. The use of a transparent material over the other electrode pair ensures that, if light is incident, it is substantially incident upon the light-sensing material. This pair is termed the light electrode pair.

The difference in the current flowing through the light electrode pair and the dark electrode pair is equal to the photocurrent—that is, this difference does not include any dark current, but instead is proportional to the light intensity, with any dark offset substantially removed.

Figure 34:
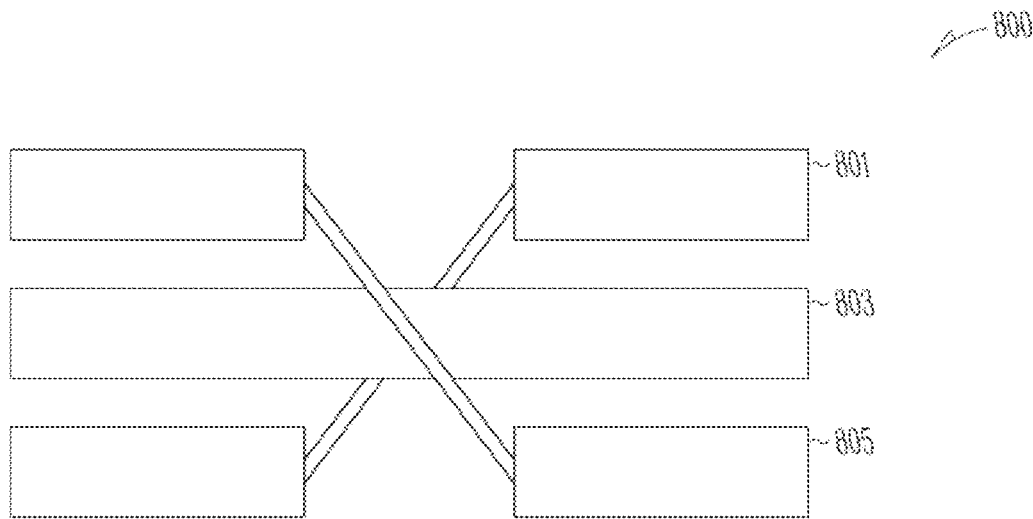
FIG. 34 shows an embodiment of a three-electrode twisted-pair layout system to reduce common-mode noise from external interferences in light sensing operations.

In embodiments, these electrodes are wired in twisted-pair form. In this manner, common-mode noise from external sources is reduced or mitigated. Referring to FIG. 34, electrodes 801, 803, 805 with twisted pair layout 800, the use of a planar analogue of a twisted-pair configuration leads to reduction or mitigation of common-mode noise from external sources.

In another embodiment, biasing may be used such that the light-obscuring layer may not be required. The three electrodes may be biased to three voltages $V_1$, $V_2$, and $V_3$. In one example, $V_1=6$ V, $V_2=3$ V, $V_3=0$ V. The light sensor between 6 V and 3 V, and that between 0 V and 3 V, will generate opposite-direction currents when read between the 6 V and 0 V levels. The resultant differential signal is then transferred out in twisted-pair fashion.

In embodiments, the electrode layout may itself be twisted, further improving the noise-resistance inside the sensor. In this case, an architecture is used in which an electrode may cross over another.

Figure 35:
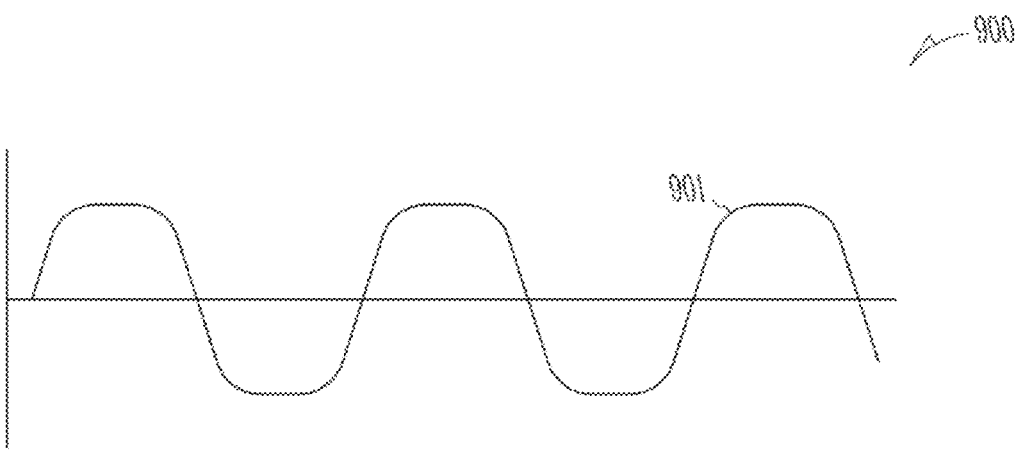
FIG. 35 is an embodiment of time-modulated biasing a signal applied to electrodes to reduce external noise that is not at the modulation frequency.

In embodiments, electrical bias modulation may be employed. An alternating bias may be used between a pair of electrodes. The photocurrent that flows will substantially mimic the temporal evolution of the time-varying electrical biasing. Readout strategies include filtering to generate a low-noise electrical signal. The temporal variations in the biasing include sinusoidal, square, or other periodic profiles. For example, referring to FIG. 35, an embodiment of time-modulated biasing 900 a signal 901 applied to electrodes to reduce external noise that is not at the modulation frequency. Modulating the signal in time allows rejection of external noise that is not at the modulation frequency.

Embodiments include combining the differential layout strategy with the modulation strategy to achieve further improvements in signal-to-noise levels.

Embodiments include employing a number of sensors having different shapes, sizes, and spectral response (e.g., sensitivities to different colors). Embodiments include generating multi-level output signals. Embodiments include processing signals using suitable circuits and algorithms to reconstruct information about the spectral and/or other properties of the light incident.

Advantages of the disclosed subject matter include transfer of accurate information about light intensity over longer distances than would otherwise be possible. Advantages include detection of lower levels of light as a result. Advantages include sensing a wider range of possible light levels. Advantages include successful light intensity determination over a wider range of temperatures, an advantage especially conferred when the dark reference is subtracted using the differential methods described herein.

Embodiments include a light sensor including a first electrode, a second electrode, and a third electrode. A light-absorbing semiconductor is in electrical communication with each of the first, second, and third electrodes. A light-obscuring material substantially attenuates the incidence of light onto the portion of light-absorbing semiconductor residing between the second and the third electrodes, where an electrical bias is applied between the second electrode and the first and third electrodes and where the current flowing through the second electrode is related to the light incident on the sensor.

Embodiments include a light sensor including a first electrode, a second electrode, and a light-absorbing semiconductor in electrical communication with the electrodes wherein a time-varying electrical bias is applied between the first and second electrodes and wherein the current flowing between the electrodes is filtered according to the time-varying electrical bias profile, wherein the resultant component of current is related to the light incident on the sensor.

Embodiments include the above embodiments where the first, second, and third electrodes consists of a material chosen from the list: gold, platinum, palladium, silver, magnesium, manganese, tungsten, titanium, titanium nitride, titanium dioxide, titanium oxynitride, aluminum, calcium, and lead.

Embodiments include the above embodiments where the light-absorbing semiconductor includes materials taken from the list: PbS, PbSe, PbTe, SnS, SnSe, SnTe, CdS, CdSe, CdTe, $Bi_2S_3$, $In_2S_3$, $In_2S_3$, $In_2Te_3$, ZnS, ZnSe, ZnTe, Si, Ge, GaAs, polypyrolle, pentacene, polyphenylenevinylene, polyhexylthiophene, and phenyl-C61-butyric acid methyl ester.

Embodiments include the above embodiments where the bias voltages are greater than about 0.1 V and less than about 10 V. Embodiments include the above embodiments where the electrodes are spaced a distance between about 1 µm and about 20 µm from one another.

Embodiments include the above embodiments where the distance between the light-sensing region and active circuitry used in biasing and reading is greater than about 1 cm and less than about 30 cm.

The capture of visual information regarding a scene, such as via imaging, is desired in a range of areas of application. In cases, the optical properties of the medium residing between the imaging system, and the scene of interest, may exhibit optical absorption, optical scattering, or both. In cases, the optical absorption and/or optical scattering may occur more strongly in a first spectral range compared to a second spectral range. In cases, the strongly-absorbing-or-scattering first spectral range may include some or all of the visible spectral range of approximately 470 nm to approximately 630 nm, and the more-weakly-absorbing-or-scattering second spectral range may include portions of the infrared spanning a range of approximately 650 nm to approximately 24 µm wavelengths.

In embodiments, image quality may be augmented by providing an image sensor array having sensitivity to wavelengths longer than about a 650 nm wavelength.

In embodiments, an imaging system may operate in two modes: a first mode for visible-wavelength imaging; and a second mode for infrared imaging. In embodiments, the first mode may employ a filter that substantially blocks the incidence of light of some infrared wavelengths onto the image sensor.

Figure 36:
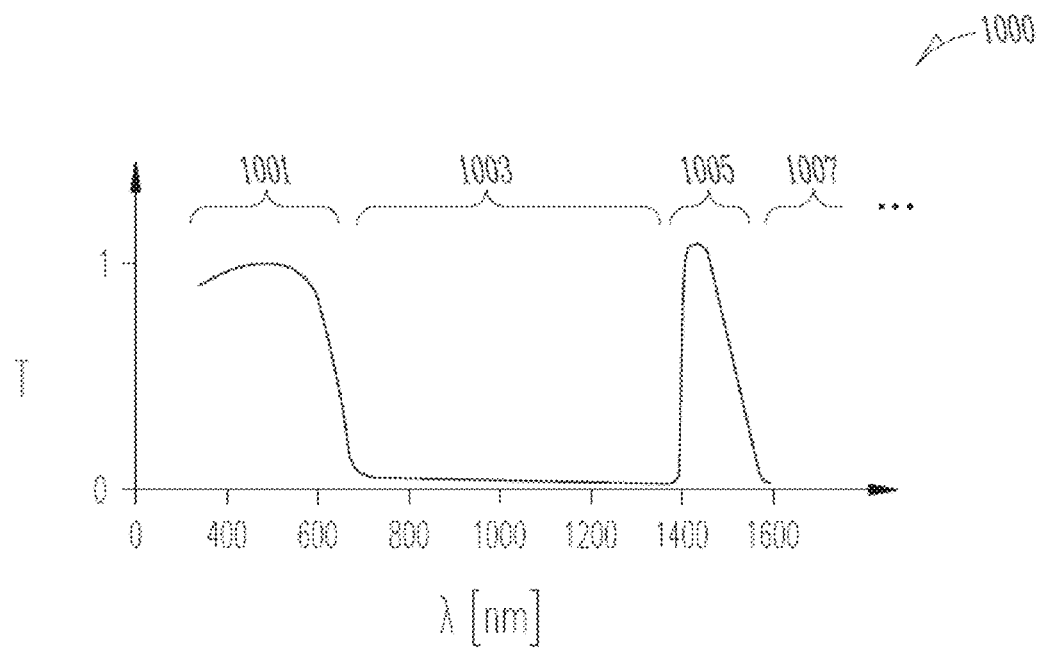
FIG. 36 shows an embodiment of a transmittance spectrum of a filter that may be used in various imaging applications.

Referring now to FIG. 36, an embodiment of a transmittance spectrum 1000 of a filter that may be used in various imaging applications. Wavelengths in the visible spectral region 1001 are substantially transmitted, enabling visible-wavelength imaging. Wavelengths in the infrared bands 1003 of approximately 750 nm to approximately 1450 nm, and also in a region 1007 beyond about 1600 nm, are substantially blocked, reducing the effect of images associated with ambient infrared lighting. Wavelengths in the infrared band 1005 of approximately 1450 nm to approximately 1600 nm are substantially transmitted, enabling infrared-wavelength imaging when an active source having its principal spectral power within this band is turned on.

In embodiments, an imaging system may operate in two modes: a first mode for visible-wavelength imaging; and a second mode for infrared imaging. In embodiments, the system may employ an optical filter, which remains in place in each of the two modes, that substantially blocks incidence of light over a first infrared spectral band; and that substantially passes incidence of light over a second infrared spectral band. In embodiments, the first infrared spectral band that is blocked may span from about 700 nm to about 1450 nm. In embodiments, the second infrared spectral band that is substantially not blocked may begin at about 1450 nm. In embodiments, the second infrared spectral band that is substantially not blocked may end at about 1600 nm. In embodiments, in the second mode for infrared imaging, active illuminating that includes power in the second infrared spectral band that is substantially not blocked may be employed. In embodiments, a substantially visible-wavelength image may be acquired via image capture in the first mode. In embodiments, a substantially actively-infrared-illuminated image may be acquired via image capture in the second mode. In embodiments, a substantially actively-infrared-illuminated image may be acquired via image capture in the second mode aided by the subtraction of an image acquired during the first mode. In embodiments, a periodic-in-time alternation between the first mode and second mode may be employed. In embodiments, a periodic-in-time alternation between no-infrared-illumination, and active-infrared-illumination, may be employed. In embodiments, a periodic-in-time alternation between reporting a substantially visible-wavelength image, and reporting a substantially actively-illuminated-infrared image, may be employed. In embodiments, a composite image may be generated which displays, in overlaid fashion, information relating to the visible-wavelength image and the infrared-wavelength image. In embodiments, a composite image may be generated which uses a first visible-wavelength color, such as blue, to represent the visible-wavelength image; and uses a second visible-wavelength color, such as red, to represent the actively-illuminated infrared-wavelength image, in a manner that is overlaid.

In image sensors, a nonzero, nonuniform, image may be present even in the absence of illumination, (in the dark). If not accounted for, the dark images can lead to distortion and noise in the presentation of illuminated images.

In embodiments, an image may be acquired that represents the signal present in the dark. In embodiments, an image may be presented at the output of an imaging system that represents the difference between an illuminated image and the dark image. In embodiments, the dark image may be acquired by using electrical biasing to reduce the sensitivity of the image sensor to light. In embodiments, an image sensor system may employ a first time interval, with a first biasing scheme, to acquire a substantially dark image; and a second time interval, with a second biasing scheme, to acquire a light image. In embodiments, the image sensor system may store the substantially dark image in memory; and may use the stored substantially dark image in presenting an image that represents the difference between a light image and a substantially dark image. Embodiments include reducing distortion, and reducing noise, using the method.

In embodiments, a first image may be acquired that represents the signal present following reset; and a second image may be acquired that represents the signal present following an integration time; and an image may be presented that represents the difference between the two images. In embodiments, memory may be employed to store at least one of two of the input images. In embodiments, the result difference image may provide temporal noise characteristics that are consistent with correlated double-sampling noise. In embodiments, an image may be presented having equivalent temporal noise considerable less than that imposed by sqrt(kTC) noise.

Embodiments include high-speed readout of a dark image; and of a light image; and high-speed access to memory and high-speed image processing; to present a dark-subtracted image to a user rapidly.

Embodiments include a camera system in which the interval between the user indicating that an image is to be acquired; and in which the integration period associated with the acquisition of the image; is less than about one second. Embodiments include a camera system that includes a memory element in between the image sensor and the processor.

Embodiments include a camera system in which the time in between shots is less than about one second.

Embodiments include a camera system in which a first image is acquired and stored in memory; and a second image is acquired; and a processor is used to generate an image that employs information from the first image and the second image. Embodiments include generating an image with high dynamic range by combining information from the first image and the second image. Embodiments include a first image having a first focus; and a second image having a second focus; and generating an image from the first image and the second image having higher equivalent depth of focus.

Hotter objects generally emit higher spectral power density at shorter wavelengths than do colder objects. Information may thus be extracted regarding the relative temperatures of objects imaged in a scene based on the ratios of power in a first band to the power in a second band.

In embodiments, an image sensor may comprise a first set of pixels configured to sense light primarily within a first spectral band; and a second set of pixels configured to sense light primarily within a second spectral band. In embodiments, an inferred image may be reported that combines information from proximate pixels of the first and second sets. In embodiments, an inferred image may be reported that provides the ratio of signals from proximate pixels of the first and second sets.

In embodiments, an image sensor may include a means of estimating object temperature; and may further include a means of acquiring visible-wavelength images. In embodiments, image processing may be used to false-color an image representing estimated relative object temperature atop a visible-wavelength image.

In embodiments, the image sensor may include at least one pixel having linear dimensions less than approximately 2 µm×2 µm.

In embodiments, the image sensor may include a first layer providing sensing in a first spectral band; and a second layer providing sensing in a second spectral band.

In embodiments, visible images can be used to present a familiar representation to users of a scene; and infrared images can provide added information, such as regarding temperature, or pigment, or enable penetration through scattering and/or visible-absorbing media such as fog, haze, smoke, or fabrics.

In cases, it may be desired to acquire both visible and infrared images using a single image sensor. In cases, registration among visible and infrared images is thus rendered substantially straightforward.

In embodiments, an image sensor may employ a single class of light-absorbing light-sensing material; and may employ a patterned layer above it that is responsible for spectrally-selective transmission of light through it, also known as a filter. In embodiments, the light-absorbing light-sensing material may provide high-quantum-efficiency light sensing over both the visible and at least a portion of the infrared spectral regions. In embodiments, the patterned layer may enable both visible-wavelength pixel regions, and also infrared-wavelength pixel regions, on a single image sensor circuit.

In embodiments, an image sensor may employ two classes of light-absorbing light-sensing materials: a first material configured to absorb and sense a first range of wavelengths; and a second material configured to absorb and sense a second range of wavelengths. The first and second ranges may be at least partially overlapping, or they may not be overlapping.

In embodiments, two classes of light-absorbing light-sensing materials may be placed in different regions of the image sensor. In embodiments, lithography and etching may be employed to define which regions are covered using which light-absorbing light-sensing materials. In embodiments, ink-jet printing may be employed to define which regions are covered using which light-absorbing light-sensing materials.

In embodiments, two classes of light-absorbing light-sensing materials may be stacked vertically atop one another. In embodiments, a bottom layer may sense both infrared and visible light; and a top layer may sense visible light principally.

In embodiments, an optically-sensitive device may include: a first electrode; a first light-absorbing light-sensing material; a second light-absorbing light-sensing material; and a second electrode. In embodiments, a first electrical bias may be provided between the first and second electrodes such that photocarriers are efficiently collected primarily from the first light-absorbing light-sensing material. In embodiments, a second electrical bias may be provided between the first and second electrodes such that photocarriers are efficiently collected primarily from the second light-absorbing light-sensing material. In embodiments, the first electrical bias may result in sensitivity primarily to a first wavelength of light. In embodiments, the second electrical bias may result in sensitivity primarily to a second wavelength of light. In embodiments, the first wavelength of light may be infrared; and the second wavelength of light may be visible. In embodiments, a first set of pixels may be provided with the first bias; and a second set of pixels may be provided with the second bias; ensuring that the first set of pixels responds primarily to a first wavelength of light, and the second set of pixels responds primarily to a second wavelength of light.

In embodiments, a first electrical bias may be provided during a first period of time; and a second electrical bias may be provided during a second period of time; such that the image acquired during the first period of time provides information primarily regarding a first wavelength of light; and the image acquired during the second period of time provides information primarily regarding a second wavelength of light. In embodiments, information acquired during the two periods of time may be combined into a single image. In embodiments, false-color may be used to represent, in a single reported image, information acquired during each of the two periods of time.

In embodiments, a focal plane array may consist of a substantially laterally-spatially uniform film having a substantially laterally-uniform spectral response at a given bias; and having a spectral response that depends on the bias. In embodiments, a spatially nonuniform bias may be applied, for example, different pixel regions may bias the film differently. In embodiments, under a given spatially-dependent biasing configuration, different pixels may provide different spectral responses. In embodiments, a first class of pixels may be responsive principally to visible wavelengths of light, while a second class of pixels may be responsive principally to infrared wavelengths of light. In embodiments, a first class of pixels may be responsive principally to one visible-wavelength color, such as blue; and a second class of pixels may be responsive principally to a distinctive visible-wavelength color, such as green; and a third class of pixels may be responsive principally to a distinctive visible-wavelength color, such as red.

In embodiments, an image sensor may comprise a readout integrated circuit, at least one pixel electrode of a first class, at least one pixel electrode of a second class, a first layer of optically sensitive material, and a second layer of optically sensitive material. In embodiments, the image sensor may employ application of a first bias for the first pixel electrode class; and of a second bias to the second pixel electrode class.

In embodiments, those pixel regions corresponding to the first pixel electrode class may exhibit a first spectral response; and of the second pixel electrode class may exhibit a second spectral response; where the first and second spectral responses are significantly different. In embodiments, the first spectral response may be substantially limited to the visible-wavelength region. In embodiments, the second spectral response may be substantially limited to the visible-wavelength region. In embodiments, the second spectral response may include both portions of the visible and portions of the infrared spectral regions.

In embodiments, it may be desired to fabricate an image sensor having high quantum efficiency combined with low dark current.

In embodiments, a device may consist of: a first electrode; a first selective spacer; a light-absorbing material; a second selective spacer; and a second electrode.

In embodiments, the first electrode may be used to extract electrons. In embodiments, the first selective spacer may be used to facilitate the extraction of electrons but block the injection of holes. In embodiments, the first selective spacer may be an electron-transport layer. In embodiments, the light-absorbing material may include semiconductor nanoparticles. In embodiments, the second selective spacer may be used to facilitate the extraction of holes but block the injection of electrons. In embodiments, the second selective spacer may be a hole-transport layer.

In embodiments, only a first selective spacer may be employed. In embodiments, the first selective spacer may be chosen from the list: TiO2, ZnO, ZnS. In embodiments, the second selective spacer may be NiO. In embodiments, the first and second electrode may be made using the same material. In embodiments, the first electrode may be chosen from the list: TiN, W, Al, Cu. In embodiments, the second electrode may be chosen from the list: ZnO, Al:ZnO, ITO, MoO3, Pedot, Pedot:PSS.

In embodiments, it may be desired to implement an image sensor in which the light-sensing element can be configured during a first interval to accumulate photocarriers; and during a second interval to transfer photocarriers to another node in a circuit.

Embodiments include a device comprising: a first electrode; a light sensing material; a blocking layer; and a second electrode.

Embodiments include electrically biasing the device during a first interval, known as the integration period, such that photocarriers are transported towards the first blocking layer; and where photocarriers are stored near the interface with the blocking layer during the integration period.

Embodiments include electrically biasing the device during a second interval, known as the transfer period, such that the stored photocarriers are extracted during the transfer period into another node in a circuit.

Embodiments include a first electrode chosen from the list: TiN, W, Al, Cu. In embodiments, the second electrode may be chosen from the list: ZnO, Al:ZnO, ITO, MoO$_3$, Pedot, Pedot:PSS. In embodiments, the blocking layer be chosen from the list: HfO$_2$, Al$_2$O$_3$, NiO, TiO$_2$, ZnO.

In embodiments, the bias polarity during the integration period may be opposite to that during the transfer period. In embodiments, the bias during the integration period may be of the same polarity as that during the transfer period. In embodiments, the amplitude of the bias during the transfer period may be greater than that during the integration period.

Embodiments include a light sensor in which an optically sensitive material functions as the gate of a silicon transistor. Embodiments include devices comprising: a gate electrode coupled to a transistor; an optically sensitive material; a second electrode. Embodiments include the accumulation of photoelectrons at the interface between the gate electrode and the optically sensitive material. Embodiments include the accumulation of photoelectrons causing the accumulation of holes within the channel of the transistor. Embodiments include a change in the flow of current in the transistor as a result of a change in photoelectrons as a result of illumination. Embodiments include a change in current flow in the transistor greater than 1000 electrons/s for every electron/s of change in the photocurrent flow in the optically sensitive layer. Embodiments include a saturation behavior in which the transistor current versus photons impinged transfer curve has a sublinear dependence on photon fluence, leading to compression and enhanced dynamic range. Embodiments include resetting the charge in the optically sensitive layer by applying a bias to a node on the transistor that results in current flow through the gate during the reset period.

Embodiments include combinations of the above image sensors, camera systems, fabrication methods, algorithms, and computing devices, in which at least one image sensor is capable of operating in global electronic shutter mode.

In embodiments, at least two image sensors, or image sensor regions, may each operate in global shutter mode, and may provide substantially synchronous acquisition of images of distinct wavelengths, or from different angles, or employing different structured light.

Figure 37:
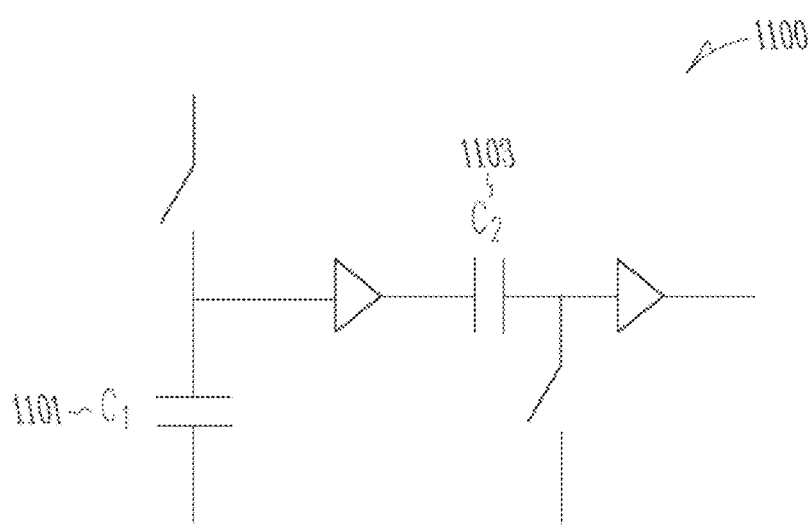
FIG. 37 shows an example schematic diagram of a circuit that may be employed within each pixel to reduce noise power.

Embodiments include implementing correlated double-sampling in the analog domain. Embodiments include so doing using circuitry contained within each pixel. FIG. 37 shows an example schematic diagram of a circuit 1100 that may be employed within each pixel to reduce noise power. In embodiments, a first capacitor 1101 ($C_1$) and a second capacitor 1103 ($C_2$) are employed in combination as shown. In embodiments, the noise power is reduced according to the ratio $C_2/C_1$.

Figure 38:
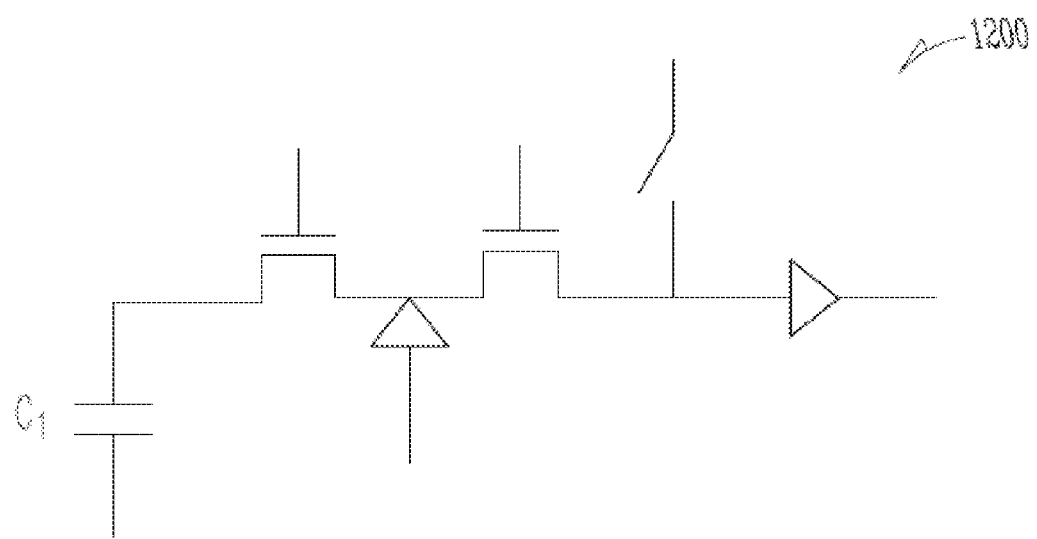
FIG. 38 shows an example schematic diagram of a circuit of a photoGate/pinned-diode storage that may be implemented in silicon.

FIG. 38 shows an example schematic diagram of a circuit 1200 of a photoGate/pinned-diode storage that may be implemented in silicon. In embodiments, the photoGate/pinned-diode storage in silicon is implemented as shown. In embodiments, the storage pinned diode is fully depleted during reset. In embodiments, $C_1$ (corresponding to the light sensor's capacitance, such as quantum dot film in embodiments) sees a constant bias.

In embodiments, light sensing may be enabled through the use of a light sensing material that is integrated with, and read using, a readout integrated circuit. Example embodiments of same are included in U.S. Provisional Application No. 61/352,409, entitled, "Stable, Sensitive Photodetectors and Image Sensors Made Therefrom Including Circuits for Enhanced Image Performance," and U.S. Provisional Application No. 61/352,410, entitled, "Stable, Sensitive Photodetectors and Image Sensors Made Therefrom Including Processes and Materials for Enhanced Image Performance," both filed Jun. 8, 2010, which are hereby incorporated by reference in their entirety.

In embodiments, a method of gesture recognition is provided where the method includes acquiring a stream, in time, of at least two images from each of at least one camera module; acquiring a stream, in time, of at least two signals from each of at least one light sensor; and conveying the at least two images and the at least two signals to a processor, the processor being configured to generate an estimate of a gesture's meaning, and timing, based on a combination of the at least two images and the at least two signals.

In embodiments, the at least one light sensor includes a light-absorbing material having an absorbance, across the visible wavelength region of about 450 nm to about 650 nm, of less than about 30%.

In embodiments, the light-absorbing material includes PBDTT-DPP, the near-infrared light-sensitive polymer poly (2,60-4,8-bis(5-ethylhexylthienyl)benzo-[1,2-b;3,4-b]dithiophene-alt-5-dibutyloctyl-3,6-bis(5-bromothiophen-2-yl) pyrrolo[3,4-c]pyrrole-1,4-dione).

In embodiments, the at least one light sensor includes a light-sensing material capable of sensing infrared light.

In embodiments, the method includes modulating a light source using at least one code selected from spatial codes and temporal codes.

In embodiments, the light source has an emission wavelength in the range of about 900 nm to about 1000 nm.

In one embodiment, a camera system includes a central imaging array region, at least one light-sensing region outside of the central imaging array region, a first mode, referred to as imaging mode, and a second mode, referred to as sensing mode. The electrical power consumed in the second mode is at least 10 times lower than the electrical power consumed in the first mode.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 μm in width and approximately 2 μm in height.

In one embodiment, an image sensor circuit includes a central imaging array region having a first field of view; and at least one light-sensing region outside of the central imaging array region having a second field of view. The second field of view is less than half, measured in angle, the field of view of the first field of view.

In one embodiment, an integrated circuit includes a substrate, an image sensing array region occupying a first region of said semiconductor substrate and including a plurality of optically sensitive pixel regions, a pixel circuit for each pixel region, each pixel circuit comprising a charge store and a read-out circuit, and a light-sensitive region outside of the image sensing array region. The image sensing array region having a first field of view and the light-sensitive region having a second field of view; the angle of the second field of view is less than half of the angle of the first field of view.

In embodiments, at least one of the image sensing array and the light-sensitive region outside of the image sensing array region includes a light-sensing material capable of sensing infrared light.

In embodiments, light impinging on at least one of the image sensing array and the light-sensitive region outside of the image sensing array region is to be modulated.

In embodiments, a portion of light impinging on at least one of the image sensing array and the light-sensitive region outside of the image sensing array region is to be generated using a light emitter device having an emission wavelength in the range of about 800 nm to about 1000 nm.

In embodiments, the image sensing array includes at least six megapixels.

In embodiments, the image sensing array comprises pixels less than approximately 2 μm in width and approximately 2 μm in height.

In one embodiment, an image sensor includes a central imaging array region to provide pixelated sensing of an image, in communication with a peripheral region that includes circuitry to provide biasing, readout, analog-to-digital conversion, and signal conditioning to the pixelated light sensing region. An optically sensitive material overlies the peripheral region.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 μm in width and approximately 2 μm in height.

In embodiments, the optically sensitive material is chosen to include at least one material from a list, the list including silicon, colloidal quantum dot film, and a semiconducting polymer.

In embodiments, the optically sensitive material is fabricated on a first substrate, and is subsequently incorporated onto the central imaging array region.

In one embodiment, a mobile computing device includes a semiconductor substrate, an image sensor comprising pixel circuitry formed on the semiconductor substrate and an image sensing region, a photosensor comprising read-out circuitry formed on the semiconductor substrate and a light sensitive region, circuitry configured to read an image from the image sensor, a processor configured to process a signal read from the photosensor proportional to an optical signal sensed by the photosensor, and control circuitry configured in at least one mode to provide power to read the photosensor without providing power to read-out the image sensor such that power consumption is reduced compared to a mode where the power is provided to operate the image sensor.

In various example embodiments, the inventive subject matter is an image sensor and methods of formation of image sensors. In an embodiment, the image sensor comprises a semiconductor substrate and a plurality of pixel regions. Each of the pixel regions includes an optically sensitive material over the substrate with the optically sensitive material positioned to receive light. A pixel circuit for each pixel region is also included in the sensor. Each pixel circuit comprises a charge store formed on the semiconductor substrate and a read out circuit. A non-metallic contact region is between the charge store and the optically sensitive material of the respective pixel region, the charge store being in electrical communication with the optically sensitive material of the respective pixel region through the non-metallic contact region.

In various embodiments, an image sensor having at least two pixel electrodes per color region and at least two modes is disclosed. The image sensor comprises a first, unbinned, mode; and a second, binned, mode. In the first, unbinned, mode, the at least two pixel electrodes per color region are to be reset to substantially similar levels. In the second, binned mode, a first pixel electrode of the at the least two pixel electrodes is to be reset to a high voltage that results in efficient collection of photocharge, and a second pixel electrode of the at the least two pixel electrodes is to be reset to a low voltage that results in less efficient collection of photocharge.

In example embodiments, a continuous optically sensitive layer overlies the at least two pixel electrodes.

In example embodiments, a pixellated optically sensitive layer overlies the at least two pixel electrodes.

In example embodiments, an optically sensitive layer capable of sensing light in the range of about 470 nm to about 650 nm with a quantum efficiency exceeding 70% overlies the at least two pixel electrodes.

In example embodiments, an optically sensitive layer capable of sensing light in the range of about 470 nm to about 950 nm with a quantum efficiency exceeding 50% overlies the at least two pixel electrodes.

In various embodiments, an image sensor having m pixel electrodes of a first class, and n pixel electrodes of a second class, and having at least two modes, is disclosed. The image sensor comprises a first, unbinned, mode; and a second, binned, mode. In the first, unbinned mode, the m pixel electrodes and the n pixel electrodes of the first and second classes are to be reset to substantially similar levels. In the second, binned mode, the m pixel electrodes of the first class are to be reset to a high voltage that results in efficient collection of photocharge, and the n pixel electrodes of the second class are to be reset to a low voltage that results in less efficient collection of photocharge.

In example embodiments, m is equal to 1 per color region, and n is equal to 3 per color region.

In example embodiments, the electrodes are laid out in a 2D hexagonal close-packed array.

In example embodiments, the electrodes are laid out in a 2D square close-packed array.

In example embodiments, m is equal to 1 per color region, and n is equal to 4 per color region.

In example embodiments, m is equal to 1 per color region, and n is equal to 6 per color region.

In example embodiments, a continuous optically sensitive layer overlies the at least two pixel electrodes.

In example embodiments, a pixellated optically sensitive layer overlies the at least two pixel electrodes.

In example embodiments, an optically sensitive layer capable of sensing light in the range of about 470 nm to about 650 nm with a quantum efficiency exceeding 70% overlies the at least two pixel electrodes.

In example embodiments, an optically sensitive layer capable of sensing light in the range of about 470 nm to about 950 nm with a quantum efficiency exceeding 50% overlies the at least two pixel electrodes.

In various embodiments, an image sensor having at least two pixel electrodes per color region, and having at least two modes is disclosed. The image sensor comprises a first, unbinned, mode; and a second, binned, mode. In the second, binned mode, charge collected by a first pixel electrode is, during a first period, to be switched into a charge store, and during a second period, to be switched to a low-impedance node.

In example embodiments, a continuous optically sensitive layer overlies the at least two pixel electrodes.

In example embodiments, a pixellated optically sensitive layer overlies the at least two pixel electrodes.

In example embodiments, an optically sensitive layer capable of sensing light in the range of about 470 nm to about 650 nm with a quantum efficiency exceeding 70% overlies the at least two pixel electrodes.

In example embodiments, an optically sensitive layer capable of sensing light in the range of about 470 nm to about 950 nm with a quantum efficiency exceeding 50% overlies the at least two pixel electrodes.

In various embodiments, an image sensor having at least two pixel electrodes per color region, and having at least two modes is disclosed. The image sensor comprises a first, unbinned, mode; and a second, binned, mode. In the second, binned mode, charge collected by a first pixel electrode is, in a first submode, is to be switched into a first charge store, and, in a second submode, to be switched to a second charge store. The first charge store has a capacitance at least two times smaller than that of the second charge store.

In example embodiments, a continuous optically sensitive layer overlies the at least two pixel electrodes.

In example embodiments, a pixellated optically sensitive layer overlies the at least two pixel electrodes.

In example embodiments, an optically sensitive layer capable of sensing light in the range of about 470 nm to about 650 nm with a quantum efficiency exceeding 70% overlies the at least two pixel electrodes.

In example embodiments, an optically sensitive layer capable of sensing light in the range of about 470 nm to about 950 nm with a quantum efficiency exceeding 50% overlies the at least two pixel electrodes.

In various embodiments, an image sensor having at least two color regions, each color region having at least two modes is disclosed. The image sensor comprises a first, unbinned, mode; and a second, binned, mode. In the first, unbinned mode, the at least two pixel electrodes per color region are to be reset to substantially similar levels. In the second, binned mode, the first pixel electrode is to be reset to a high voltage that results in efficient collection of photocharge, and the second pixel electrode is to be reset to a low voltage that results in less efficient collection of photocharge.

In example embodiments, overlying the first color region is an optically sensitive layer capable of sensing light in a first spectral range with a quantum efficiency exceeding 80%, and further capable of sensing light in a second spectral range with a quantum efficiency less than 20%; and overlying the second color region is an optically sensitive layer capable of sensing light in the first spectral range with a quantum efficiency less than 20%, and further capable of sensing light in the second spectral range with a quantum efficiency greater than 80%.

In example embodiments, overlying the first color region is an optically sensitive layer capable of sensing light in a first spectral range with a quantum efficiency exceeding 80%, and further capable of sensing light in a second spectral range with quantum efficiency less than 20%; and overlying the second color region is an optically sensitive layer capable of sensing light in the first spectral range with a quantum efficiency less than 20%, and further capable of sensing light in the second spectral range with a quantum efficiency greater than 80%.

As a person of ordinary skill in the art will recognize, the various embodiments described in the specification are provided by means of example only so as to describe the disclosed subject matter. Therefore, the examples and embodiments are not to be considered to be limiting.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An image sensor, comprising:
a first pixel electrode;
a second pixel electrode;
an optically sensitive layer overlying the first pixel electrode and the second pixel electrode; and
an optical filter continuously overlying the optically sensitive layer, the optical filter to provide substantially the same spectral response for light incident on the optically sensitive layer overlying the first pixel electrode and the second pixel electrode, the image sensor being configured to operate in at least two modes:
a first, unbinned, mode; and
a second, binned, mode;
in the first, unbinned mode, the first pixel electrode and the second pixel electrode are to be reset to substantially similar levels, and
in the second, binned mode, the first pixel electrode is to be reset to a high voltage that results in a collection of photocharge of a first efficiency, and second pixel electrode is to be reset to a low voltage that results in a collection of photocharge that is less efficient than the first efficiency.

2. The image sensor of claim 1, wherein the optically sensitive layer that overlies the first pixel electrode and the second pixel electrode is pixellated.

3. The image sensor of claim 1, wherein the optically sensitive layer is capable of sensing light in the range of about 470 nm to about 650 nm with a quantum efficiency exceeding about 70%.

4. The image sensor of claim 1, wherein the optically sensitive layer is capable of sensing light in the range of about 470 nm to about 950 nm with a quantum efficiency exceeding about 50%.

5. An image sensor, comprising:
m pixel electrodes of a first class;
n pixel electrodes of a second class;
an optically sensitive layer overlying the m pixel electrodes and the n pixel electrodes; and
an optical filter continuously overlying the optically sensitive layer, the optical filter to provide substantially the same spectral response for light incident on the optically sensitive layer overlying the m pixel electrodes and the n pixel electrodes, the image sensor being configured to operate in at least two modes:
a first, unbinned, mode; and
a second, binned, mode;
in the first, unbinned mode, the m pixel electrodes and the n pixel electrodes of the first class and the second class, respectively, are to be reset to substantially similar levels; and
in the second, binned mode, the m pixel electrodes of the first class are to be reset to a high voltage that results in a collection of photocharge of a first efficiency, and the n pixel electrodes of the second class are to be reset to a low voltage that results in a collection of photocharge that is less efficient than the first efficiency.

6. The image sensor of claim 5, wherein m is equal to 1 per color region, and n is equal to 3 per color region.

7. The image sensor of claim 5, wherein the electrodes are laid out in a 2D hexagonal close-packed array.

8. The image sensor of claim 5, wherein the electrodes are laid out in a 2D square close-packed array.

9. The image sensor of claim 5, wherein m is equal to 1 per color region, and n is equal to 4 per color region.

10. The image sensor of claim 5, wherein m is equal to 1 per color region, and n is equal to 6 per color region.

11. The image sensor of claim 5, wherein the optically sensitive layer that overlies the m pixel electrodes and the n pixel electrodes is pixellated.

12. The image sensor of claim 5, wherein the optically sensitive layer is capable of sensing light in the range of about 470 nm to about 650 nm with a quantum efficiency exceeding about 70%.

13. The image sensor of claim 5, wherein the optically sensitive layer is capable of sensing light in the range of about 470 nm to about 950 nm with a quantum efficiency exceeding about 50%.

14. An image sensor, comprising:
a first pixel electrode;
a second pixel electrode;
an optically sensitive layer overlying the first pixel electrode and the second pixel electrode; and
an optical filter continuously overlying the optically sensitive layer, the optical filter to provide substantially the same spectral response for light incident on the optically sensitive layer overlying the first pixel electrode and the second pixel electrode, the image sensor being configured to operate in at least two modes:
a first, unbinned, mode; and
a second, binned, mode;
in the second, binned mode, charge collected by the first pixel electrode is, during a first period, to be switched into a charge store, and during a second period, to be switched to a low-impedance node.

15. The image sensor of claim 14, wherein the optically sensitive layer that overlies the first pixel electrode and the second pixel electrode is pixellated.

16. The image sensor of claim 14, wherein the optically sensitive layer is capable of sensing light in the range of about 470 nm to about 650 nm with a quantum efficiency exceeding about 70%.

17. The image sensor of claim 14, wherein the optically sensitive layer is capable of sensing light in the range of about 470 nm to about 950 nm with a quantum efficiency exceeding about 50%.

18. An image sensor, comprising:
a first pixel electrode;
a second pixel electrode;
an optically sensitive layer overlying the first pixel electrode and the second pixel electrode; and
an optical filter continuously overlying the optically sensitive layer, the optical filter to provide substantially the same spectral response for light incident on the optically sensitive layer overlying the first pixel electrode and the second pixel electrode, the image sensor being configured to operate in at least two modes:
a first, unbinned, mode; and
a second, binned, mode;
in the second, binned mode, charge collected by a first pixel electrode, in a first submode, is to be switched into a first charge store, and, in a second submode, is to be switched to a second charge store; the first charge store having a capacitance at least two times smaller than that of the second charge store.

19. The image sensor of claim 18, wherein the optically sensitive layer that overlies the first pixel electrode and the second pixel electrode is pixellated.

20. The image sensor of claim 18, wherein the optically sensitive layer is capable of sensing light in the range of about 470 nm to about 650 nm with a quantum efficiency exceeding about 70%.

21. The image sensor of claim 18, wherein the optically sensitive layer is capable of sensing light in the range of about 470 nm to about 950 nm with a quantum efficiency exceeding about 50%.

22. An image sensor having at least two color regions, the image sensor comprising:
- a first pixel electrode;
- a second pixel electrode;
- an optically sensitive layer overlying the first pixel electrode and the second pixel electrode; and
- an optical filter continuously overlying the optically sensitive layer, the optical filter to provide substantially the same spectral response for light incident on the optically sensitive layer overlying the first pixel electrode and the second pixel electrode, the image sensor being configured to operate in the at least two modes:
  - a first, unbinned, mode; and
  - a second, binned, mode;
  - in the first, unbinned mode, the first pixel electrode and the second pixel electrode per color region are to be reset to substantially similar levels; and
  - in the second, binned mode, the first pixel electrode is to be reset to a high voltage that results in a collection of photocharge of a first efficiency, and the second pixel electrode is to be reset to a low voltage that results in a collection of photocharge that is less efficient than the first efficiency.

23. The image sensor of claim 22, further comprising:
- overlying the first color region is an optically sensitive layer capable of sensing light in a first spectral range with a quantum efficiency exceeding about 80%, and further capable of sensing light in a second spectral range with a quantum efficiency less than about 20%; and
- overlying the second color region is an optically sensitive layer capable of sensing light in the first spectral range with a quantum efficiency less than about 20%, and further capable of sensing light in the second spectral range with a quantum efficiency greater than about 80%.

24. The image sensor of claim 22, further comprising:
- overlying the first color region is an optically sensitive layer capable of sensing light in a first spectral range with a quantum efficiency exceeding about 80%, and further capable of sensing light in a second spectral range with quantum efficiency less than about 20%; and
- overlying the second color region is an optically sensitive layer capable of sensing light in the first spectral range with a quantum efficiency less than about 20%, and further capable of sensing light in the second spectral range with a quantum efficiency greater than about 80%.

* * * * *